United States Patent
Lee et al.

(10) Patent No.: US 12,532,655 B2
(45) Date of Patent: Jan. 20, 2026

(54) ORGANIC ELECTROLUMINESCENCE DEVICE AND ORGANOMETALLIC COMPOUND FOR ORGANIC ELECTROLUMINESCENCE DEVICE

(71) Applicant: Samsung Display Co., Ltd.

(72) Inventors: Hyunjung Lee, Hwaseong-si (KR); Sungbum Kim, Yongin-si (KR); Eunsoo Ahn, Jinju-si (KR); Eunyoung Lee, Sejong-si (KR); Jaesung Lee, Hwaseong-si (KR); Mina Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 911 days.

(21) Appl. No.: 17/579,491

(22) Filed: Jan. 19, 2022

(65) Prior Publication Data
US 2022/0352479 A1 Nov. 3, 2022

(30) Foreign Application Priority Data
Apr. 7, 2021 (KR) .......................... 10-2021-0045146

(51) Int. Cl.
*H01L 51/00* (2006.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
None
See application file for complete search history.

(56) References Cited

U.S. PATENT DOCUMENTS 7,279,704 B2 10/2007 Walters et al.
7,655,322 B2 2/2010 Forrest et al.
(Continued)

FOREIGN PATENT DOCUMENTS

JP 2015-91800 A 5/2015
KR 10-2014-0029473 A 3/2014
(Continued)

OTHER PUBLICATIONS

Luy, Jan-Niclas, et al. "Rhodium(I) and Iridium(i) Complexes of the Conformationally Rigid Ibioxme4 Ligand: Computational and Experimental Studies of Unusually Tilted NHC Coordination Geometries." Organometallics, vol. 34, No. 20, 2015, pp. 5099-5112.

(Continued)

*Primary Examiner* — Jay Yang
(74) *Attorney, Agent, or Firm* — Womble Bond Dickinson (US) LLP

(57) ABSTRACT

An organic electroluminescence device includes: a first electrode; a hole transport region disposed on the first electrode; an emission layer disposed on the hole transport region; an electron transport region disposed on the emission layer; and a second electrode disposed on the electron transport region, wherein the emission layer includes an organometallic compound of Formula 1:

(Continued)

Formula 1 wherein, in Formula 1, the variables are described herein.

20 Claims, 6 Drawing Sheets

(51) Int. Cl.
  C09K 11/06 (2006.01)
  H10K 85/30 (2023.01)
  H10K 50/11 (2023.01)
  H10K 101/10 (2023.01)
(52) U.S. Cl.
  CPC .......... *C09K 2211/1048* (2013.01); *C09K 2211/185* (2013.01); *H10K 50/11* (2023.02); *H10K 2101/10* (2023.02)

(56) References Cited

U.S. PATENT DOCUMENTS

| | | |
|---|---|---|
| 7,655,323 B2 | 2/2010 | Walters et al. |
| 8,748,012 B2 | 6/2014 | Zeng et al. |
| 9,461,254 B2 | 10/2016 | Tsai et al. |
| 9,853,229 B2 | 12/2017 | Thompson et al. |
| 10,128,447 B2 | 11/2018 | Cazin et al. |

FOREIGN PATENT DOCUMENTS

| | | |
|---|---|---|
| KR | 10-2017-0110584 A | 10/2017 |
| KR | 10-2019-0042459 A | 4/2019 |
| WO | 2005/113704 A2 | 1/2005 |
| WO | 2016087844 A1 | 6/2016 |

OTHER PUBLICATIONS

Liu, Yang et al.; "An Adaptable N-Heterocyclic Carbene Macrocycle Hosting Copper in Three Oxidation States"; Angew. Chem.; 2020; 132; pp. 5745-5754.

Hauser, Simone A. et al.; "Iridium Complexes of the Conformationally Rigid IBioxMe4 Ligand: Hydride Complexes and Dehydrogen of Clyclooctene", Organometallics; ACS Publications; 2015; 34; pp. 4419-4427.

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATION

This application claims priority from and the benefit of Korean Patent Application No. 10-2021-0045146, filed on Apr. 7, 2021, which is hereby incorporated by reference for all purposes as if fully set forth herein.

BACKGROUND

Field

Embodiments of the invention relate generally to display devices, and more particularly, an organic electroluminescence device and an organometallic compound for the organic electroluminescence device.

Discussion of the Background

Recently, the use of an organic electroluminescence display apparatus as an image display apparatus is being actively developed. Unlike liquid crystal display apparatuses and the like, the organic electroluminescence display apparatus is a so-called self-luminescent display apparatus in which holes and electrons injected from a first electrode and a second electrode recombine in an emission layer, and thus a luminescent material including an organic compound in the emission layer emits light to implement display.

There is a demand for use of an organic electroluminescence device as a display, the decrease of the driving voltage, and the increase of the emission efficiency and the life of the organic electroluminescence device are required, and development on materials for an organic electroluminescence device stably attaining the requirements are being continuously developed. In addition, materials for use in an emission layer is being developed in order to realize a highly efficient organic electroluminescence device. The above information disclosed in this Background section is only for understanding of the background of the inventive concepts, and, therefore, it may contain information that does not constitute prior art.

SUMMARY

Organic luminescence devices constructed according to principles and illustrative implementations of the invention have excellent luminous efficiency and long service life characteristics, which may be achieved by including an organometallic compound made according to the principles and illustrative embodiments of the invention in an emission layer of the organic luminescence device.

Additional features of the inventive concepts will be set forth in the description which follows, and in part will be apparent from the description, or may be learned by practice of the inventive concepts.

According to one aspect of the invention, an organic electroluminescence device includes: a first electrode; a hole transport region disposed on the first electrode; an emission layer disposed on the hole transport region; an electron transport region disposed on the emission layer; and a second electrode disposed on the electron transport region, wherein the emission layer includes an organometallic compound of Formula 1:

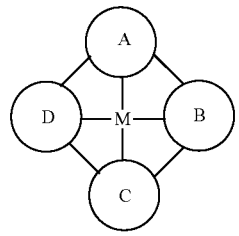

Formula 1 wherein, in Formula 1, the variables are described herein.

The variable M may be iridium or platinum.

The emission layer may be configured to emit phosphorescence.

The emission layer may include a host and a dopant, and the dopant may include an organometallic compound of the Formula 1.

Two rings of ring A to ring D may each be, independently from one another, of the Formula 2, and the remaining two rings may each be, independently from one another, a substituted or an unsubstituted aryl group having 6 to 30 ring-forming carbon atoms, or a substituted or an unsubstituted heteroaryl group having 2 to 30 ring-forming carbon atoms.

The Formula 1 may be of Formula 2-1, as described herein.

The Formula 2-1 may be of Formula 3, as described herein.

At least two of $X_1$ to $X_3$ may each be, independently from one another, $CR_a$, and at least two of $Y_1$ to $Y_3$ may each be, independently from one another, $CR_a$.

The Formula 2-1 may be of Formula 4, as described herein.

The variables e and f may each be, independently from one another, an integer of 1 to 3, and $R_5$ and $R_6$ may each be, independently from one another, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or may be bonded to an adjacent group to form a ring.

The variables $R_1$ to $R_4$ may each be, independently from one another, a hydrogen atom or a deuterium atom.

The organometallic compound of Formula 1 may be at least one compound of Compound Group 1, as described herein.

According to another aspect of the invention, an organometallic compound is of Formula 1:

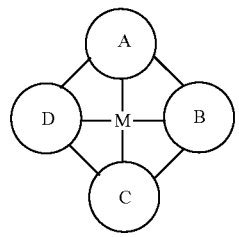

Formula 1 wherein, in Formula 1, the variables are described herein.

The variable M may be iridium or platinum.

Two rings of ring A to ring D may each be, independently from one another, of Formula 2, and the remaining two rings may each be, independently from one another, a substituted or an unsubstituted aryl group having 6 to 30 ring-forming carbon atoms, or a substituted or an unsubstituted heteroaryl group having 2 to 30 ring-forming carbon atoms.

The Formula 1 may be of Formula 2-1, as described herein.

The Formula 2-1 may be of Formula 3, as described herein.

The Formula 2-1 may be of Formula 4, as described herein.

The variables e and f may each be, independently from one another, an integer of 1 to 3, and $R_5$ and $R_6$ may each be, independently from one another, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or may be bonded to an adjacent group to form a ring.

The organometallic compound of Formula 1 may be at least one compound of Compound Group 1, as described herein.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
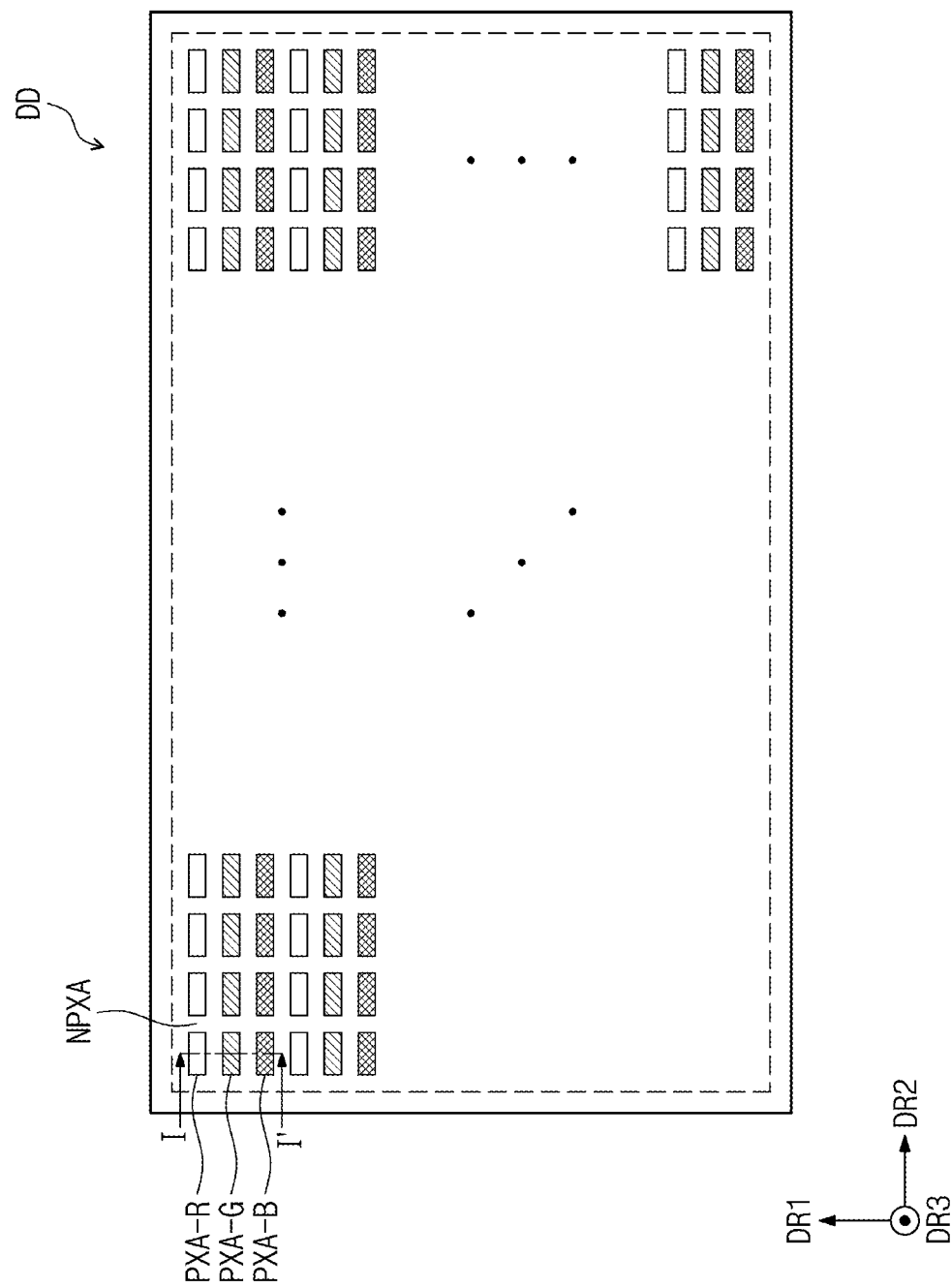
FIG. 1 is a plan view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, plates, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements, and repetitive explanations are omitted to avoid redundancy.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, fixed numbers, integers, steps, operations, elements, components, and/or groups thereof, but do not preclude the presence or addition of one or more other features, fixed numbers, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Definitions

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the abbreviations "—F, —Cl, —Br, and —I" are radicals of, respectively, fluorine, chlorine, bromine, and iodine.

The abbreviation "eq" means "mole equivalent".

As used herein, the term room temperature may be abbreviated "RT".

As used herein, the term "acetic acid" may be abbreviated "AcOH", the term "sodium acetate" may be abbreviated "NaOAc", the term "methyl" may be abbreviated "Me", the term "ethyl" may be abbreviated "Et", the term "butyl" may be abbreviated "Bu", the term "normal-butyl" may be abbreviated "n-Bu", the term "tert-butyl" may be abbreviated "t-Bu", the term "tetrabutylazanium;bromide" may be abbreviated "nBu$_4$NBr", and the term "dichloro(1,5-cyclooctadiene) platinum (II)" may be abbreviated "Pt(COD)Cl$_2$".

As used herein, the unit "nanometer" may be abbreviated "nm", the unit "millimeter" may be abbreviated "mm", the unit "centimeter" may be abbreviated "cm", the unit "meter" may be abbreviated "m", the term "area" may be abbreviated "A" and be expressed as meter-squared (m$^2$). The unit "kilocalorie" may be abbreviated "kcal", the unit "mole" may be abbreviated "mol", the unit "ohm" may be abbreviated "Ω", the unit "milliampere" may be abbreviated "mA", the unit "volt" may be abbreviated "V", the unit "candela" may be abbreviated "cd", the unit "hour" may be abbreviated "h", and the unit "angstrom" may be abbreviated "Å". The simulated wavelength maximum may be abbreviated "$\Delta_{max}^{sim}$" and the experimental wavelength maximum may be abbreviated "$\lambda_{max}^{exp}$".

As used herein, the term "device service life" can be measured as the time that the luminance reaches 90 percent (%) of the initial luminance at 1,000 cd/m$^2$ or cd/A, and be abbreviated "T90, h".

As used herein, the term "substituted or unsubstituted" may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents exemplified above may be substituted or unsubstituted. For example, a biphenyl group may be interpreted as an aryl group or a phenyl group substituted with a phenyl group.

As used herein, the phrase "bonded to an adjacent group to form a ring" may indicate that one part is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to each other may be connected to another ring to form a spiro structure.

As used herein, the term "adjacent group" may mean a substituent substituted for an atom which is directly bonded to an atom substituted with a corresponding substituent, another substituent substituted for an atom which is substituted with a corresponding substituent, or a substituent sterically positioned at the nearest position to a corresponding substituent. For example, two methyl groups in 1,2- dimethylbenzene may be interpreted as "adjacent groups" to each other and two ethyl groups in 1,1-diethylcyclopentane may be interpreted as "adjacent groups" to each other. In addition, two methyl groups in 4,5-dimethylphenanthrene may be interpreted as "adjacent groups" to each other.

As used herein, examples of the halogen atom may include a fluorine atom, a chlorine atom, a bromine atom, or an iodine atom.

As used herein, the alkyl group may be a linear, branched or cyclic type. The number of carbons in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

As used herein, the hydrocarbon ring group includes an aliphatic hydrocarbon ring group and an aromatic hydrocarbon ring group. The aromatic hydrocarbon ring group may be an aryl group. The aliphatic hydrocarbon ring and the aromatic hydrocarbon ring may be monocyclic or polycyclic.

As used herein, the aliphatic hydrocarbon ring group means any functional group or substituent derived from a saturated hydrocarbon ring having 5 to 20 ring-forming carbon atoms.

As used herein, the aryl group means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments are not limited thereto.

As used herein, the fluorenyl group may be substituted, and two substituents may be bonded to each other to form a spiro structure. Examples of cases where the fluorenyl group is substituted are as follows. However, embodiments are not limited thereto.

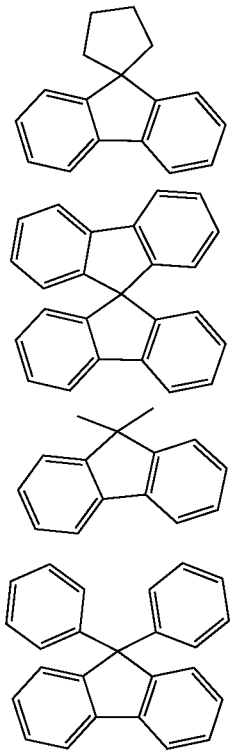

As used herein, the heterocyclic group herein means any functional group or substituent derived from a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

As used herein, the heterocyclic group may include at least one of B, O, N, P, Si or S as a heteroatom. If the heterocyclic group includes two or more heteroatoms, the two or more heteroatoms may be the same as or different from each other. The heterocyclic group may be a monocyclic heterocyclic group or a polycyclic heterocyclic group and may include a heteroaryl group. The number of ring-forming carbon atoms in the heterocyclic group may be 2 to 30, 2 to 20, or 2 to 10.

As used herein, the aliphatic heterocyclic group may include one or more of B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but embodiments are not limited thereto.

As used herein, the heteroaryl group herein may include at least one of B, O, N, P, Si, or S as a heteroatom. If the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto.

As used herein, the above description of the aryl group may be applied to an arylene group except that the arylene group is a divalent group. The above description of the heteroaryl group may be applied to a heteroarylene group except that the heteroarylene group is a divalent group.

As used herein, the silyl group includes an alkylsilyl group and an arylsilyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc. However, embodiments are not limited thereto.

As used herein, a thio group herein may include an alkylthio group and an arylthio group. The thio group may mean that a sulfur atom is bonded to the alkyl group or the aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, but embodiments are not limited thereto.

As used herein, the alkenyl group may be linear or branched. The number of carbon atoms in the alkynyl group is not specifically limited, but is 2 to 30, 2 to 20, or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

As used herein, the number of carbon atoms in an amine group is not specifically limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, etc., but embodiments are not limited thereto.

As used herein, the alkyl group of an alkylthio group, an alkylsulfoxy group, an alkylaryl group, an alkylamino group, an alkyl boron group, an alkyl silyl group, and an alkyl amine group is the same as the examples of the alkyl group described above.

As used herein, the aryl group of an aryloxy group, an arylthio group, an arylsulfoxy group, an arylamino group, an arylboron group, an arylsilyl group, an arylamine group is the same as the examples of the aryl group described above.

A direct linkage herein may mean a single bond.

As used herein, "—*" and

mean a position to be connected.

Hereinafter, embodiments are described with reference to the accompanying drawings.

Figure 2:
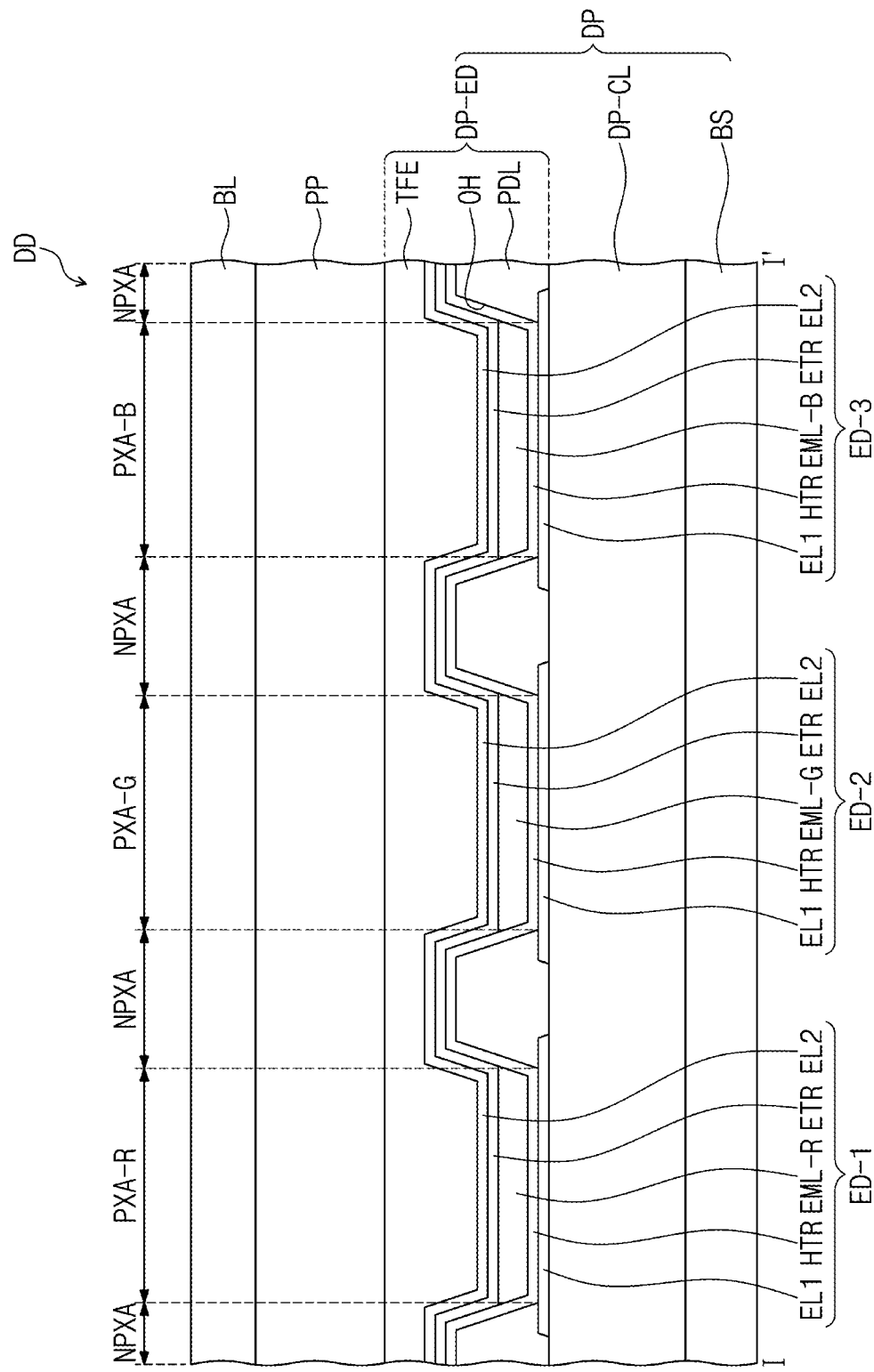
FIG. 2 is a cross-sectional view taken along line I-I' of FIG. 1.

FIG. 1 is a plan view of an embodiment of a display apparatus constructed according to the principles of the invention. FIG. 2 is a cross-sectional view taken along line I-I' of FIG. 1. Particularly, FIG. 2 is a cross-sectional view of the display apparatus DD of the embodiment.

The display apparatus DD may include a display panel DP and an optical layer PP disposed on the display panel DP. The display panel DP includes organic electroluminescence devices ED-1, ED-2, and ED-3. The display apparatus DD may include a plurality of organic electroluminescence devices ED-1, ED-2, and ED-3. The optical layer PP may be disposed on the display panel DP and control reflected light in the display panel DP due to external light. The optical layer PP may include, for example, a polarization layer or a color filter layer. Unlike the embodiment illustrated in FIG. 2, the optical layer PP may be omitted from the display apparatus DD in other embodiments.

A base substrate BL may be disposed on the optical layer PP. The base substrate BL may be a member which provides a base surface on which the optical layer PP disposed. The base substrate BL may be a glass substrate, a metal substrate, a plastic substrate, etc. However, embodiments are not limited thereto, and the base substrate BL may be an inorganic layer, an organic layer, or a composite material layer. In addition, unlike the embodiment depicted in FIG. 2, the base substrate BL may be omitted.

The display apparatus DD may further include a filling layer. The filling layer may be disposed between a display device layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and a display device layer DP-ED. The display device layer DP-ED may include a pixel defining film PDL, the organic electroluminescence devices ED-1, ED-2, and ED-3 disposed between portions of the pixel defining film PDL, and an encapsulation layer TFE disposed on the organic electroluminescence devices ED-1, ED-2, and ED-3.

The base layer BS may be a member which provides a base surface on which the display device layer DP-ED is disposed. The base layer BS may be a glass substrate, a metal substrate, a plastic substrate, etc. However, embodiments are not limited thereto, and the base layer BS may be an inorganic layer, an organic layer, or a composite material layer.

In an embodiment, the circuit layer DP-CL is disposed on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the organic electroluminescence devices ED-1, ED-2, and ED-3 of the display device layer DP-ED.

Each of the organic electroluminescence devices ED-1, ED-2, and ED-3 may have the structure of an organic electroluminescence device ED according to the embodiments of FIGS. 3 to 6, which will be described below. Each of the organic electroluminescence devices ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the organic electroluminescence devices ED-1, ED-2, and ED-3 are disposed in the openings OH defined in the pixel defining film PDL, and the hole transport region HTR, the electron transport region ETR, and the second electrode EL2 are provided as a common layer in the entire organic electroluminescence devices ED-1, ED-2, and ED-3. However, embodiments are not limited thereto, and unlike the feature illustrated in FIG. 2, the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR of the organic electroluminescence devices ED-1, ED-2, and ED-3 may be provided by being patterned in an inkjet printing method.

The encapsulation layer TFE may cover the organic electroluminescence devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE may include at least one inorganic film (hereinafter, an encapsulation-inorganic film). The encapsulation layer TFE may also include at least one organic film (hereinafter, an encapsulation-organic film) and at least one encapsulation-inorganic film.

The encapsulation-inorganic film protects the display device layer DP-ED from at least one of moisture and oxygen, and the encapsulation-organic film protects the display device layer DP-ED from foreign substances such as dust particles. The encapsulation-inorganic film may include a silicon nitride, a silicon oxynitride, a silicon oxide, a titanium oxide, an aluminum oxide, or the like, but embodiments are not particularly limited thereto. The encapsulation-organic film may include an acrylic-based compound, an epoxy-based compound, or the like. The encapsulation-organic film may include a photopolymerizable organic material, but the embodiments are not particularly limited thereto. The encapsulation layer TFE may be disposed on the second electrode EL2 and may be disposed filling the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B each may be a region configured to emit light generated from the organic electroluminescence devices ED-1, ED-2 and ED-3, respectively.

The light emitting regions PXA-R, PXA-G, and PXA-B may be spaced apart from each other in the plane defined be directions DR1 and DR2.

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. As described herein, each of the light emitting regions PXA-R, PXA-G, and PXA-B may correspond to a representative pixel. The pixel defining film PDL may separate the organic electroluminescence devices ED-1, ED-2 and ED-3. The emission layers EML-R, EML-G and EML-B of the organic electroluminescence devices ED-1, ED-2 and ED-3 may be disposed in openings OH defined by the pixel defining film PDL and separated from each other.

The light emitting regions PXA-R, PXA-G and PXA-B may be divided into a plurality of groups according to the color of light generated from the organic electroluminescence devices ED-1, ED-2 and ED-3. In the display apparatus DD shown in FIGS. 1 and 2, three light emitting regions PXA-R, PXA-G, and PXA-B configured to emit red light, green light, and blue light, respectively are exemplarily illustrated. For example, the display apparatus DD may include the red light emitting region PXA-R, the green light emitting region PXA-G, and the blue light emitting region PXA-B which are separated from one another.

In the display apparatus DD, the plurality of organic electroluminescence devices ED-1, ED-2 and ED-3 may emit light beams having wavelengths different from one another. For example, in an embodiment, the display apparatus DD may include a first organic electroluminescence device ED-1 that emits red light, a second organic electroluminescence device ED-2 that emits green light, and a third organic electroluminescence device ED-3 that emits blue light. That is, the red light emitting region PXA-R, the green light emitting region PXA-G, and the blue light emitting region PXA-B of the display apparatus DD may correspond to the first organic electroluminescence device ED-1, the second organic electroluminescence device ED-2, and the third organic electroluminescence device ED-3, respectively.

However, embodiments are not limited thereto, and the first to third organic electroluminescence devices ED-1, ED-2, and ED-3 may emit light beams in the same wavelength range or at least one organic electroluminescence device may emit a light beam in a wavelength range different from the others. For example, the first to third organic electroluminescence devices ED-1, ED-2, and ED-3 may all emit blue light.

The light emitting regions PXA-R, PXA-G, and PXA-B in the display apparatus DD may be arranged in a generally elongated (stripe) shape. Referring to FIG. 1, the plurality of red light emitting regions PXA-R, the plurality of green light emitting regions PXA-G, and the plurality of blue light emitting regions PXA-B each may be arranged along a second directional axis DR2. In addition, the red light emitting region PXA-R, the green light emitting region PXA-G, and the blue light emitting region PXA-B may be alternately arranged along a first directional axis DR1 as shown in FIG. 1.

FIGS. 1 and 2 illustrate that all the light emitting regions PXA-R, PXA-G, and PXA-B are similarly depicted, but embodiments are not limited thereto, and the light emitting regions PXA-R, PXA-G, and PXA-B may have different planar areas from each other according to a wavelength range of the emitted light. In this case, the planar areas of the light emitting regions PXA-R, PXA-G, and PXA-B may mean areas when viewed in a plane defined by the first directional axis DR1 and the second directional axis DR2.

The configuration of the light emitting regions PXA-R, PXA-G, and PXA-B is not limited to the features illustrated in FIG. 1, and the order in which the red light emitting region PXA-R, the green light emitting region PXA-G, and the blue light emitting region PXA-B are arranged may be variously combined or changed according to characteristics of a display quality required in the display apparatus DD. For example, the configuration of the light emitting regions PXA-R, PXA-G, and PXA-B may be a configuration sold under the trade designation PenTile matrix by Samsung Display Co., Ltd. of Gyeonggi-do, Republic of Korea, or a diamond configuration.

In addition, the planar areas of the light emitting regions PXA-R, PXA-G, and PXA-B may be different from each other. For example, in an embodiment, the area of the green light emitting region PXA-G may be smaller than that of the blue light emitting region PXA-B, but embodiments are not limited thereto.

Figure 3:
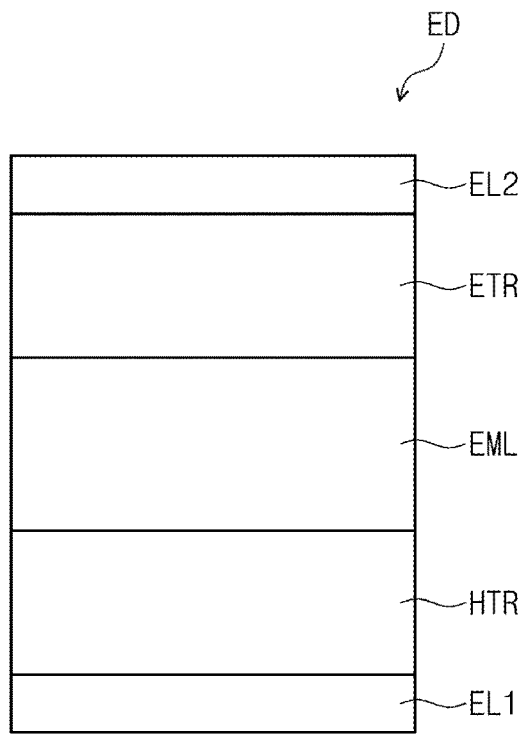
FIG. 3 is a schematic cross-sectional view of an embodiment of a light emitting device constructed according to the principles of the invention.
Figure 4:
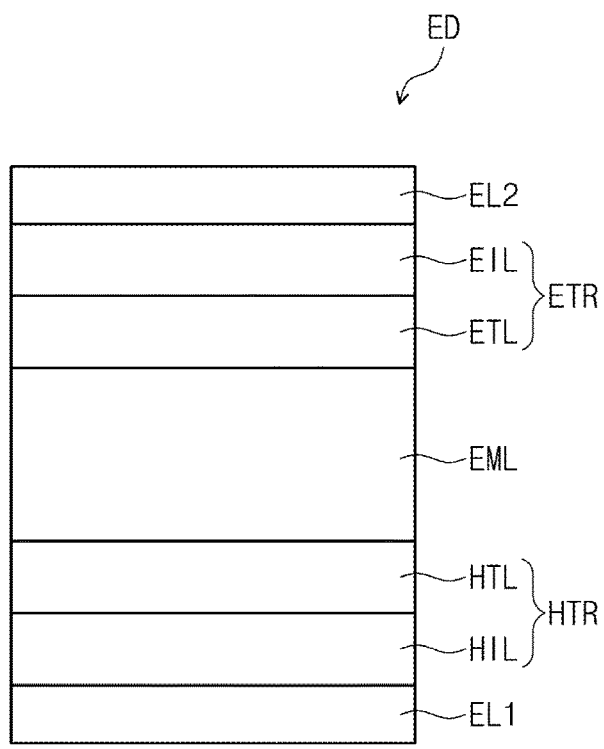
FIG. 4 is a schematic cross-sectional view of another embodiment of a light emitting device constructed according to the principles of the invention.
Figure 5:
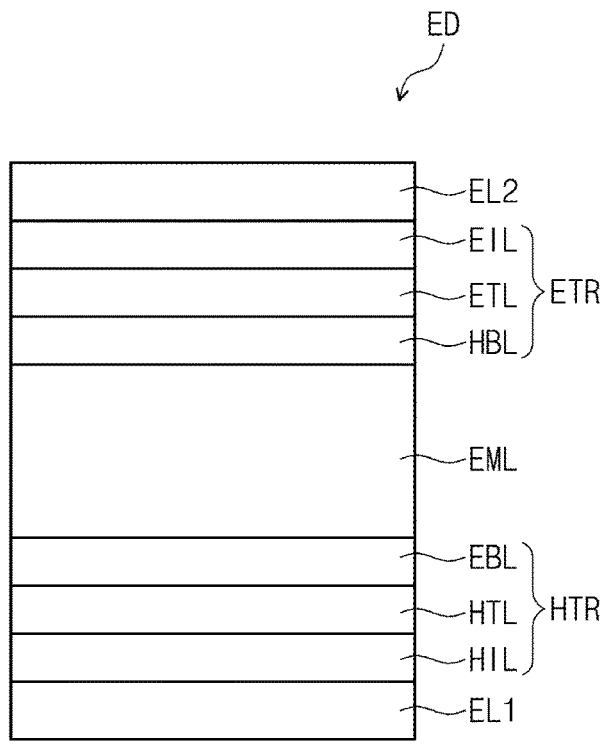
FIG. 5 is a schematic cross-sectional view of a further embodiment of a light emitting device constructed according to the principles of the invention.
Figure 6:
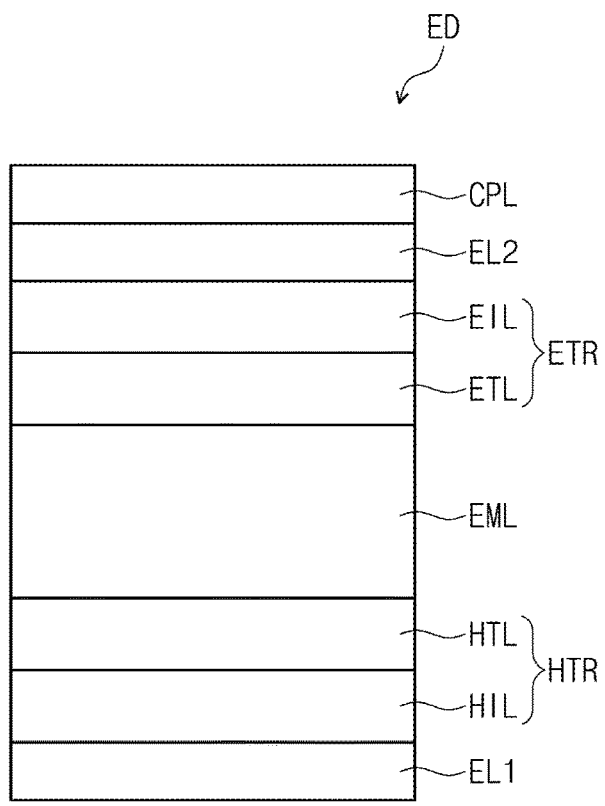
FIG. 6 is a schematic cross-sectional view of yet another embodiment of a light emitting device constructed according to the principles of the invention.

FIG. 3 is a schematic cross-sectional view of an embodiment of a light emitting device constructed according to the principles of the invention. FIG. 4 is a schematic cross-sectional view of another embodiment of a light emitting device constructed according to the principles of the invention. FIG. 5 is a schematic cross-sectional view of a further embodiment of a light emitting device constructed according to the principles of the invention. FIG. 6 is a schematic cross-sectional view of yet another embodiment of a light emitting device constructed according to the principles of the invention.

Each of the organic electroluminescence devices ED may include a first electrode EL1, a hole transport region HTR, an emission layer EML, an electron transport region ETR, and a second electrode EL2 that are sequentially stacked.

Compared to FIG. 3, FIG. 4 illustrates a cross-sectional view of an organic electroluminescence device ED, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of an organic electroluminescence device ED, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of an organic electroluminescence device ED including a capping layer CPL disposed on a second electrode EL2.

The first electrode EL1 has conductivity. The first electrode EL1 may be formed of a metal alloy or a conductive compound. The first electrode EL1 may be an anode or a cathode. However, embodiments are not limited thereto. In addition, the first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as an indium tin oxide (ITO), an indium zinc oxide (IZO), a zinc oxide (ZnO), and an indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). Alternatively, the first electrode EL1 may have a multilayer structure including a reflective layer or a transflective layer formed of the above-described materials, and a transparent conductive layer formed of the ITO, IZO, ZnO, ITZO, etc. For example, the first electrode EL1 may have a three-layer structure of an ITO/Ag/ITO, but embodiments are not limited thereto. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be, for example, from about 50 Å to about 15,000 Å. The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, and may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto. The hole transport region HTR may have a single layer formed of a single material, a single layer formed of a plurality of different materials, or a multilayer structure including a plurality of layers formed of a plurality of different materials.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below:

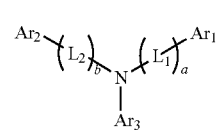

Formula H-1

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. When a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 above may be a monoamine compound. Alternatively, the compound represented by Formula H-1 above may be a diamine compound in which at least one of $Ar_1$ to $Ar_3$ includes the amine group as a substituent. In addition, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one of the compounds of Compound Group H below. However, the compounds listed in Compound Group H below are examples, and the compounds represented by Formula H-1 are not limited to those represented by Compound Group H below:

Compound Group H

H-1-1

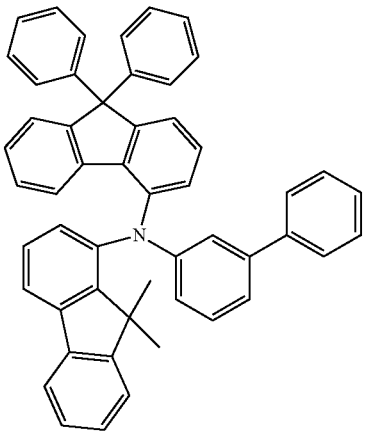

H-1-2

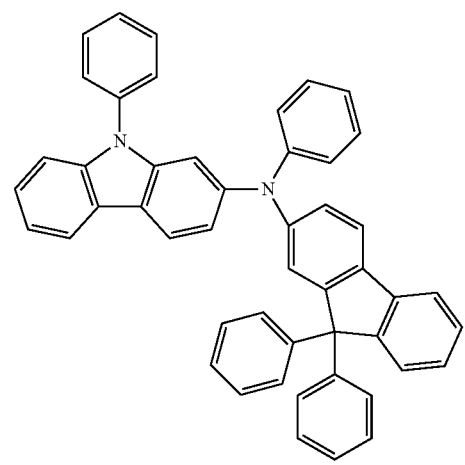

H-1-3

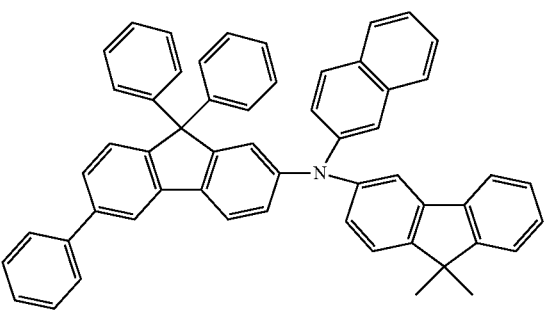

H-1-4

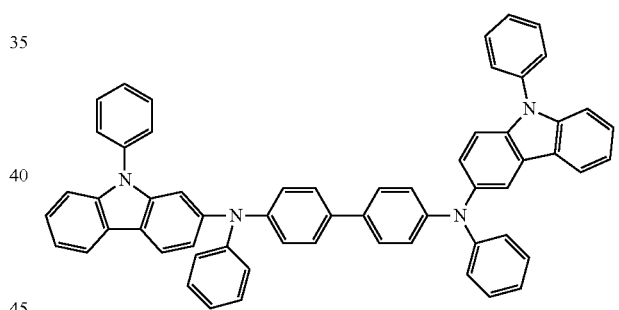

H-1-5

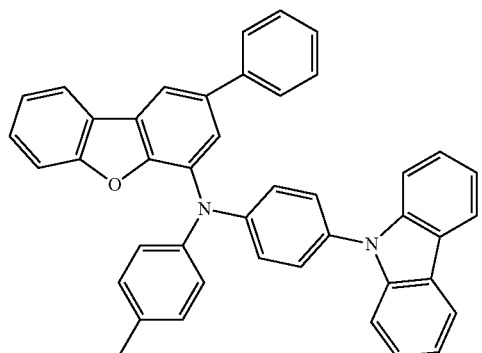

H-1-6

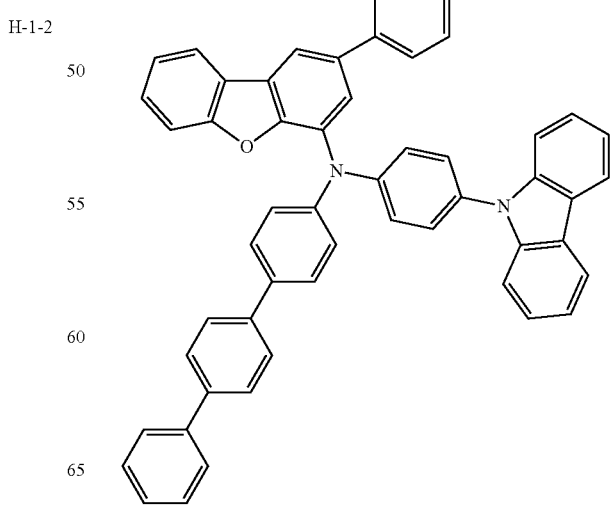

H-1-7
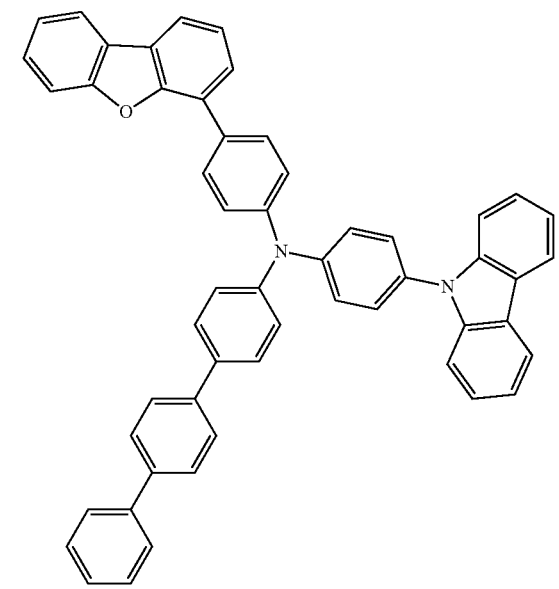
H-1-8
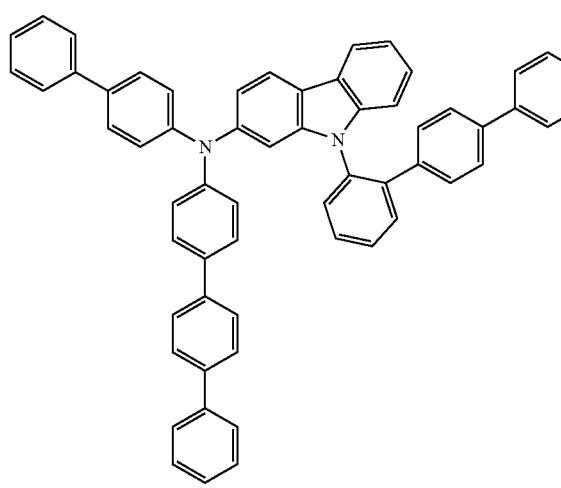
H-1-9
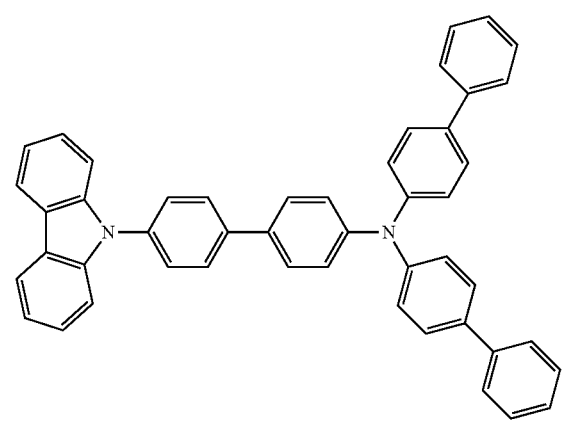
H-1-10
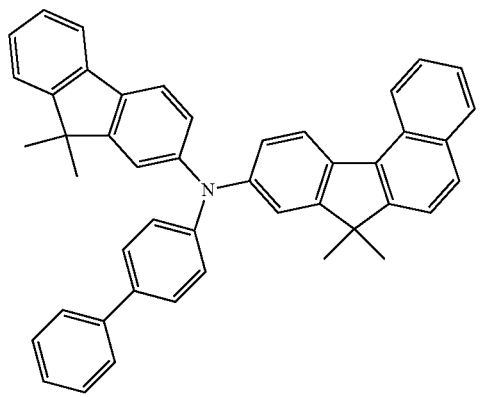
H-1-11
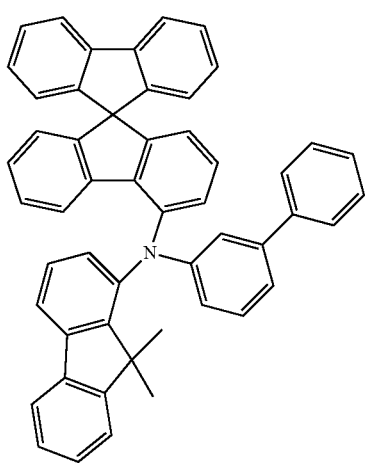
H-1-12
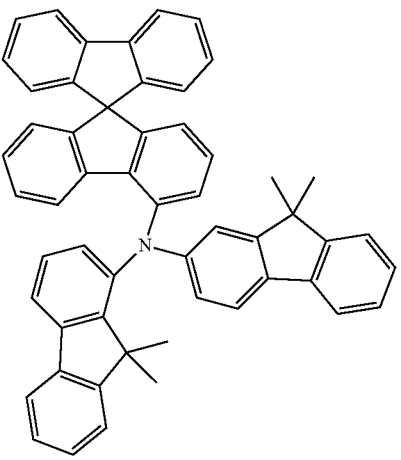
H-1-13
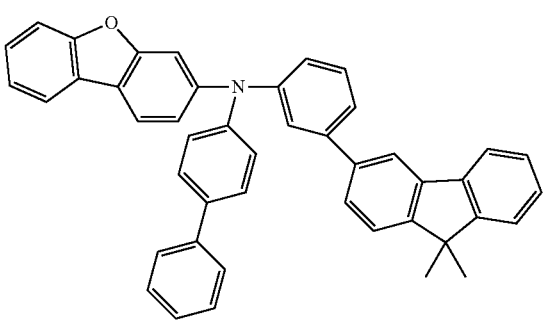

H-1-14

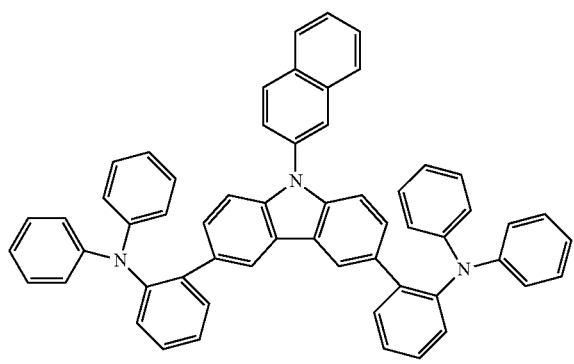

H-1-17

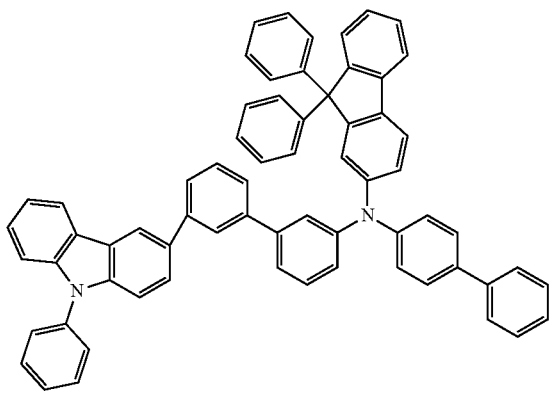

H-1-15

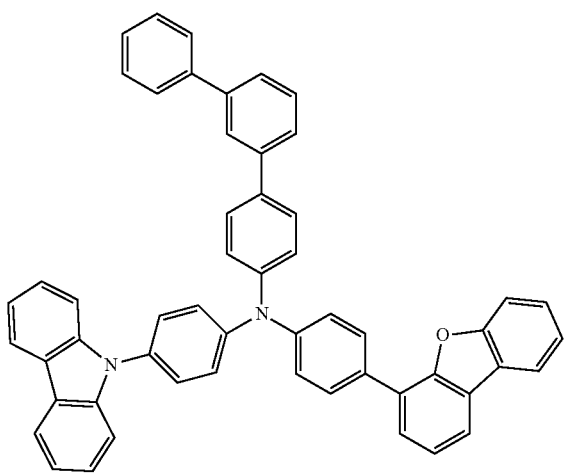

H-1-18

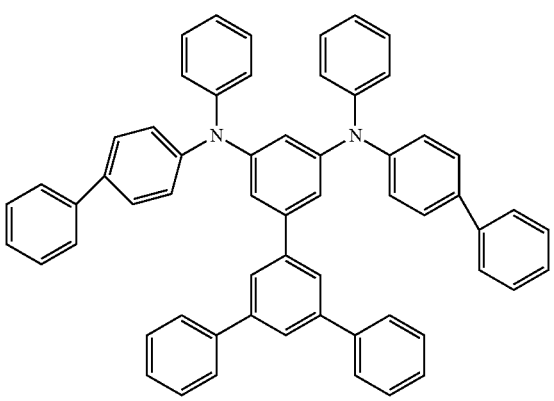

H-1-16

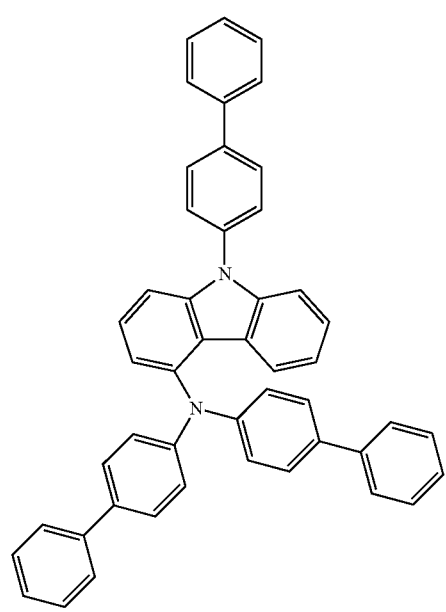

H-1-19

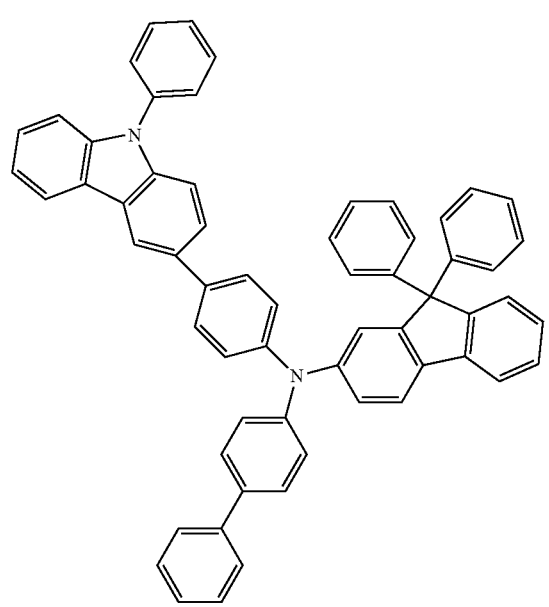

The hole transport region HTR may include a phthalocyanine compound such as copper phthalocyanine; $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(1-naphthyl)-N-phenylamino]-triphenylamine (1-TNATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-including polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HAT-CN), etc.

The hole transport region HTR may include a carbazole-based derivative such as N-phenyl carbazole and polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4''-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-di(carbazol-9-yl)benzene (mCP), etc.

The hole transport region HTR may further include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc. The hole transport region HTR may include the above-described compound of the hole transport region in at least one of a hole injection layer HIL, a hole transport layer HTL, or an electron blocking layer EBL. The hole transport region HTR may include the above-described compound of the hole transport region in at least one of a hole injection layer HIL, a hole transport layer HTL, or an electron blocking layer EBL.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase in a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may be one of a quinone derivative, a metal oxide, or a cyano group-containing compound, but embodiments are not limited thereto. For example, non-limiting examples of the p-dopant may include a quinone derivative such as tetracyanoquinodimethane (TCNQ) and 2,3,5,6-tetrafluoro-7,7'8,8-tetracyanoquinodimethane (F4-TCNQ), a metal oxide such as a tungsten oxide and a molybdenum oxide, etc., but embodiments are not limited thereto.

As described above, the hole transport region HTR may further include at least one of the hole buffer layer or the electron blocking layer EBL in addition to the hole injection layer HIL and the hole transport layer HTL. The hole buffer layer may compensate for a resonance distance according to the wavelength of light emitted from the emission layer EML, although not wanting to be bound by theory, and may thus increase luminous efficiency. Materials which may be included in the hole transport region HTR may be used as materials to be included in the hole buffer layer. The electron blocking layer EBL is a layer that serves to prevent the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials. The emission layer EML in the organic electroluminescence device ED may include an organometallic compound which will be described below.

Embodiments of an organometallic compound made according to the principles of the invention may be represented by Formula 1 below:

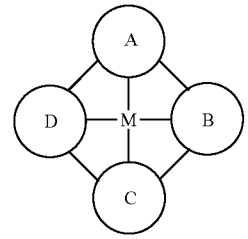

Formula 1

In Formula 1, M is iridium (Ir), platinum (Pt), osmium (Os), titanium (Ti), zirconium (Zr), hafnium (Hf), europium (Eu), terbium (Tb), thulium (Tm) or rhodium (Rh).

In Formula 1, at least two of ring A to ring D are each represented by Formula 2 below, and the rest are each independently a substituted or unsubstituted hydrocarbon ring group having 5 to 60 ring-forming carbon atoms, or a substituted or unsubstituted heterocyclic group having 1 to 60 ring-forming carbon atoms.

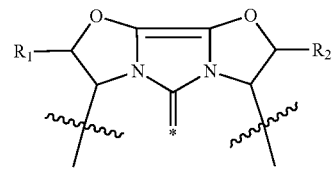

Formula 2

In Formula 2, $R_1$ and $R_2$ are each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

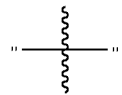

In Formula 2, "—*" is a position bonded to M of Formula 1, and is a position bonded to any one of ring A to ring D of Formula 1.

In an embodiment, M may be iridium (Ir) or platinum (Pt). The organometallic compound represented by Formula 1 may include a ligand represented by Formula 2, thereby, although not wanting to be bound by theory, exhibiting an improved metal-to-ligand charge-transfer (MLCT) ratio. The organometallic compound may exhibit a high MLCT ratio, thereby making a contribution to the improvement of efficiency of the organic electroluminescence device when the organometallic compound is used as an emission layer material. The MLCT ratio as described herein refers to a triplet metal-to-ligand charge-transfer ($^3$MLCT) ratio, and represents a relative ratio when 100% charge-transfer occurs from a metal atom to a ligand.

In an embodiment, two rings of ring A to ring D in Formula 1 may each be represented by Formula 2 above, and the rest two rings may be each independently a substituted or unsubstituted aryl group having 6 to 30 ring-forming carbon atoms, or a substituted or unsubstituted heteroaryl group having 2 to 30 ring-forming carbon atoms.

In an embodiment, Formula 1 may be represented by Formula 2-1 below:

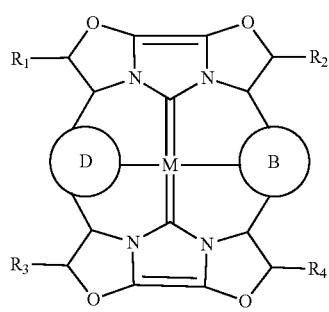

Formula 2-1

In Formula 2-1, $R_3$ and $R_4$ may be each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula 2-1, M, ring B, ring D, $R_1$, and $R_2$ are the same as defined in Formula 1 and Formula 2.

In an embodiment, Formula 2-1 may be represented by Formula 3 below:

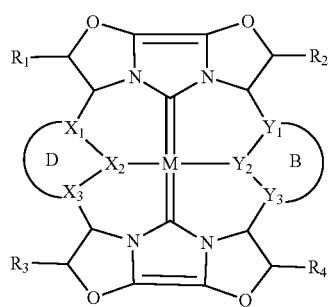

Formula 3

In Formula 3, $X_1$ to $X_3$ and $Y_1$ to $Y_3$ may be each independently N or $CR_a$, and $R_a$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 3, M, ring B, ring D, and $R_1$ to $R_4$ are the same as defined in Formula 2-1. In an embodiment, at least two of $X_1$ to $X_3$ in Formula 3 may be each independently $CR_a$ above, and at least two $Y_1$ to $Y_3$ in Formula 3 may be each independently $CR_a$ above.

In an embodiment, Formula 2-1 may be represented by Formula 4 below:

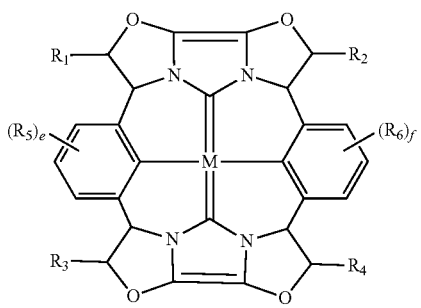

Formula 4

In Formula 4, $R_5$ and $R_6$ may be each independently a hydrogen atom, a deuterium atom, a halogen atom, a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula 4, e and f may be each independently an integer of 0 to 3. When e is 2 or more, a plurality of $R_5$'s are the same as or different from each other, and when f is 2 or more, a plurality of $R_6$'s are the same as or different from each other. In Formula 4, M, and $R_1$ to $R_4$ are the same as defined in Formula 2-1.

In an embodiment, in Formula 4, e and f may be each independently an integer of 1 to 3, and $R_5$ and $R_6$ may be each independently a cyano group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In an embodiment, $R_1$ to $R_4$ in Formula 4 may be each independently a hydrogen atom or a deuterium atom.

Embodiments of the organometallic compound may be represented by any one of the compounds represented by Compound Group 1 below. The emission layer EML May include at least one from of the compounds represented by Compound Group 1 below:

Compound Group 1
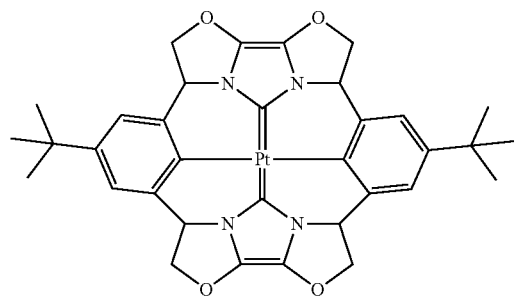
1
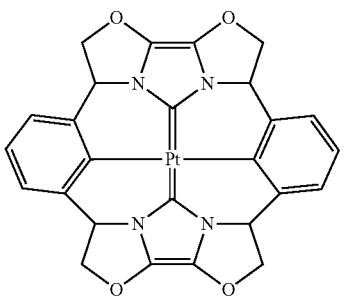
2
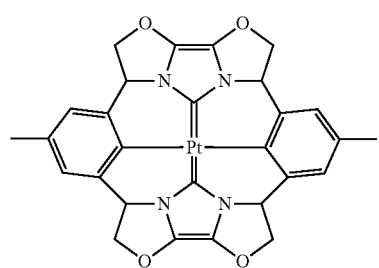
3
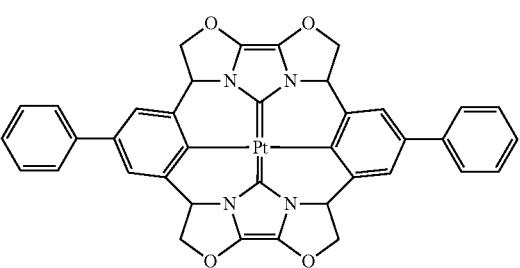
4
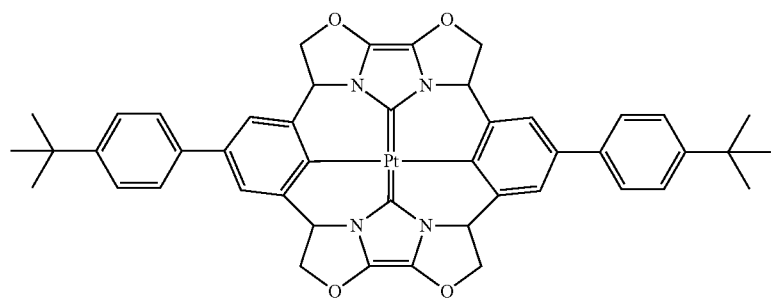
5
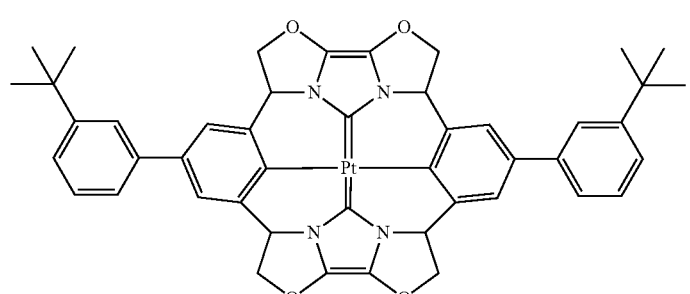
6
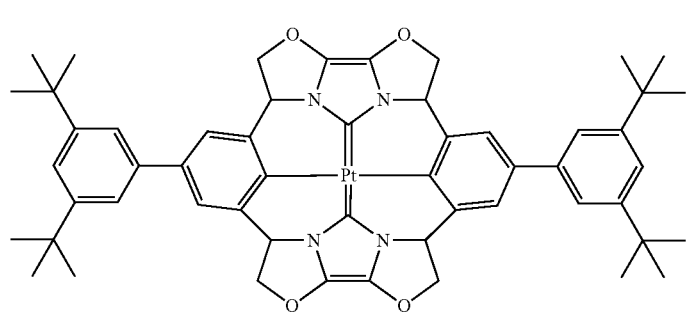
7

-continued
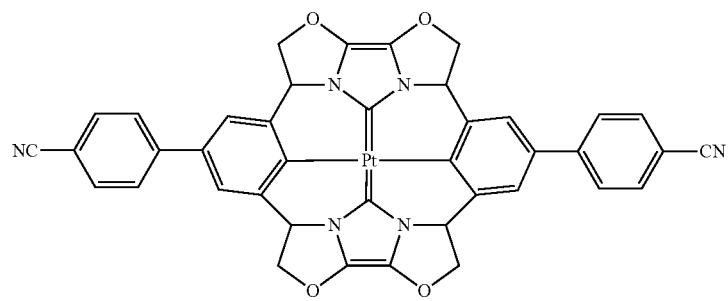
8
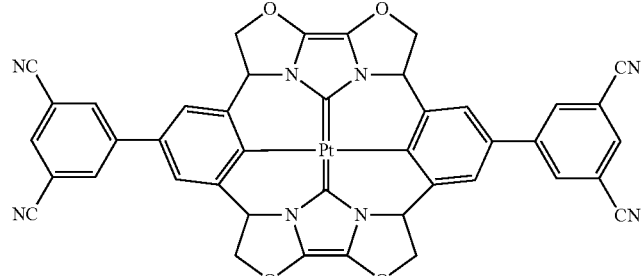
9
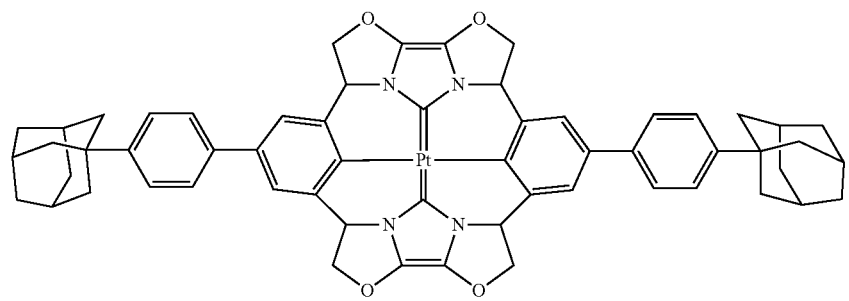
10
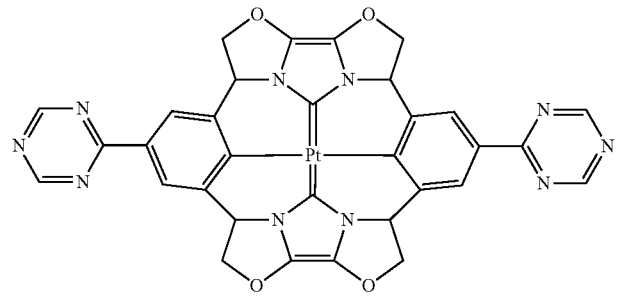
11
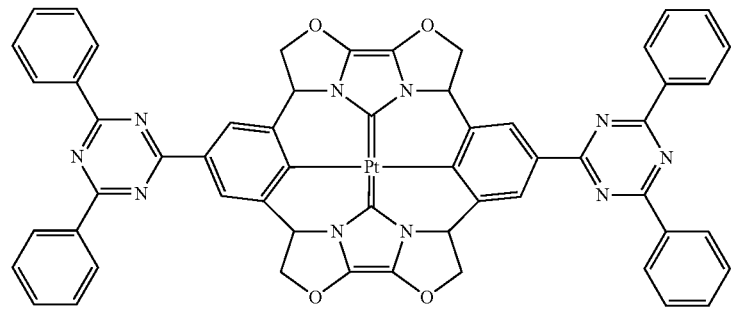
12

-continued
13
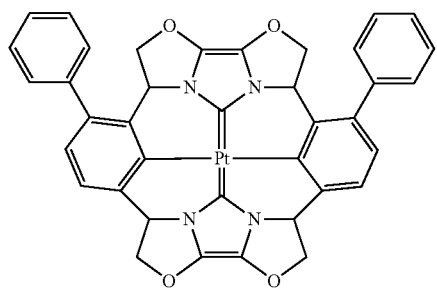
14
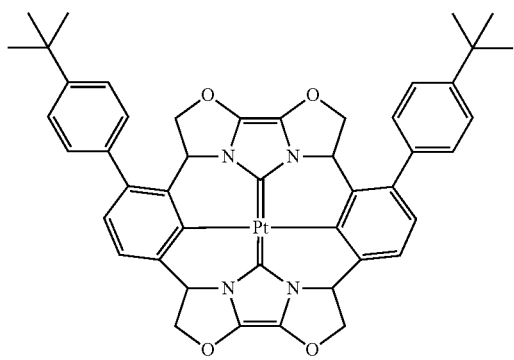
15
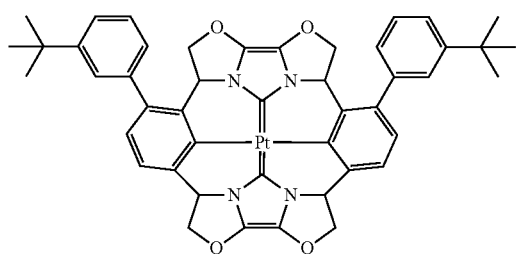
16
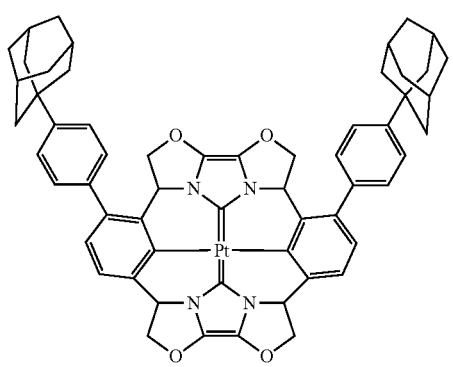
17
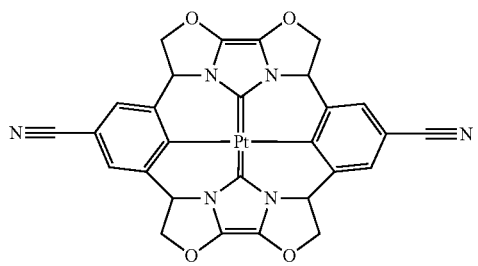
18
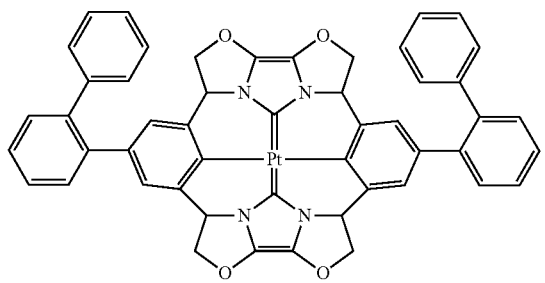
19
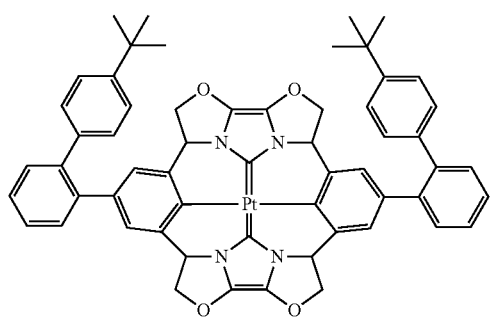
20
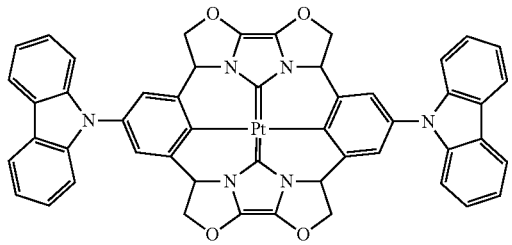
21
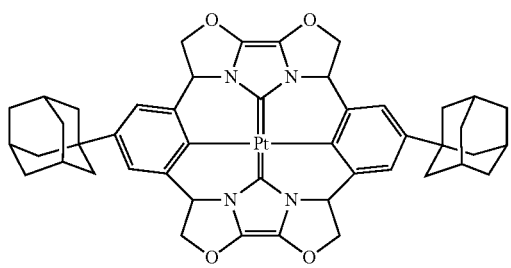
22
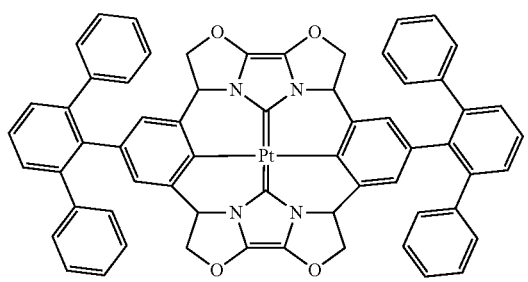

-continued
23
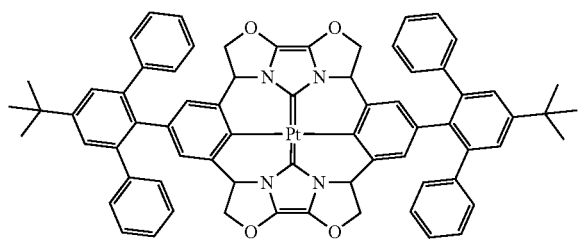
24
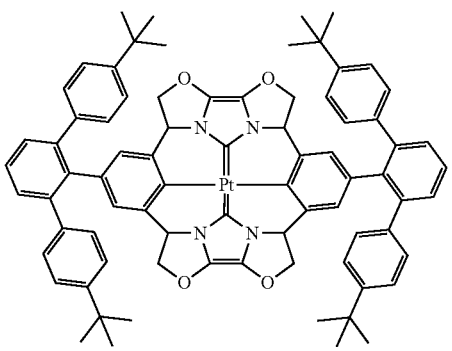
25
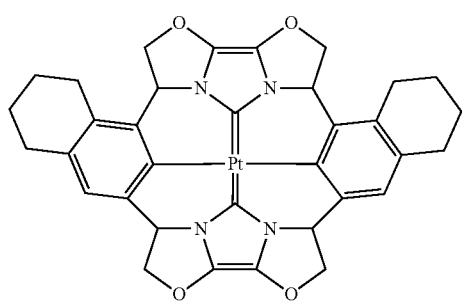
26
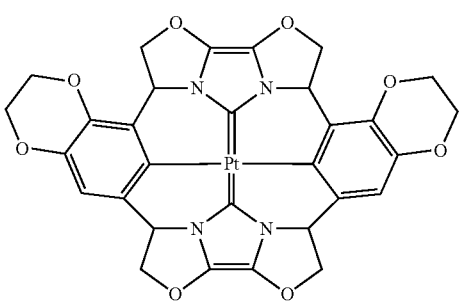
2-1
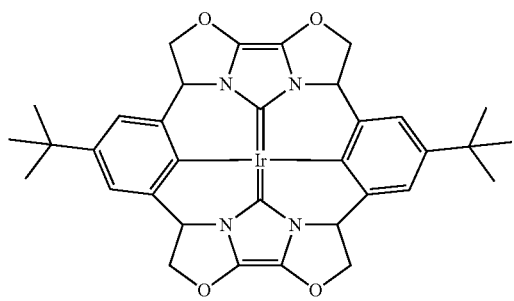
2-2
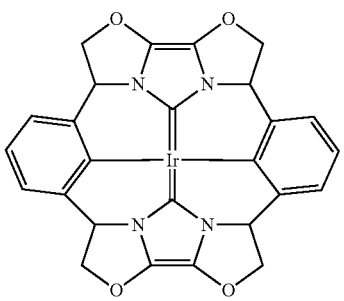
2-3
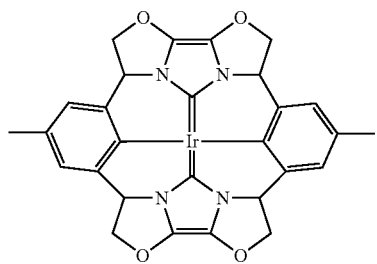
2-4
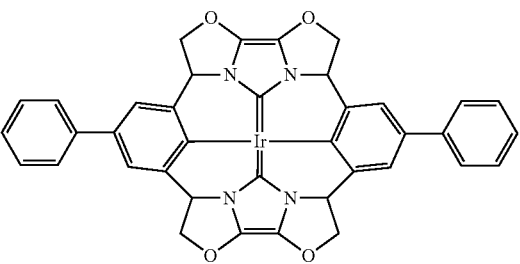
2-5
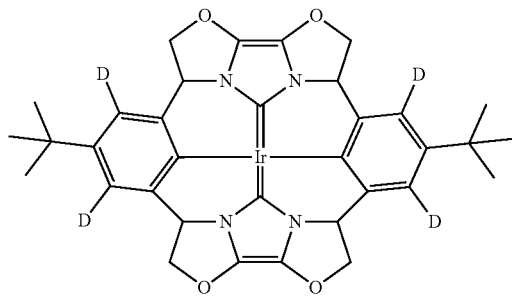
2-6
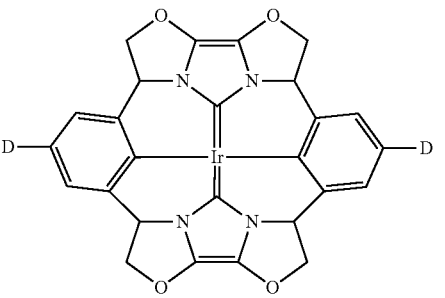

The emission layer EML in the organic electroluminescence device ED may include an embodiment of an organometallic compound made according to the principles of the invention, thereby exhibiting improved luminous efficiency characteristics. The organometallic compound may include a cyclic ligand including an oxazolidine carbene, thereby exhibiting an improved ³MLCT ratio.

In the embodiments of the organic electroluminescence device ED illustrated in FIGS. 3 to 6, the emission layer EML may include a host and a dopant, and the emission layer EML may include the organometallic compound represented by Formula 1. In an embodiment, the emission layer EML may emit phosphorescence. For example, the organometallic compound represented by Formula 1 may be a phosphorescence dopant.

The emission layer EML may further include a host material in addition to the organometallic compound as described above. The emission layer EML in the organic electroluminescence device ED of may include general materials, which are known in the art, as a host material. In the organic electroluminescence device ED, the emission layer EML may include an anthracene derivative, a pyrene derivative, a fluoranthene derivative, a chrysene derivative, a dehydrobenzanthracene derivative, or a triphenylene derivative. Specifically, the emission layer EML may include the anthracene derivative or the pyrene derivative.

In an embodiment, the emission layer EML may include a compound represented by Formula E-1 below. The compound represented by Formula E-1 below may be used as a fluorescence host material.

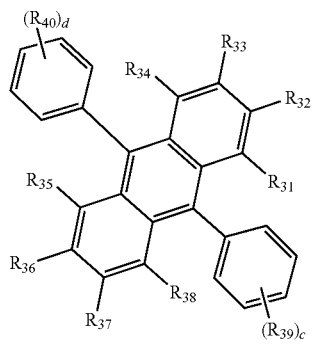

Formula E-1

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. The variables $R_{31}$ to $R_{40}$ may be bonded to an adjacent group to form a saturated hydrocarbon ring or an unsaturated hydrocarbon ring, a saturated heterocycle, or an unsaturated heterocycle. In Formula E-1, c and d may be each independently an integer of 0 to 5.

Formula E-1 may be represented by any one of Compound E1 to Compound E19 below:

E6
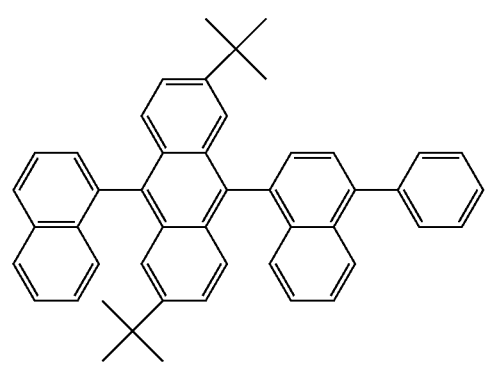
E7
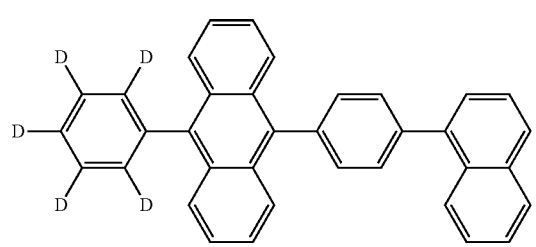
E8
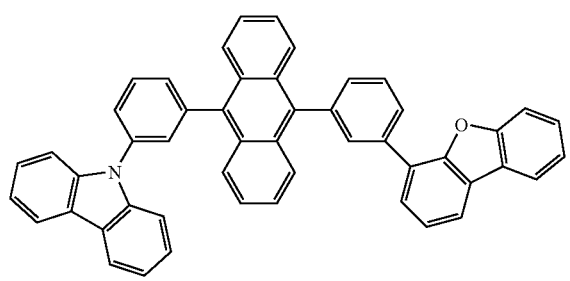
E9
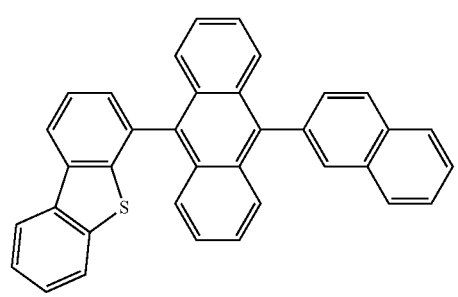
E10
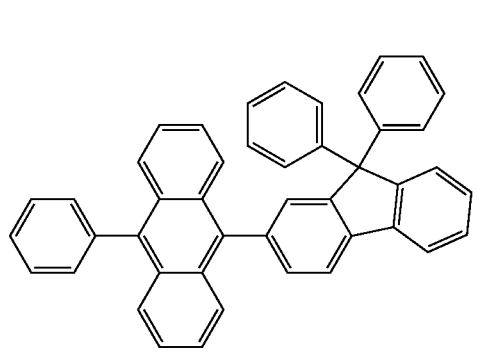
E11
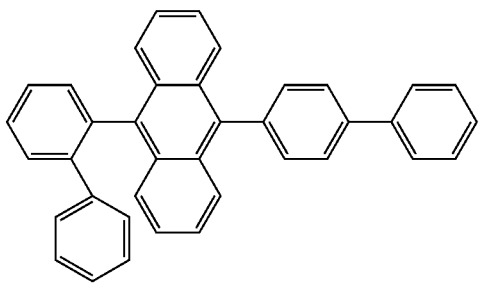
E12
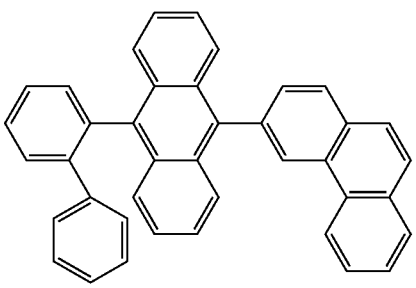
E13
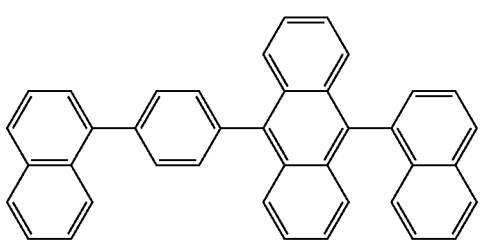
E14
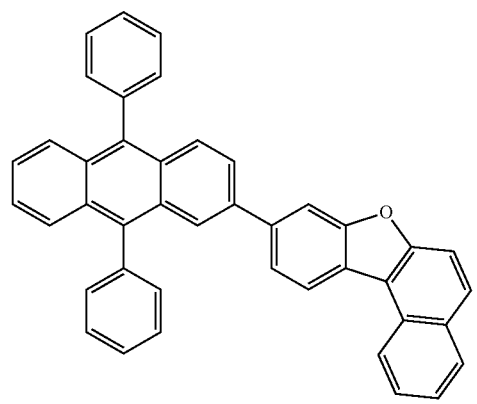

E15

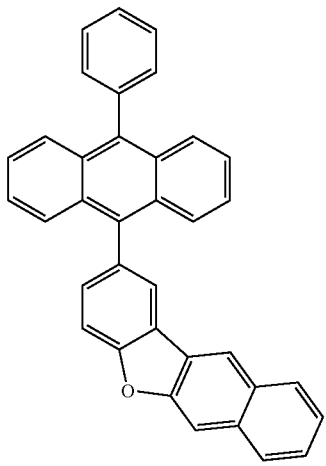

E16

E17

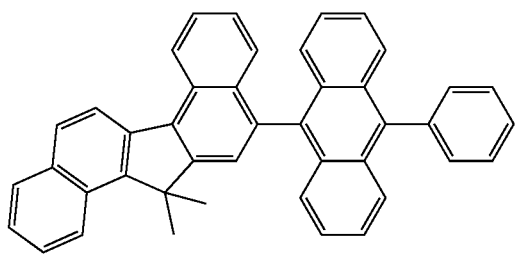

E18

E19

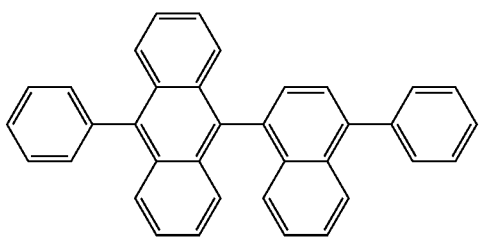

In an embodiment, the emission layer EML may include a compound represented by Formula E-2a or Formula E-2b below. The compound represented by Formula E-2a or Formula E-2b below may be used as a phosphorescence host material.

Formula E-2a

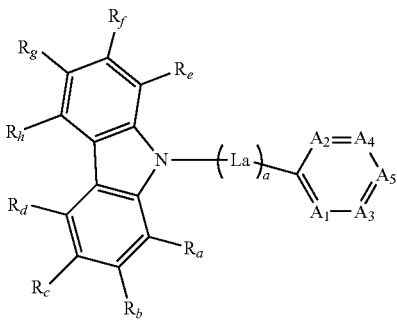

In Formula E-2a, a may be an integer of 0 to 10, La may be a direct linkage, a substituted or unsubstituted arylene group having 6 to 30 ring-forming carbon atoms, or a substituted or unsubstituted heteroarylene group having 2 to 30 ring-forming carbon atoms. If a is an integer of 2 or more, a plurality of La's may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. The variables $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. The variables $R_a$ to $R_i$ may be bonded to an adjacent group to form a hydrocarbon ring or a heterocycle containing N, O, S, etc. as a ring-forming atom.

In Formula E-2a, two or three selected from of $A_1$ to $A_5$ may be N, and the rest may be $CR_i$.

Formula E-2b $(Cbz1)\!-\!(L_b)_b\!-\!(Cbz2)$

In Formula E-2b, Cbz1 and Cbz2 may be each independently an unsubstituted carbazole group, or a carbazole group substituted with an aryl group having 6 to 30 ring-forming carbon atoms. The variable $L_b$ is a direct linkage, a substituted or unsubstituted arylene group having 6 to 30 ring-forming carbon atoms, or a substituted or unsubstituted heteroarylene group having 2 to 30 ring-forming carbon atoms. The variable b is an integer of 0 to 10, and when b is an integer of 2 or more, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one of the compounds of Compound Group E-2 below. However, the compounds listed in Compound Group E-2 below are examples, the compound represented by Formula E-2a or Formula E-2b is not limited to those represented by Compound Group E-2 below.

Compound Group E-2

E-2-1

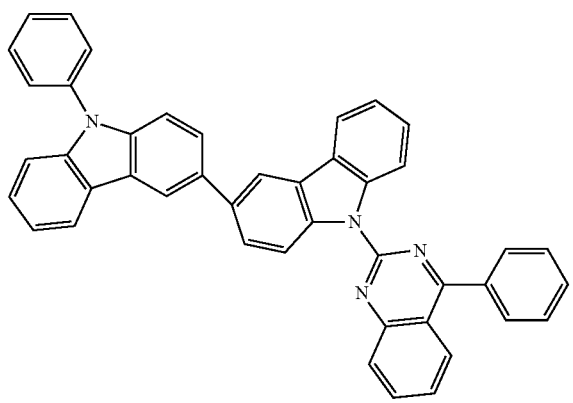

E-2-2

E-2-3

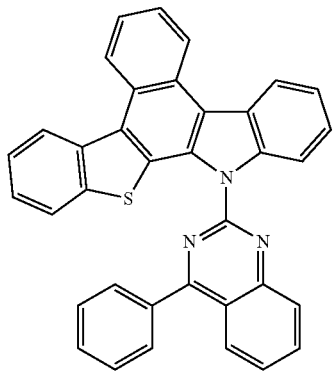

E-2-4

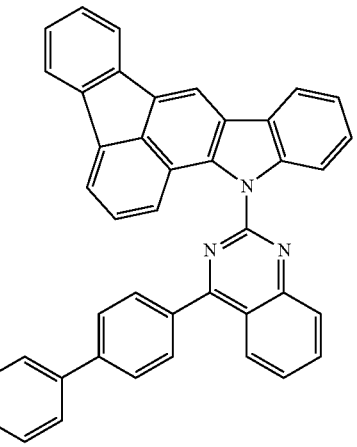

E-2-5

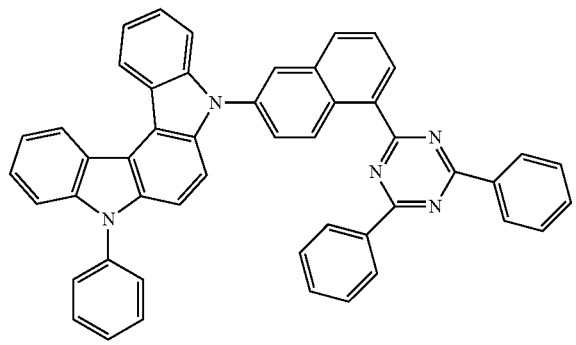

E-2-6

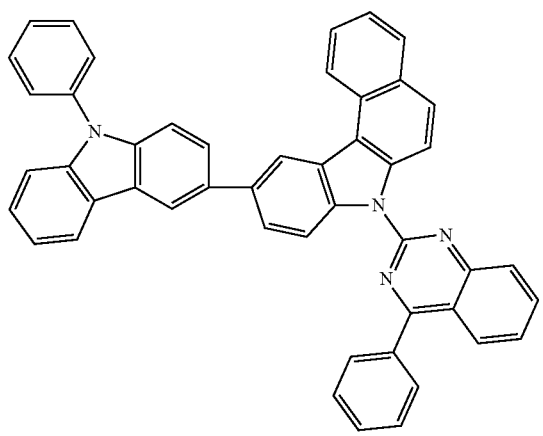

-continued
E-2-7
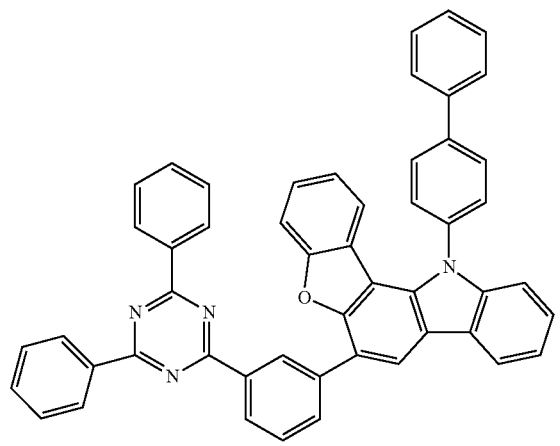
E-2-8
E-2-9
E-2-10
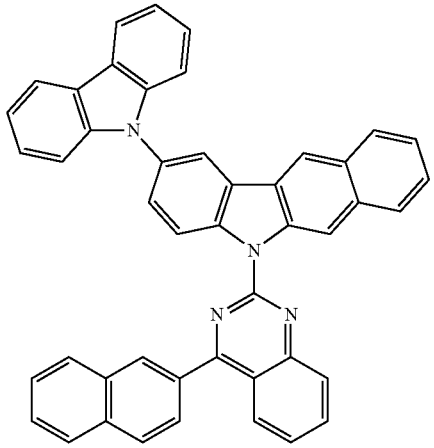
E-2-11
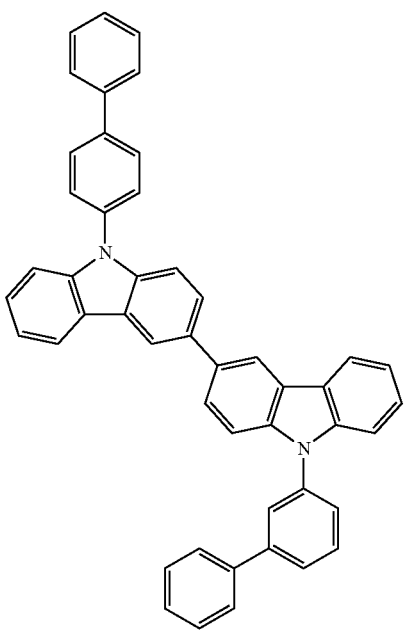
E-2-12
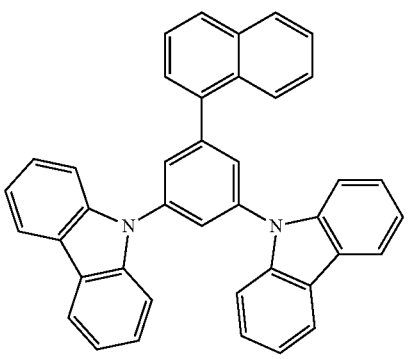

E-2-13
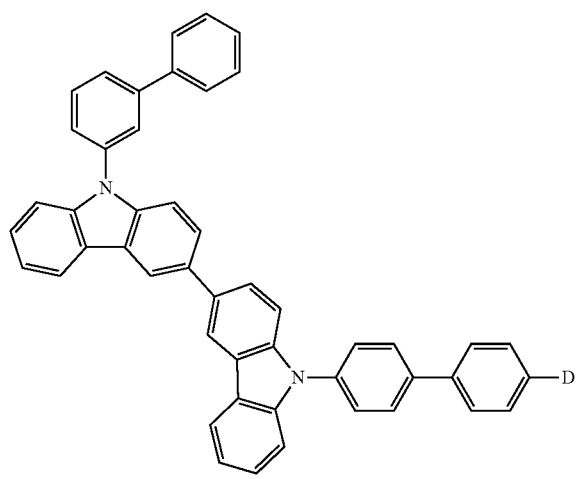
E-2-14
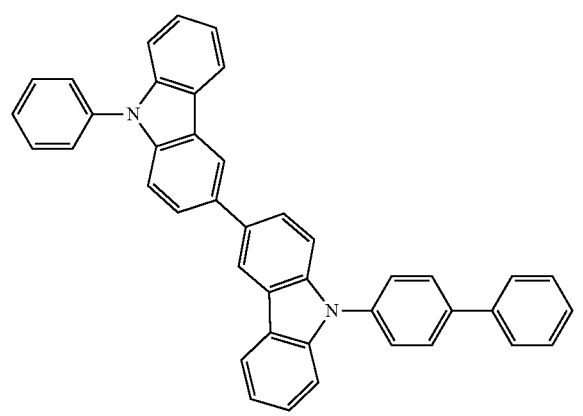
E-2-15
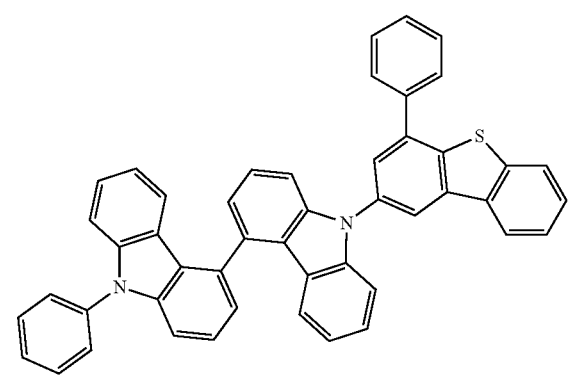
E-2-16
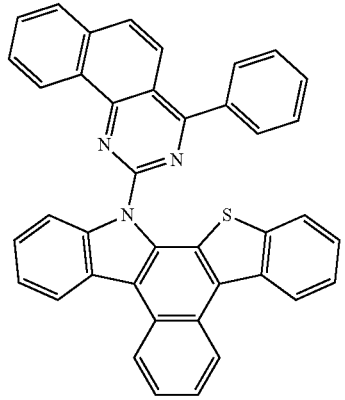
E-2-17
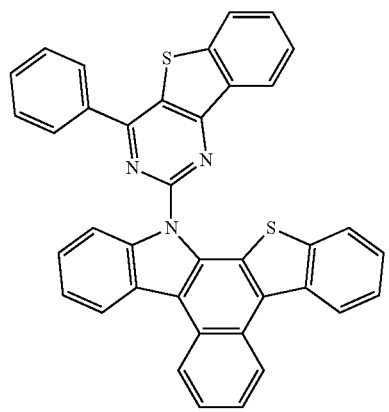
E-2-18
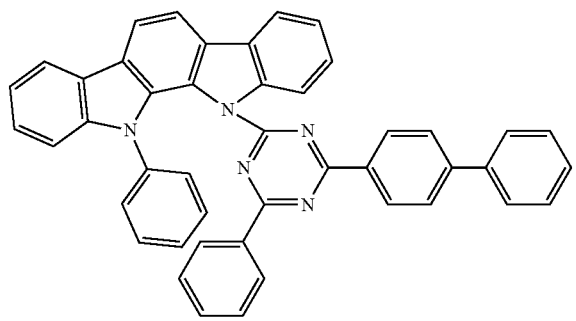
E-2-19
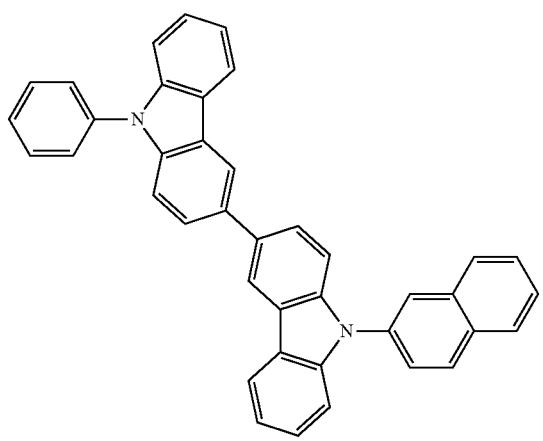

E-2-20
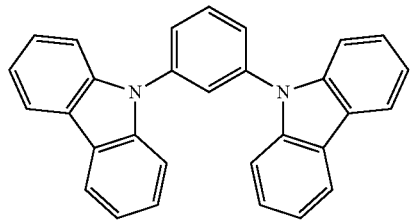

E-2-21
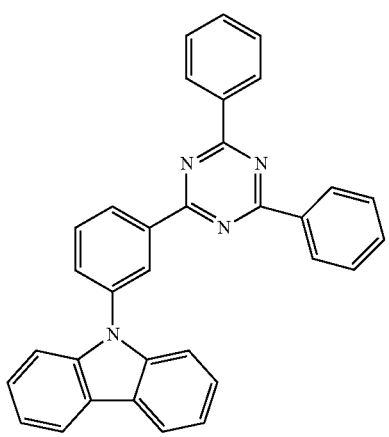

E-2-22
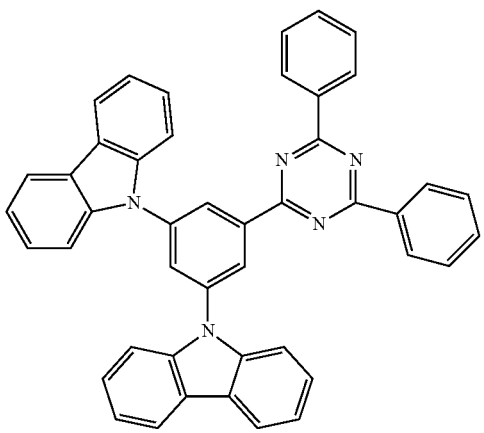

E-2-23
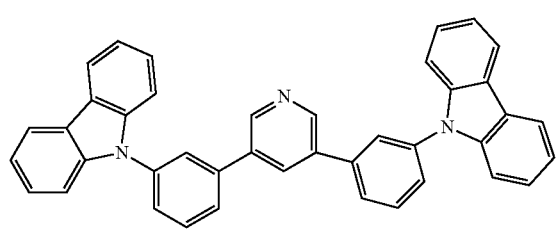

E-2-24
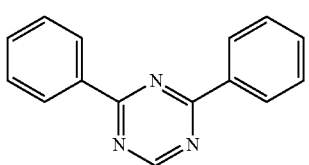
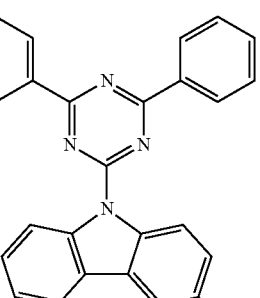

The emission layer EML may further include a general material known in the art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl) benzene (mCP), 2,8-bis(diphenylphosphoryl)dibenzo[b,d] furan (PPF), 4,4',4''-tris(carbazol-9-yl)-triphenylamine (TCTA), or 1,3,5-tris(1-phenyl-1H-benzo[d]imidazole-2-yl) benzene (TPBi). However, embodiments are not limited thereto, for example, tris(8-hydroxyquinolino)aluminum (Alq$_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), etc. may be used as a host material.

The emission layer EML may include a compound represented by Formula M-a or Formula M-b below. The compound represented by Formula M-a or Formula M-b below may be used as a phosphorescence dopant material.

Formula M-a
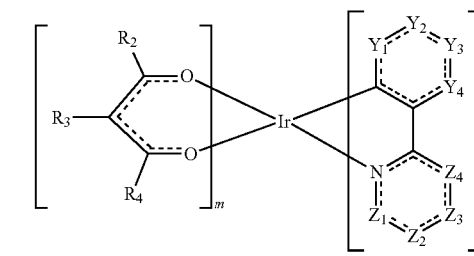

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be used as a phosphorescence dopant. The compound represented by Formula M-a may be represented by any one of Compound M-a1 to Compound M-a25 below. However, Compounds M-a1 to M-a25 below are examples, and the compound represented by Formula M-a is not limited to those represented by Compounds M-a1 to M-a25 below.

M-a1

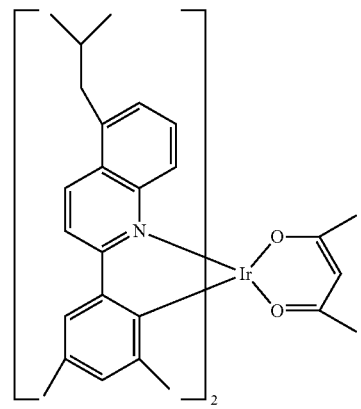

M-a2

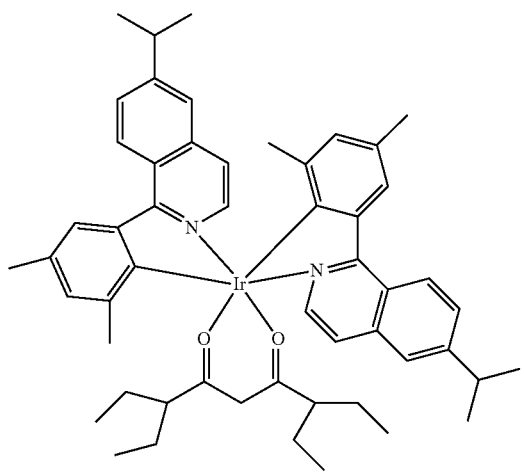

M-a3

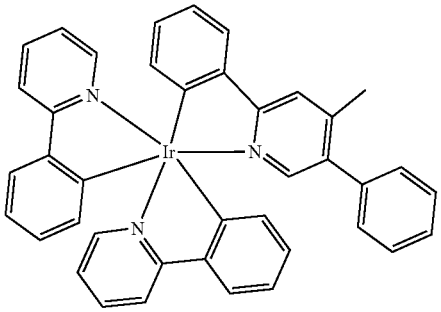

M-a4

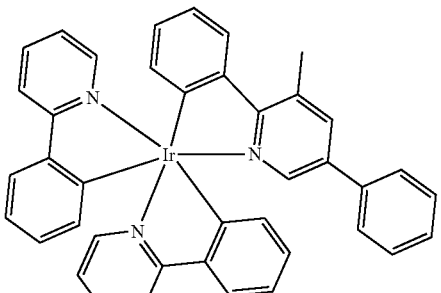

M-a5

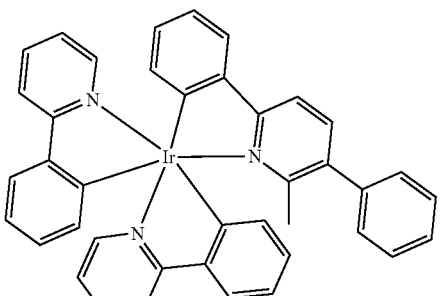

M-a6

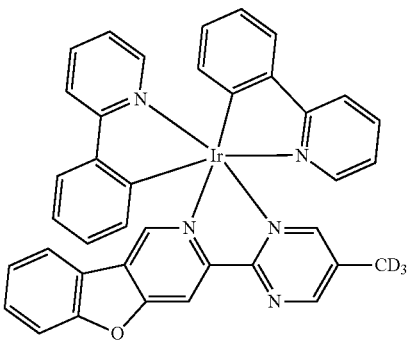

M-a7
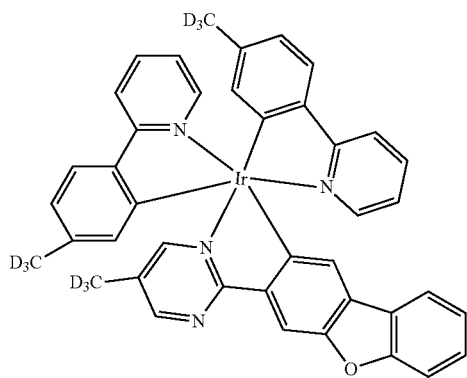
M-a8
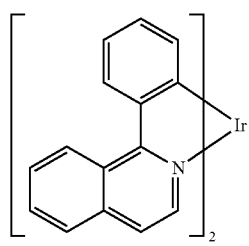
M-a9
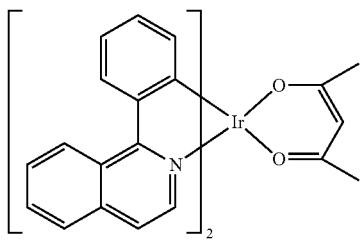
M-a10
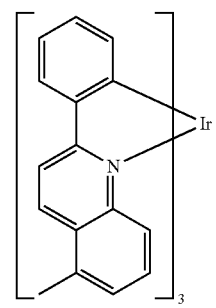
M-a11
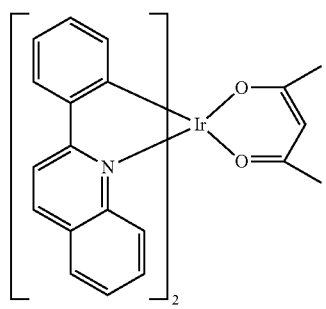
M-a12
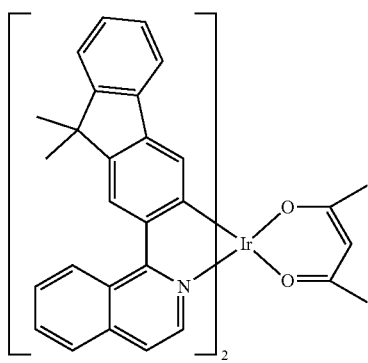
M-a13
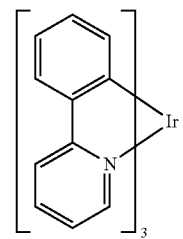
M-a14
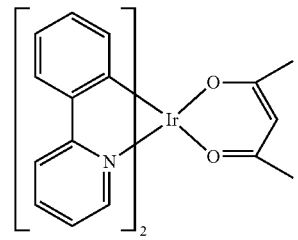
M-a15
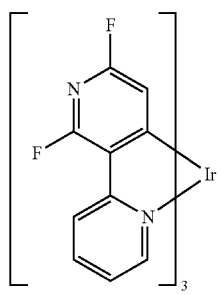
M-a16
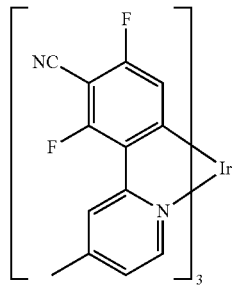

-continued
M-a17
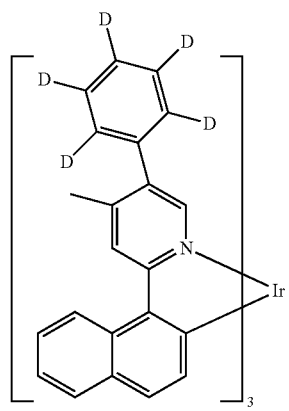
M-a18
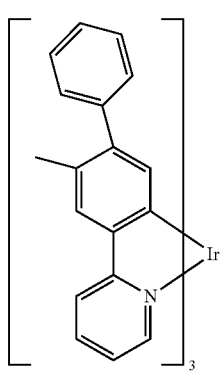
M-a19
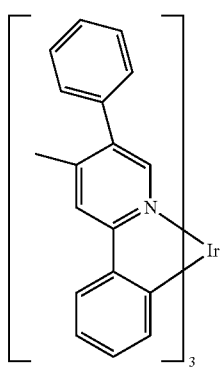
M-a20
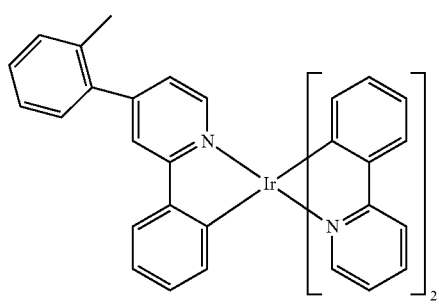
-continued
M-a21
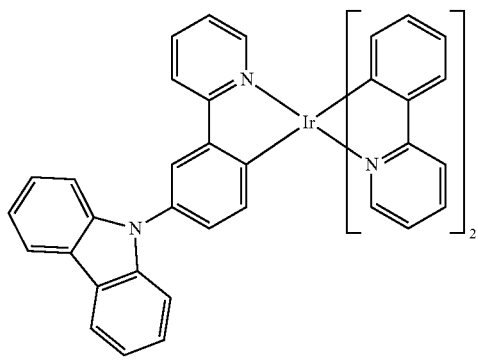
M-a22
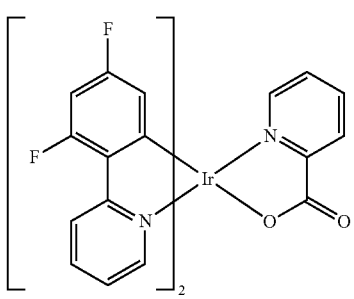
M-a23
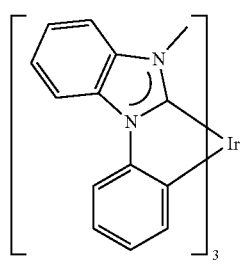
M-a24
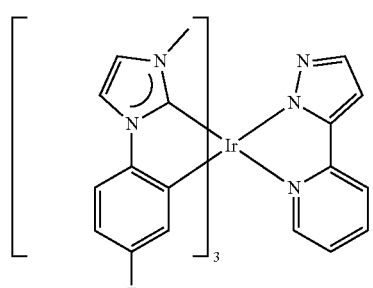
M-a25
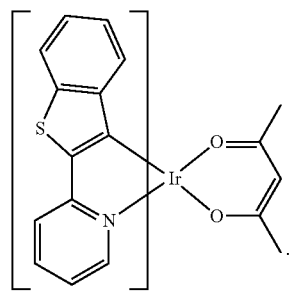
Compound M-a1 and Compound M-a2 may be used as a red dopant material, and
Compound M-a3 and Compound M-a4 may be used as a green dopant material.

Formula M-b

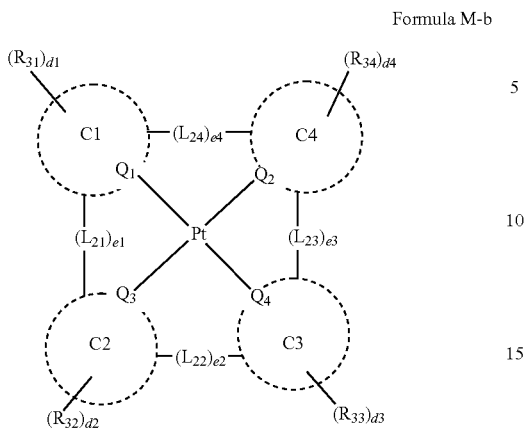

In Formula M-b, $Q_1$ to $Q_4$ are each independently C or N, and C1 to C4 are each independently a substituted or unsubstituted hydrocarbon ring having 5 to 30 ring-forming carbon atoms, or a substituted or unsubstituted heterocycle having 2 to 30 ring-forming carbon atoms. The variables $L_{21}$ to $L_{24}$ are each independently a direct linkage,

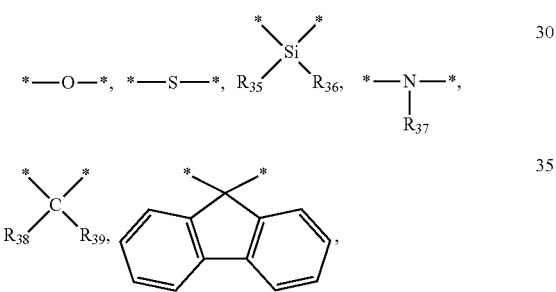

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and d1 to d4 are each independently an integer of 0 to 4. The compound represented by Formula M-b may be used as a blue phosphorescence dopant or a green phosphorescence dopant.

The compound represented by Formula M-b may be represented by any one of the compounds below. However, the compounds below are examples, and the compound represented by Formula M-b is not limited to those represented by the compounds below.

M-b-1

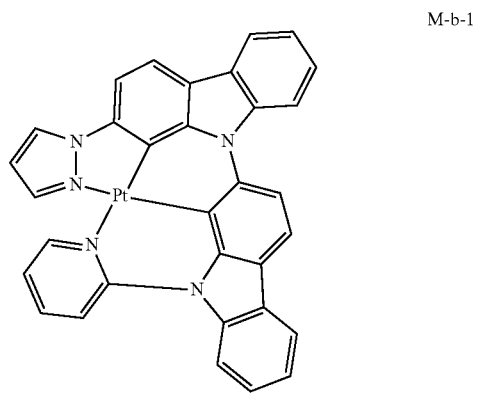

M-b-2

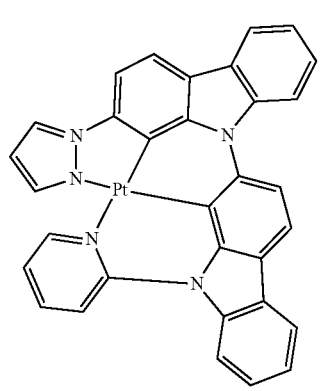

M-b-3

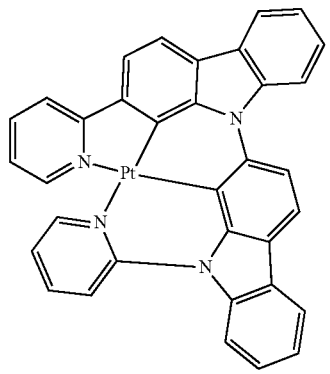

M-b-4

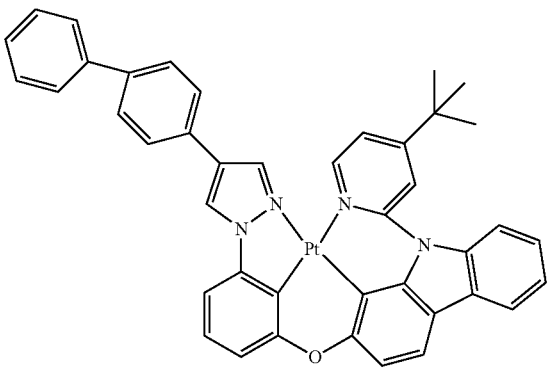

-continued

M-b-5

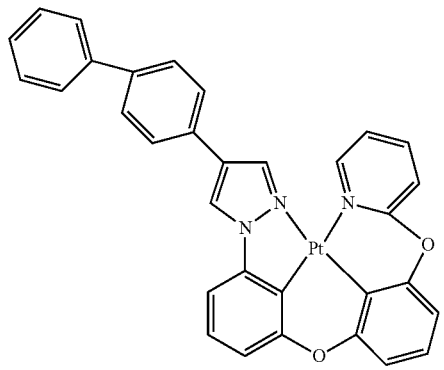

M-b-6

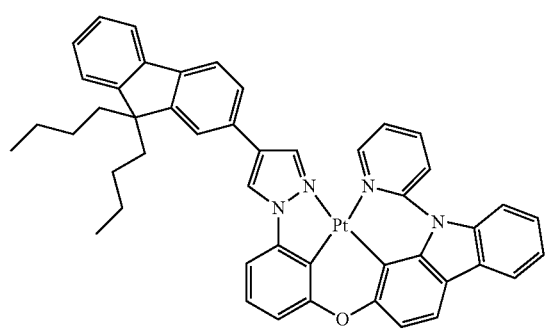

M-b-7

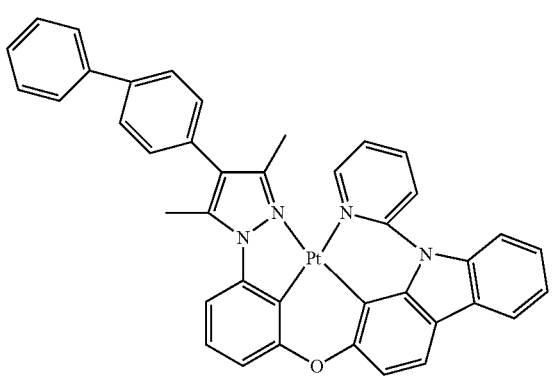

M-b-8

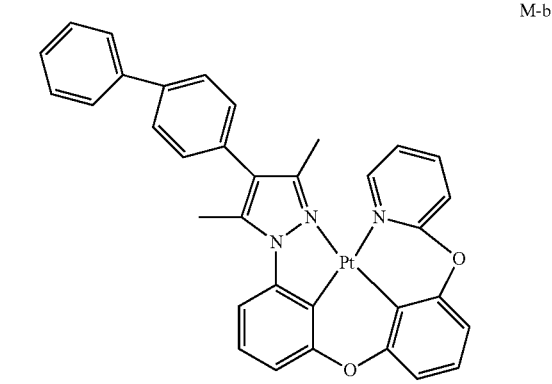

-continued

M-b-9

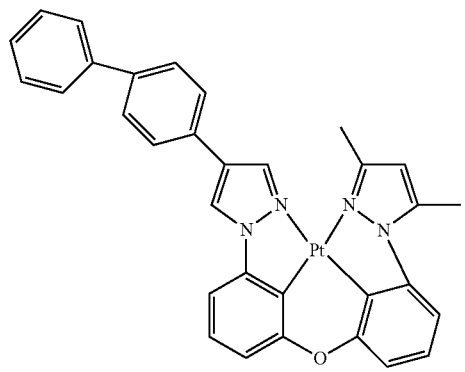

M-b-10

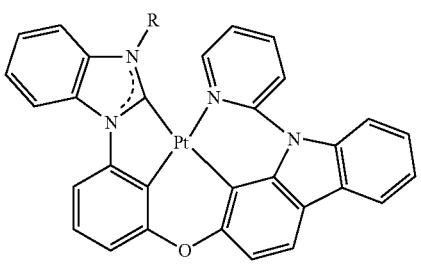

M-b-11

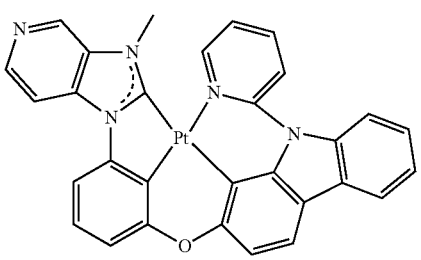

M-b-12

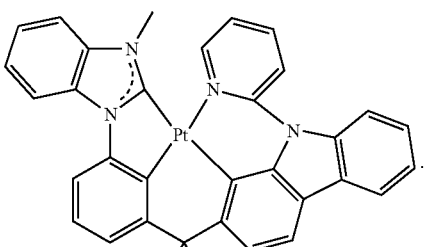

In the compounds, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formula F-a to Formula F-c below. The compound represented by Formula F-a or Formula F-c below may be used as a fluorescence dopant material.

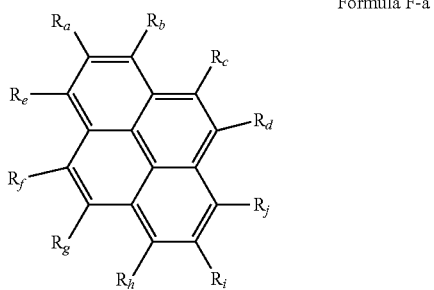

Formula F-a

In Formula F-a, two selected from of Ra to Rj may each independently be substituted with *—NAr$_1$Ar$_2$. The others, which are not substituted with *—NAr$_1$Ar$_2$, of Ra to Rj may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In —NAr$_1$Ar$_2$, Ar$_1$ and Ar$_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of Ar$_1$ or Ar$_2$ may be a heteroaryl group containing O or S as a ring-forming atom.

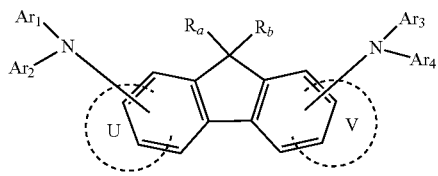

Formula F-b

In Formula F-b, R$_a$ and R$_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, it means that when the number of U or V is 1, one ring constitutes a condensed ring at a portion indicated by U or V, and when the number of U or V is 0, a ring indicated by U or V does not exist. Specifically, when the number of U is 0 and the number of V is 1, or when the number of U is 1 and the number of V is 0, the condensed ring having a fluorene core in Formula F-b may be a cyclic compound having four rings. In addition, when each number of U and V is 0, the condensed ring in Formula F-b may be a cyclic compound having three rings. In addition, when each number of U and V is 1, the condensed ring having a fluorene core in Formula F-b may be a cyclic compound having five rings.

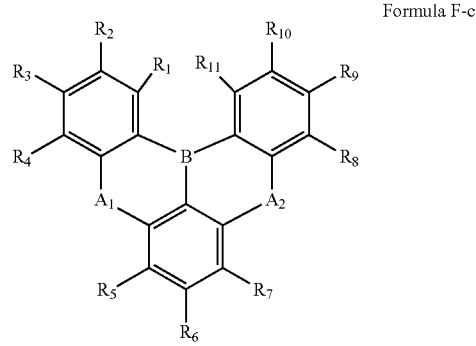

Formula F-c

In Formula F-c, A$_1$ and A$_2$ may be each independently O, S, Se, or NR$_m$, and R$_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. The variables R$_1$ to Ru are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

In Formula F-c, A$_1$ and A$_2$ may each independently be bonded to substituents of an adjacent ring to form a condensed ring. For example, when A$_1$ and A$_2$ are each independently NR$_m$, A$_1$ may be bonded to R$_4$ or R$_5$ to form a ring. In addition, A$_2$ may be bonded to R$_7$ or R$_5$ to form a ring.

In an embodiment, the emission layer EML may include, as a known dopant material, a styryl derivative (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino) styryl) naphthalen-2-yl)vinyl)phenyl)-N-phenylbenzenamine (N-BDAVBi), perylene and a derivative thereof (e.g., 2,5,8,11-tetra-t-butylperylene (TBP)), pyrene and a derivative thereof (e.g., 1-dipyrene, 1,4-dipyrenylbenzene, 1,4-bis(N,N-diphenylamino) pyrene), etc.

The emission layer EML may include a known phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. Specifically, iridium (III) bis(4,6-difluorophenylpyridinato-N,C2')picolinate (FIrpic), bis(2,4-difluorophenylpyridinato)-tetrakis(1-pyrazolyl)borate iridium (III) (Fir6), or platinum octaethyl porphyrin (PtOEP) may be used as a phosphorescence dopant. However, embodiments are not limited thereto.

In each light emitting element ED of embodiments illustrated in FIGS. 3 to 6, the electron transport region ETR is provided on the emission layer EML. The electron transport region ETR may include at least one of the hole blocking layer HBL, the electron transport layer ETL, or the electron injection layer EIL, but embodiments are not limited thereto. The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL are stacked in order from the emission layer EML, but embodiments are not limited thereto. The electron transport region ETR may have a thickness, for example, from about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

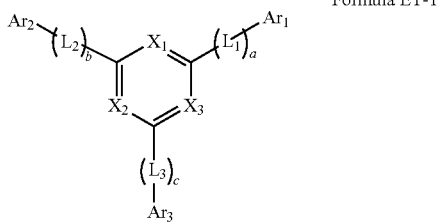

Formula ET-1

In Formula ET-1, at least one of $X_1$ to $X_3$ is N, and the rest are $CR_a$. The variable $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. The variables $Ar_1$ to $Ar_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. When a to c are an integer of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum (Alq$_3$), 1,3,5-tri[(3-pyridyl)-phen-3-yl]benzene, 2,4,6-tris (3'-(pyridin-3-yl) biphenyl-3-yl)-1,3,5-triazine, 2-(4-(N-phenylbenzoimidazol-1-yl)phenyl)-9,10-dinaphthylanthracene, 1,3,5-tri (1-phenyl-1H-benzo[d]imidazol-2-yl) benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq$_2$), 9,10-10 di(naphthalene-2-yl)anthracene (ADN), 1,3-Bis[3,5-di(pyridin-3-yl)phenyl]benzene (BmPyPhB), or a mixture thereof.

The electron transport region ETR may include at least one of Compound ET1 to Compound ET36 below:

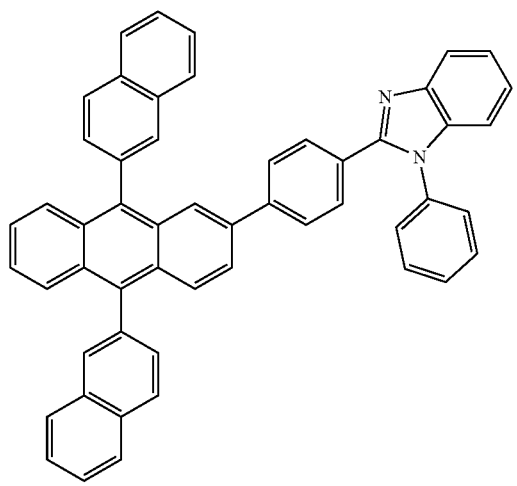

ET1

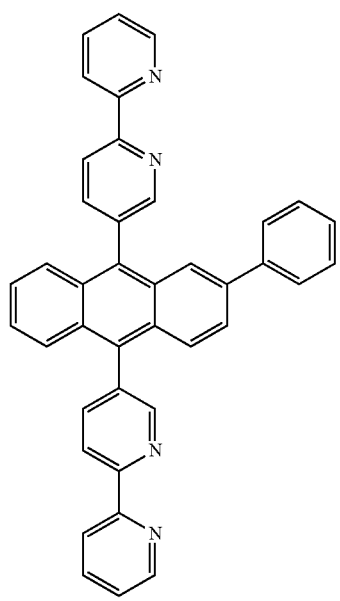

ET2

ET3
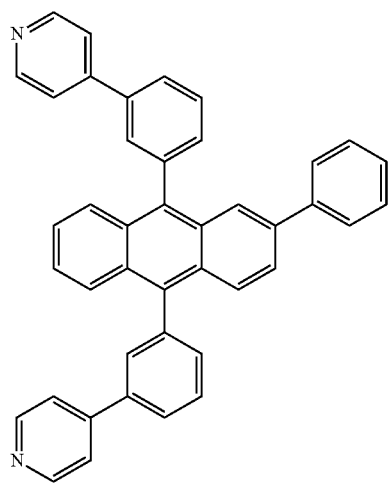
ET4
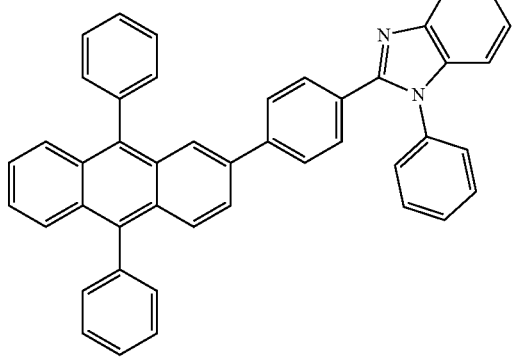
ET5
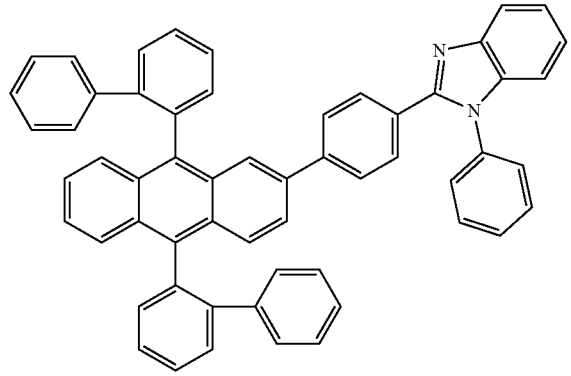
ET6
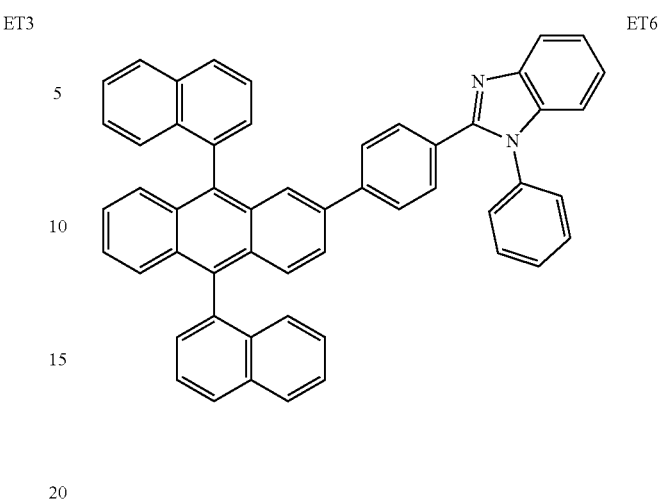
ET7
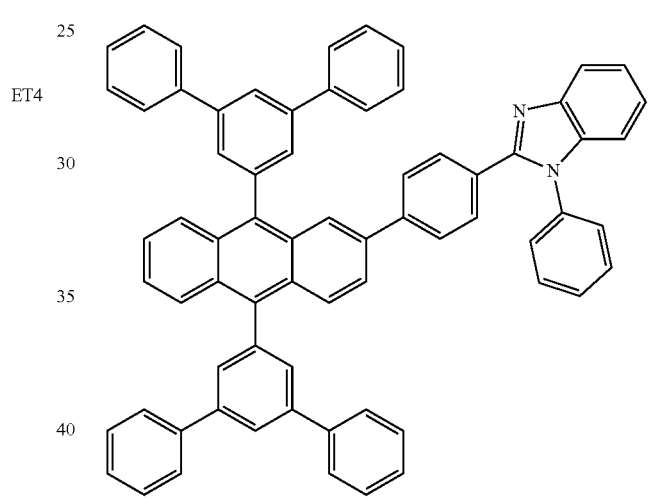
ET8
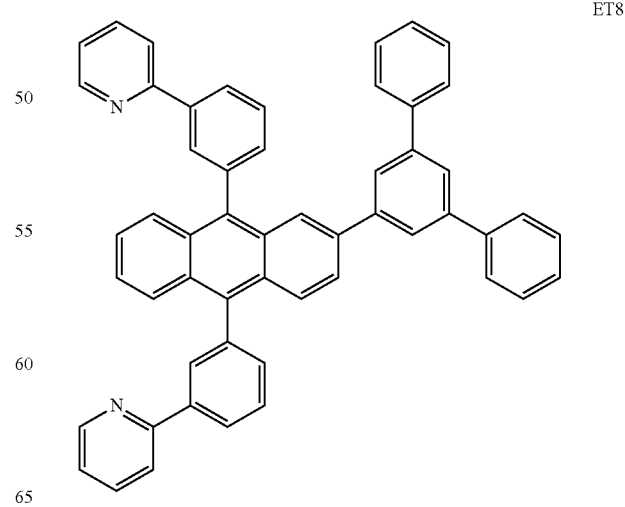

ET9
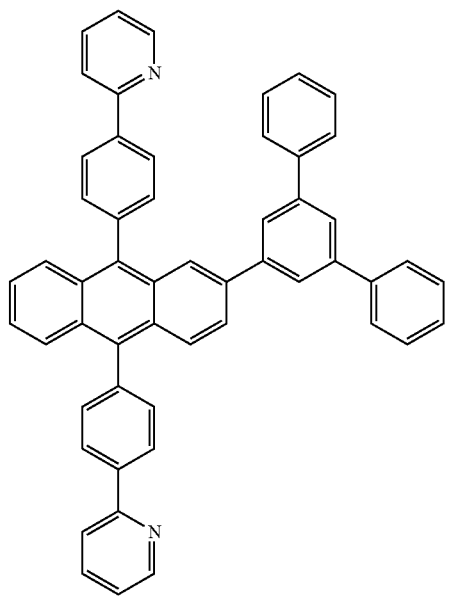
ET11
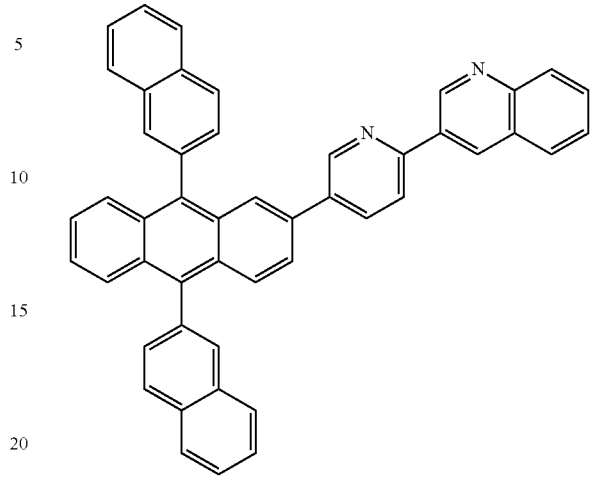
ET12
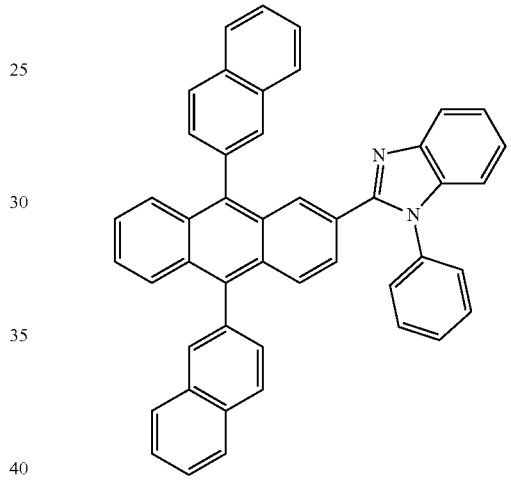
ET10
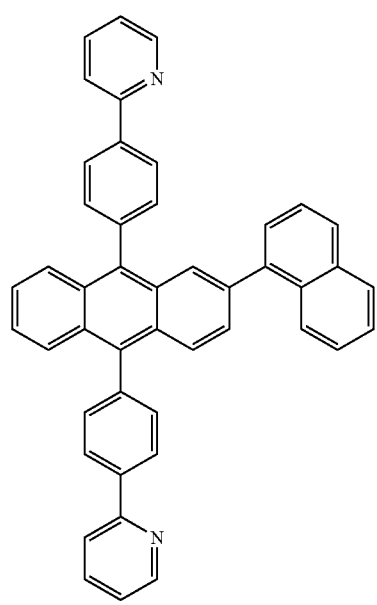
ET13
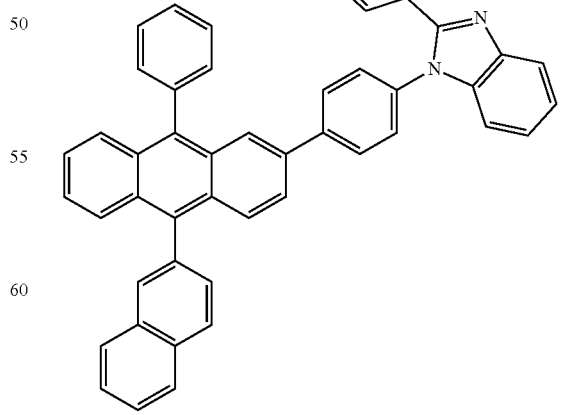

ET14
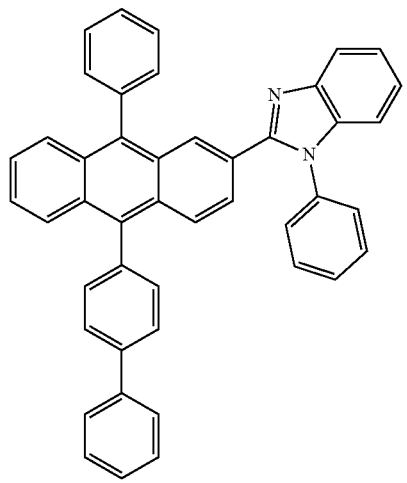
ET15
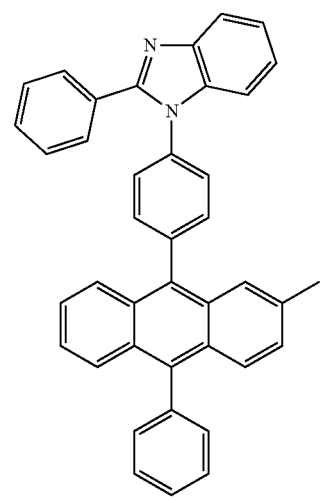
ET16
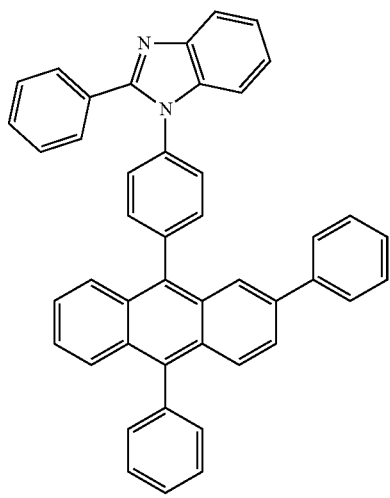
ET17
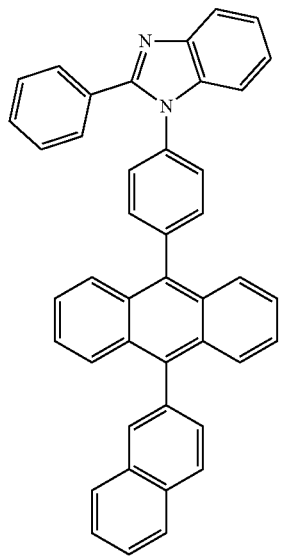
ET18
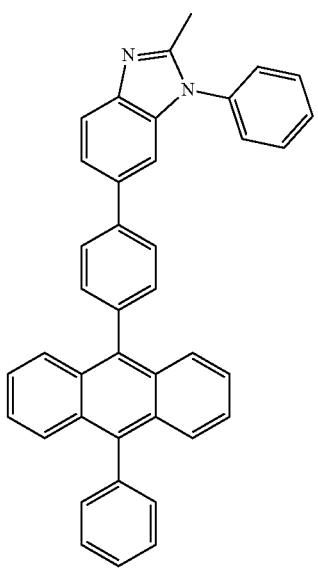
ET19
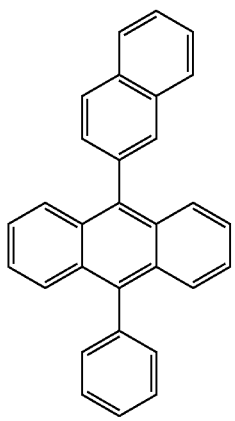

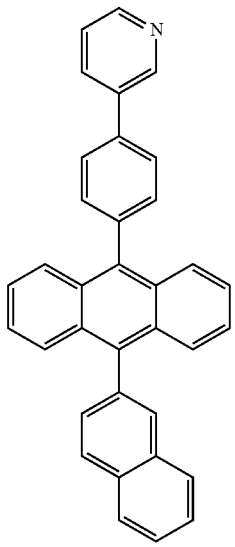
ET20
ET21
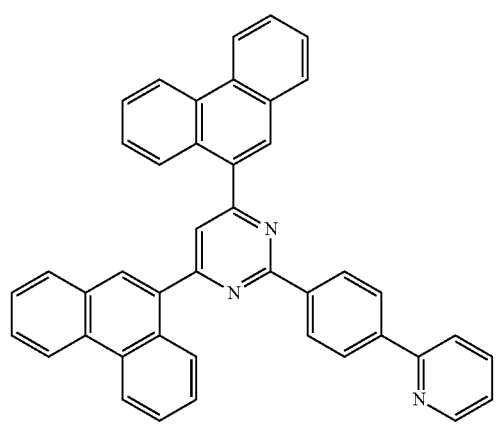
ET22
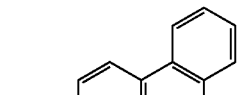
ET23
ET24
ET25

ET26
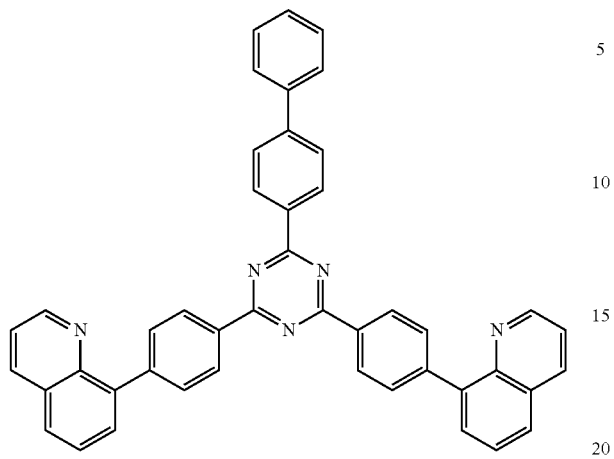
ET29
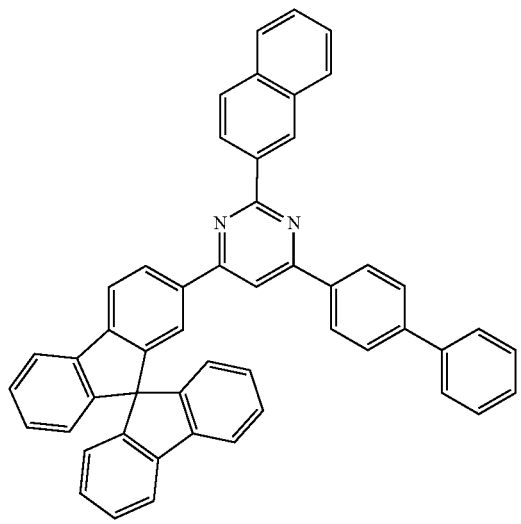
ET27
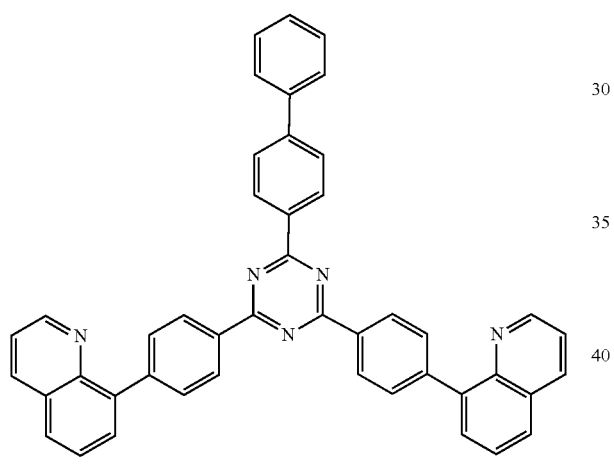
ET30
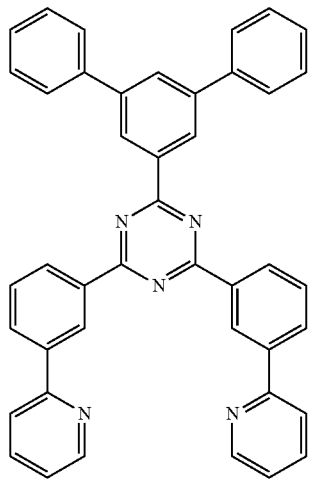
ET28
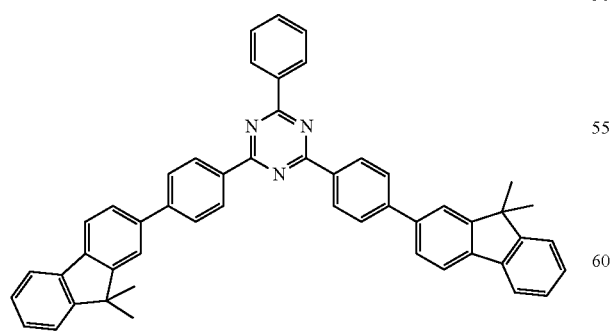
ET31
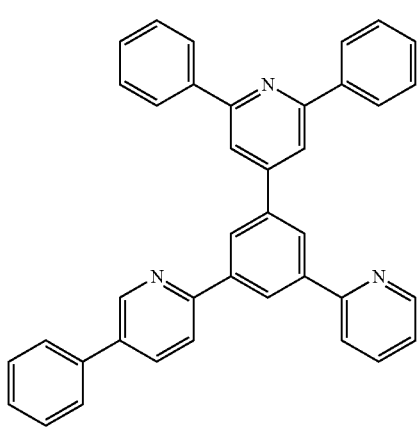

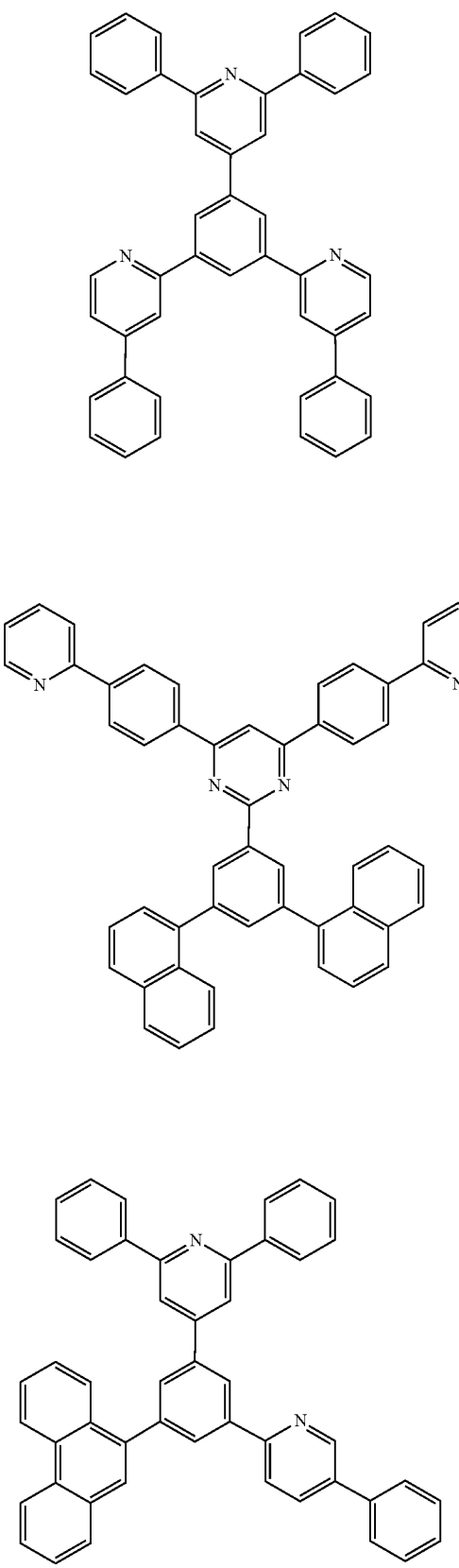

ET32

ET33

ET34

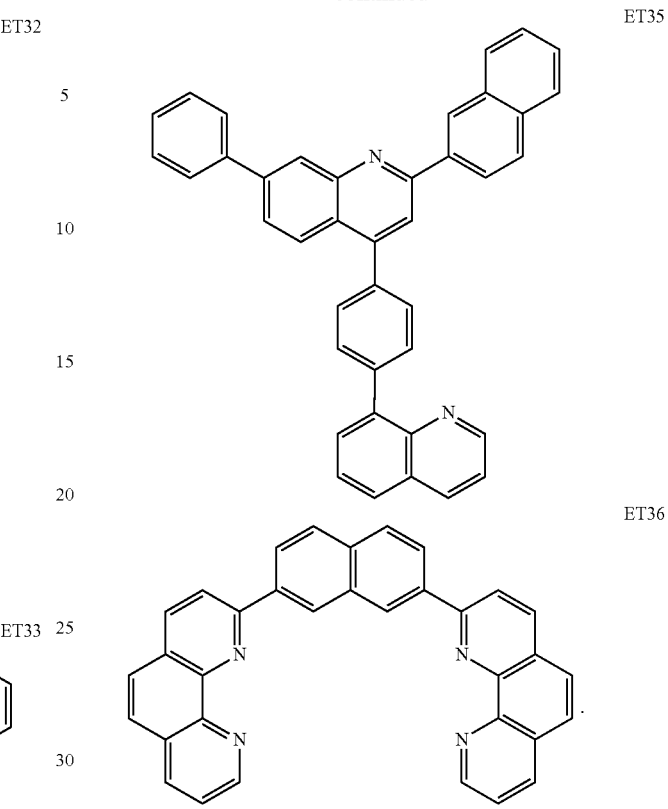

ET35

ET36

In addition, the electron transport regions ETR may include a metal halide such as LiF, NaCl, CsF, RbCl, RbI, CuI, or KI, a lanthanide metal such as Yb, and a co-deposited material of the metal halide and the lanthanide metal. For example, the electron transport region ETR may include KI:Yb, RbI:Yb, etc. as a co-deposited material. The electron transport region ETR may be formed using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap of about 4 electron volt (eV) or more. Specifically, the organometallic salt may include, for example, metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the above-described materials, but embodiments are not limited thereto. The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the aforementioned range, satisfactory electron transport characteristics may be obtained without a substantial increase in a driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described range, satisfactory electron injection characteristics may be obtained without a substantial increase in a driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be formed of a transparent metal oxide, for example, an indium tin oxide (ITO), an indium zinc oxide (IZO), a zinc oxide (ZnO), an indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (e.g., AgMg, AgYb, or MgAg). Alternatively, the second electrode EL2 may have a multilayer structure including a reflective film or a transflective film formed of the above-described materials, and a transparent conductive film formed of an ITO, an IZO, a ZnO, an ITZO, etc. For example, the second electrode EL2 may include the above-described metal materials, combinations of at least two metal materials of the above-described metal materials, oxides of the above-described metal materials, or the like.

The second electrode EL2 may be connected with an auxiliary electrode. If the second electrode EL2 is connected with the auxiliary electrode, the resistance of the second electrode EL2 may decrease. A capping layer CPL may further be disposed on the second electrode EL2 of the light emitting element ED. The capping layer CPL may include a multilayer or a single layer.

In an embodiment, the capping layer CPL may be an organic layer or an inorganic layer. For example, when the capping layer CPL contains an inorganic material, the inorganic material may include an alkaline metal compound (for example, LiF), an alkaline earth metal compound (for example, $MgF_2$), SiON, $SiN_x$, $SiO_y$, etc.

For example, when the capping layer CPL contains an organic material, the organic material may include 2,2'-Dimethyl-N,N'-di-[(1-naphthyl)-N,N'-diphenyl]-1,1'-biphenyl-4,4'-diamine (α-NPD), NPB, TPD, m-MTDATA, $Alq_3$, Copper (II) phthalocyanine (CuPc), N4,N4,N4',N4'-tetra(biphenyl-4-yl) biphenyl-4,4'-diamine (TPD15), 4,4',4"-tris (carbazol sol-9-yl)triphenylamine (TCTA), etc., or may include an epoxy resin, or an acrylate such as a methacrylate. However, embodiments are not limited thereto, and the organic material may also include Compounds P1 to P5 below.

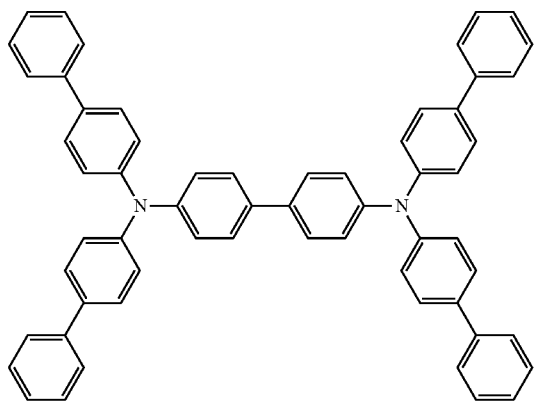

P1

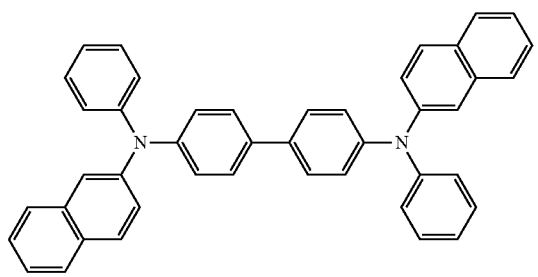

P2

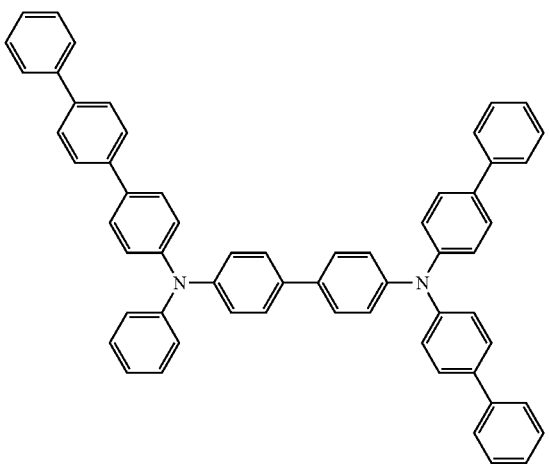

P3

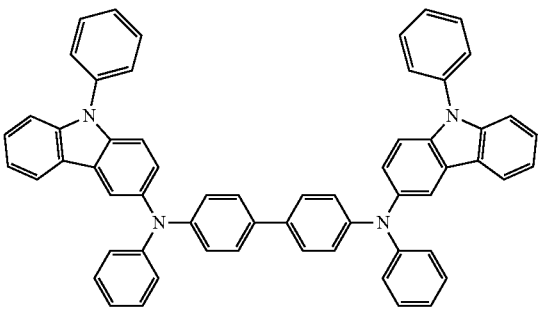

P4

P5

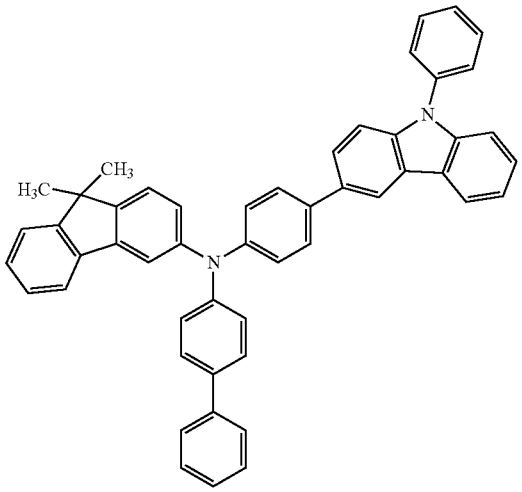

The refractive index of the capping layer CPL may be about 1.6 or more. Specifically, the refractive index of the capping layer CPL may be about 1.6 or more with respect to light in a wavelength range of about 550 nm to about 660 nm.

Figure 7:
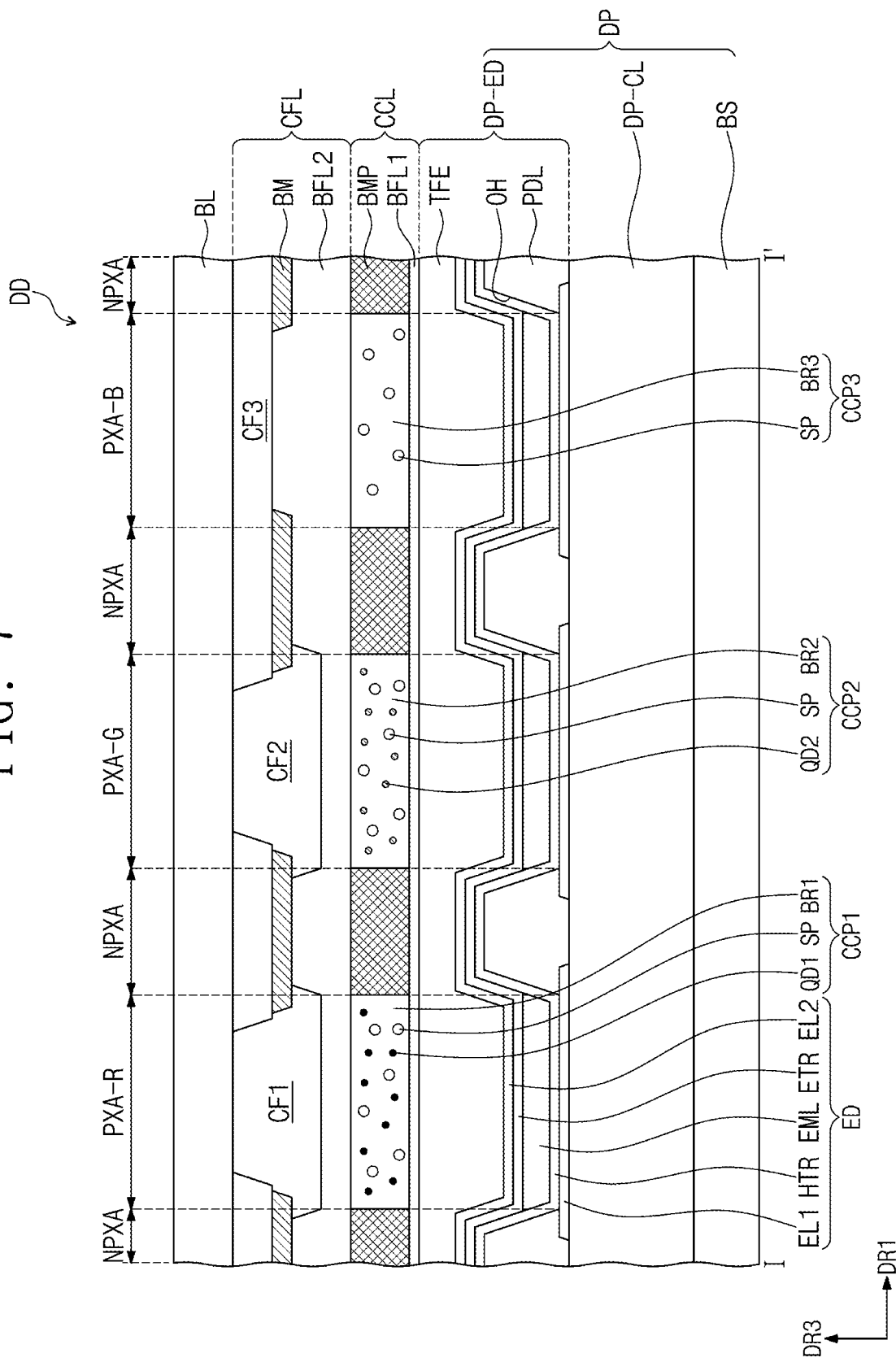
FIG. 7 is a cross-sectional view of another embodiment of a display apparatus including a light emitting device constructed according to the principles of the invention.
Figure 8:
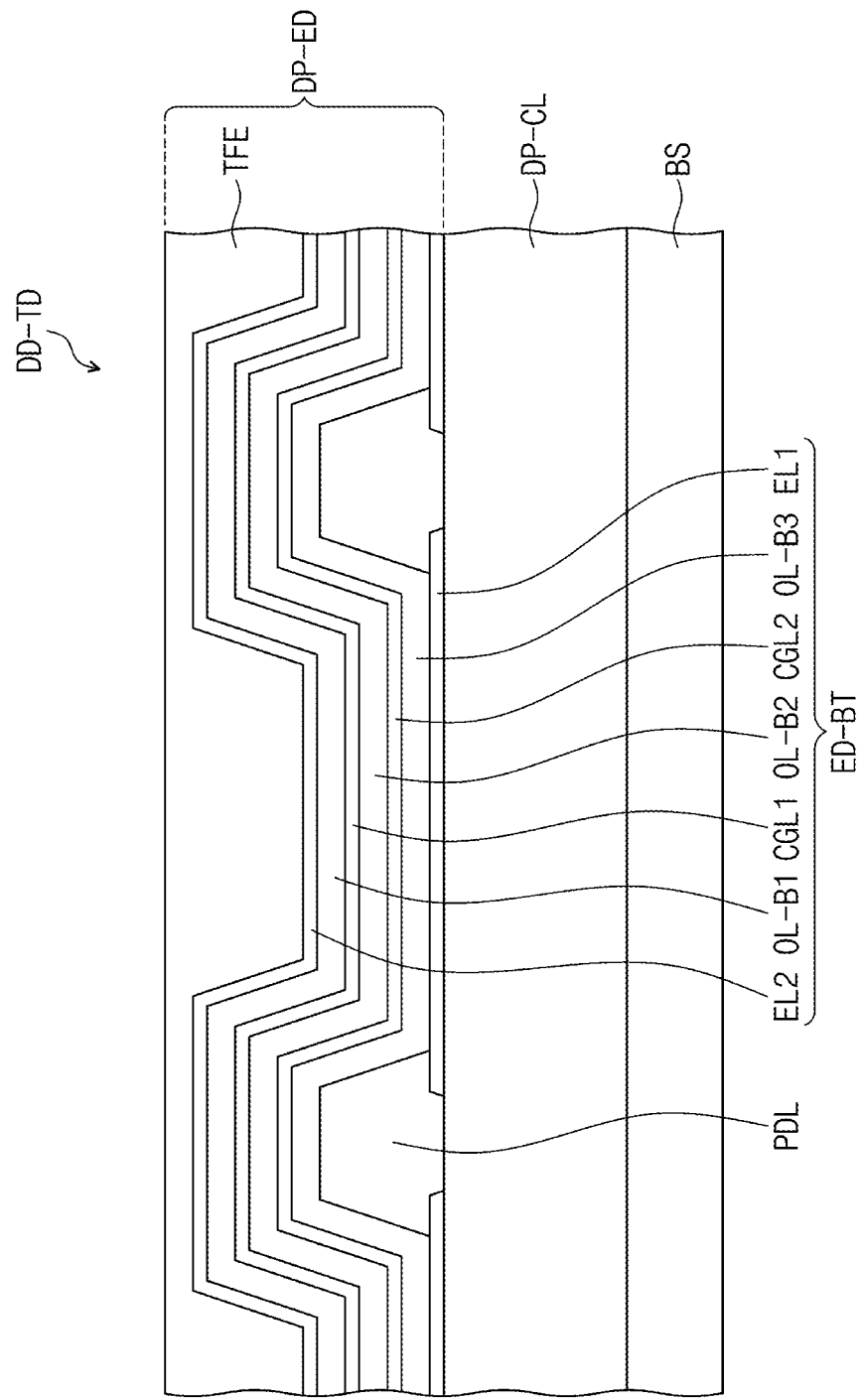
FIG. 8 is a cross-sectional view of a further embodiment of a display apparatus including a light emitting device constructed according to the principles of the invention.

FIG. 7 is a cross-sectional view of another embodiment of a display apparatus including a light emitting device constructed according to the principles of the invention. FIG. 8 is a cross-sectional view of a further embodiment of a display apparatus including a light emitting device constructed according to the principles of the invention.

Hereinafter, in describing the display apparatuses of embodiments with reference to FIGS. 7 and 8, the features which have already been described in FIGS. 1 to 6 are not described again, but their differences will mainly be described to avoid redundancy.

Referring to FIG. 7, the display apparatus DD may include a display panel DP including a display device layer DP-ED, a light control layer CCL disposed on the display panel DP, and a color filter layer CFL.

In the embodiment illustrated in FIG. 7, the display panel DP may include a base layer BS, a circuit layer DP-CL provided on the base layer BS, and the display device layer DP-ED, and the display device layer DP-ED may include an organic electroluminescence device ED. The light emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The structures of the light emitting elements of FIGS. 3 to 6 as described above may be equally applied to the structure of the light emitting element ED shown in FIG. 7.

Referring to FIG. 7, the emission layer EML may be disposed in an opening OH defined in a pixel defining film PDL. For example, the emission layer EML which is divided by the pixel defining film PDL and overlaps each light emitting regions PXA-R, PXA-G, and PXA-B may emit light in the same wavelength range. In the display apparatus DD, the emission layer EML may emit blue light. Unlike what is shown in FIG. 7, in another embodiment, the emission layer EML may be provided as a common layer in the entire light emitting regions PXA-R, PXA-G, and PXA-B.

The light control layer CCL may be disposed on the display panel DP. The light control layer CCL may include a light conversion body. The light conversion body may be a quantum dot, a phosphor, or the like. The light conversion body may emit light by converting the wavelength thereof. That is, the light control layer CCL may a layer containing the quantum dot or a layer containing the phosphor.

The core of the quantum dot may be selected from a compound of Groups II-VI, a compound of Groups III-VI, a compound of Groups I, III, and VI, a compound of Groups III-V, a compound of Groups III, II, and V, a compound of Groups IV-VI, an element of Group IV, a compound of Group IV, or a combination thereof.

The compound of Groups II-VI may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The compound of Groups III-VI may include a binary compound such as $In_2S_3$ and $In_2Se_3$, a ternary compound such as $InGaS_3$ and $InGaSe_3$, or any combination thereof. The compound of Groups I, III, and VI may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The compound of Groups III-V may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAS, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The compound of Groups III-V may further include a metal of Group II. For example, InZnP, etc. may be selected as a compound of Groups III, II, and V.

The compound of Groups IV-VI may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The element of Group IV may be selected from the group consisting of Si, Ge, and a mixture thereof. The compound of Group IV may be a binary compound selected from the group consisting of SiC, SiGe, and a mixture thereof.

In this case, a binary compound, a ternary compound, or a quaternary compound may be present in particles in a uniform concentration distribution, or may be present in the same particle in a partially different concentration distribution. In addition, a core/shell structure in which one quantum dot surrounds another quantum dot may also be possible.

The core/shell structure may have a concentration gradient in which the concentration of elements present in the shell decreases toward the core.

In some embodiments, a quantum dot may have the above-described core-shell structure including a core containing nanocrystals and a shell surrounding the core. The shell of the quantum dot may serve as a protection layer to prevent the chemical deformation of the core so as to maintain semiconductor properties, and/or a charging layer to impart electrophoresis properties to the quantum dot. The shell may be a single layer or a multilayer. An example of the shell of the quantum dot may include a metal or non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$, but embodiments are not limited thereto. Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of a light emission wavelength spectrum of about 45 nm or less, preferably about 40 nm or less, and more preferably about 30 nm or less, and color purity or color reproducibility may be improved in the above range. In addition, light emitted through such a quantum dot is emitted in all directions, and thus a wide viewing angle may be improved.

In addition, although the form of the quantum dot is not particularly limited as long as it is a form commonly used in the art, more specifically, the quantum dot in the form of at least one of a generally spherical, a generally pyramidal, a generally multi-armed, or a generally cubic nanoparticle, or a generally nanotube-shaped, a generally nanowire-shaped, a generally nanofiber-shaped, a generally nanoplate-shaped particle, etc. may be used.

The quantum dot may control the color of emitted light according to the particle size thereof, and accordingly, the quantum dot may have various emission colors such as blue, red, and green.

The light control layer CCL may include a plurality of light control parts CCP1, CCP2 and CCP3. The light control parts CCP1, CCP2, and CCP3 may be spaced apart from one another.

Referring to FIG. 7, divided patterns BMP may be disposed between the light control parts CCP1, CCP2 and CCP3 which are spaced apart from each other, but embodiments are not limited thereto. FIG. 7 illustrates that the divided patterns BMP do not overlap the light control parts CCP1, CCP2 and CCP3, but at least a portion of the edges of the light control parts CCP1, CCP2 and CCP3 may overlap the divided patterns BMP.

The light control layer CCL may include a first light control part CCP1 including a first quantum dot QD1 which converts first color light provided from the light emitting element ED into second color light, a second light control part CCP2 including a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting element ED. For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include any quantum dot but include the scatterer SP.

The scatterer SP may be inorganic particles. For example, the scatterer SP may include at least one of a $TiO_2$, $ZnO$, $Al_2O_3$, $SiO_2$, or hollow silica. The scatterer SP may include any one of the $TiO_2$, $ZnO$, $Al_2O_3$, $SiO_2$, or hollow silica, or may be a mixture of at least two materials selected from of the $TiO_2$, $ZnO$, $Al_2O_3$, $SiO_2$, and hollow silica.

The first light control part CCP1, the second light control part CCP2, and the third light control part CCP3 each may include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent the penetration of moisture and/or oxygen (hereinafter, referred to as 'moisture/oxygen'). The barrier layer BFL1 may be disposed on the light control parts CCP1, CCP2, and CCP3 to block the light control parts CCP1, CCP2 and CCP3 from being exposed to moisture/oxygen. The barrier layer BFL1 may cover the light control parts CCP1, CCP2, and CCP3. In addition, the barrier layer BFL2 may be provided between the light control parts CCP1, CCP2, and CCP3 and the color filter layer CFL.

The barrier layers BFL1 and BFL2 may include at least one inorganic layer. That is, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may further include an organic film. The barrier layers BFL1 and BFL2 may be formed of a single layer or a plurality of layers.

In the display apparatus DD, the color filter layer CFL may be disposed on the light control layer CCL. For example, the color filter layer CFL may be directly disposed on the light control layer CCL. In this case, the barrier layer BFL2 may be omitted.

The color filter layer CFL may include a light shielding part BM and color filters CF-1, CF-2, and CF-3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment or a dye. The first filter CF1 may include a red pigment or dye, the second filter CF2 may include a green pigment or a dye, and the third filter CF3 may include a blue pigment or a dye. Embodiments are not limited thereto, and the third filter CF3 may not include a pigment or dye. The third filter CF3 may include a polymeric photosensitive resin and may not include a pigment or a dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated but be provided as one filter. The light shielding part BM may be a black matrix. The light shielding part BM may include an organic light shielding material or an inorganic light shielding material containing a black pigment or dye. The light shielding part BM may prevent light leakage, and may separate boundaries between the adjacent filters CF1, CF2, and CF3. In addition, in an embodiment, the light shielding part BM may be formed of a blue filter.

The first to third filters CF1, CF2, and CF3 may be disposed corresponding to the red light emitting region PXA-R, the green light emitting region PXA-G, and the blue light emitting region PXA-B, respectively. A base substrate BL may be disposed on the color filter layer CFL. The base substrate BL may be a member which provides a base surface in which the color filter layer CFL, the light control layer CCL, and the like are disposed. The base substrate BL may be a glass substrate, a metal substrate, a plastic substrate, etc. However, embodiments are not limited thereto, and the base substrate BL may be an inorganic layer, an organic layer, or a composite material layer. In addition, unlike shown, in an embodiment, the base substrate BL may be omitted.

Particularly, FIG. 8 illustrates a cross-sectional view of a part corresponding to the display panel DP of FIG. 7. In the display device DD-TD, the light emitting element ED-BT may include a plurality of light emitting structures OL-B1, OL-B2, and OL-B3. The light emitting element ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR disposed with the emission layer EML (FIG. 7) therebetween.

That is, the light emitting element ED-BT included in the display device DD-TD may be a light emitting element having a tandem structure and including a plurality of emission layers. In the embodiment illustrated in FIG. 8, all light beams respectively emitted from the light emitting structures OL-B1, OL-B2, and OL-B3 may be blue light. However, embodiments are not limited thereto, and the light beams respectively emitted from the light emitting structures OL-B1, OL-B2, and OL-B3 may have wavelength ranges different from each other. For example, the light emitting element ED-BT including the plurality of light emitting structures OL-B1, OL-B2, and OL-B3 which emit light beams having wavelength ranges different from each other may emit white light.

A charge generation layers CGL1 and CGL2 may be disposed between the neighboring light emitting structures OL-B1, OL-B2, and OL-B3. The charge generation layers CGL1 and CGL2 may include a p-type charge generation layer and/or an n-type charge generation layer.

Hereinafter, the embodiments of the invention will be described in more detail through specific Examples and Comparative Examples. Examples below are only illustrations for assisting the understanding embodiments of the invention, and the scope of the invention is not limited thereto.

SYNTHETIC EXAMPLES

An organometallic compound made according to the principles and embodiments of the invention may be synthesized, for example, as follows. However, synthetic methods of making embodiments of the organometallic compound are not limited thereto.

1. Synthesis of Compound 1

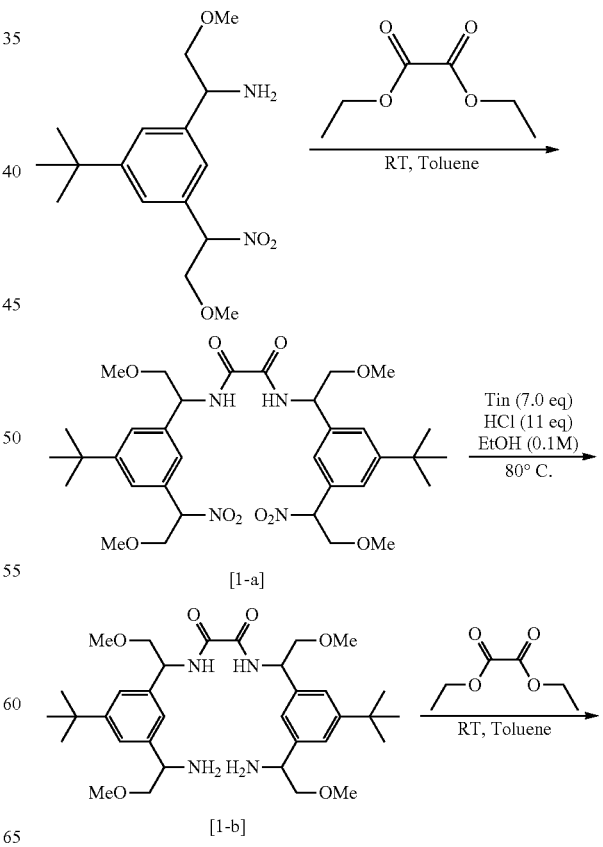

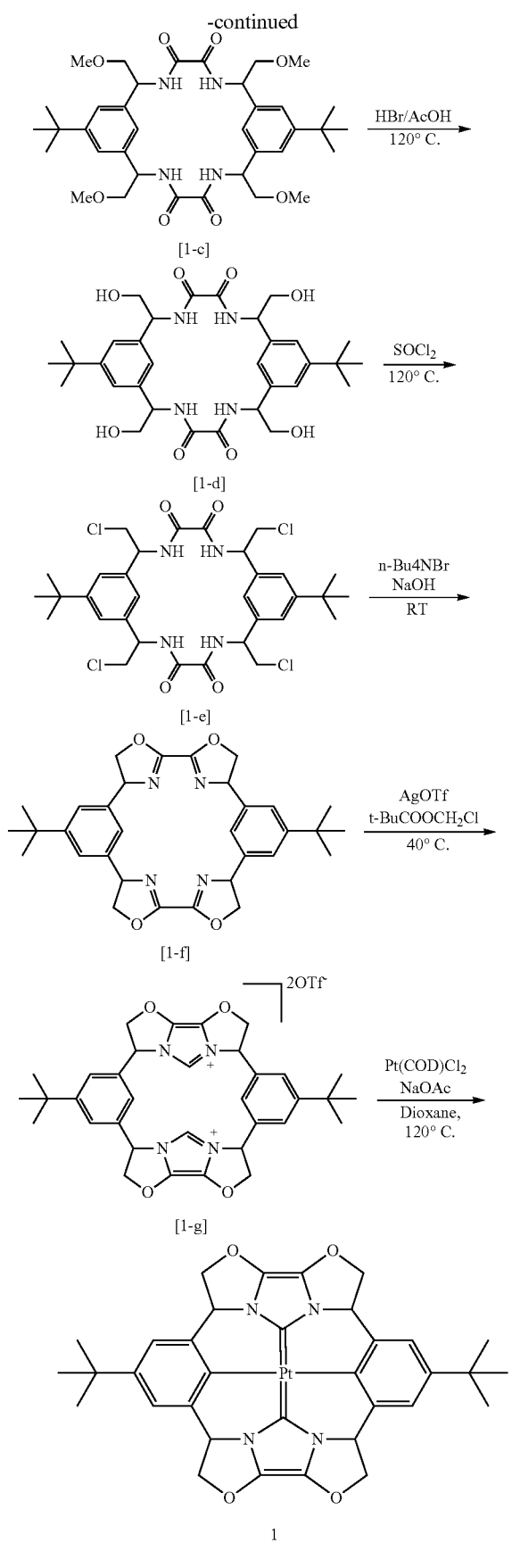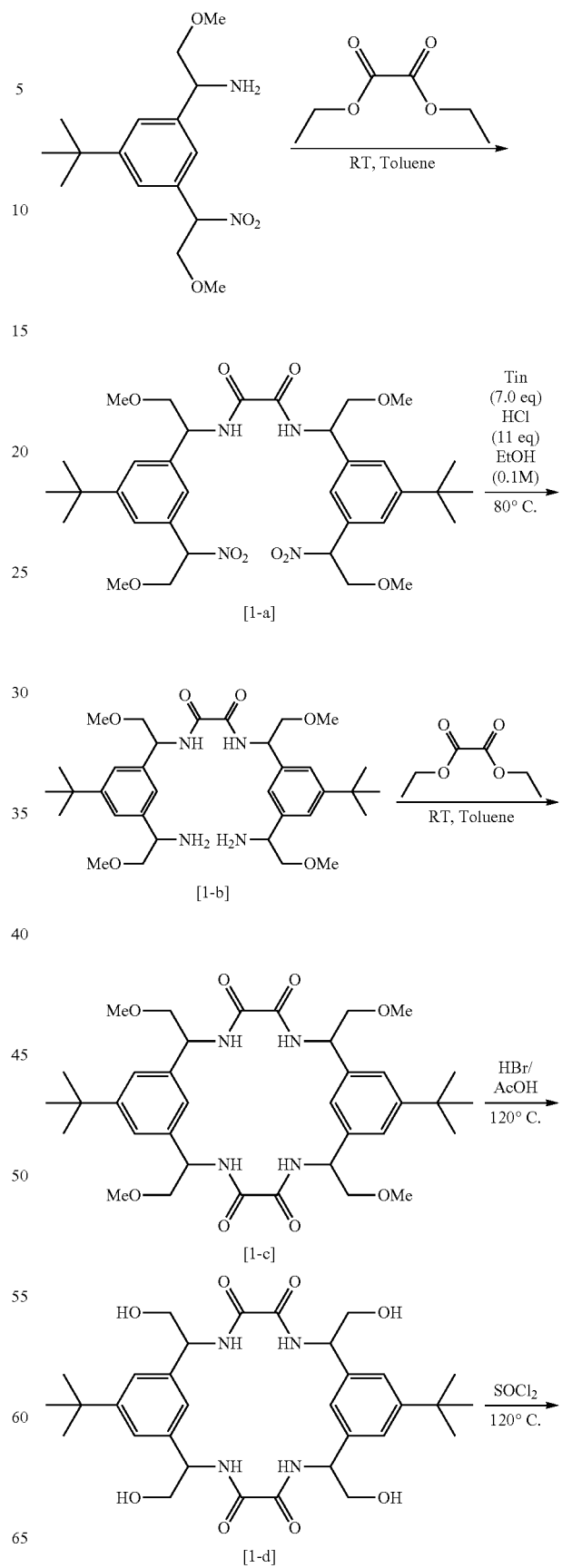

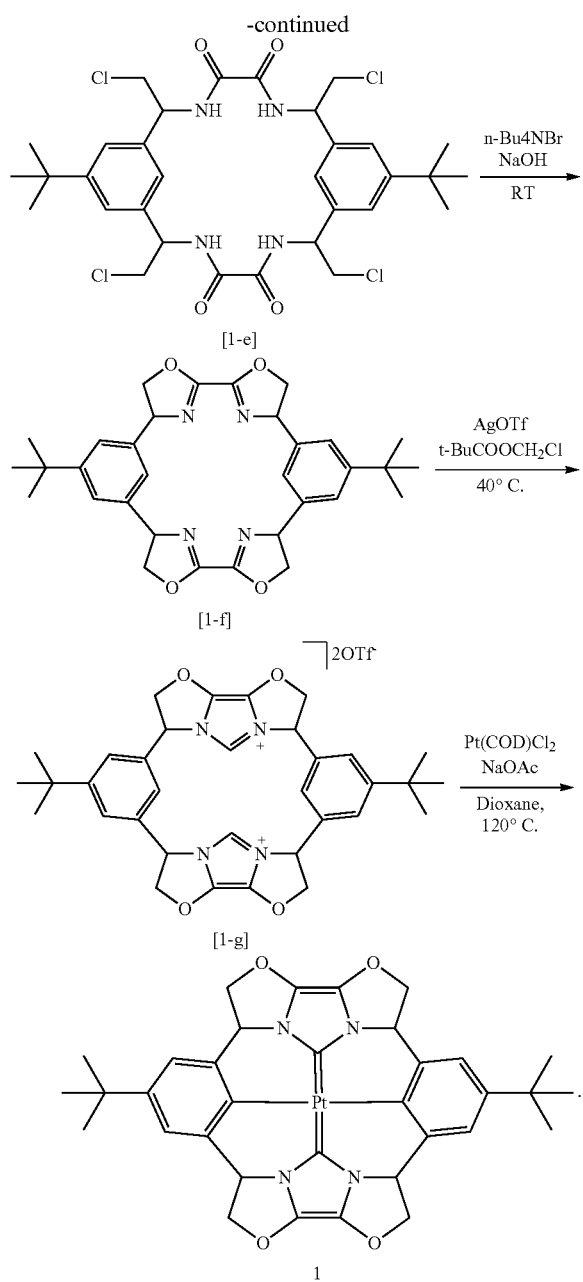

(1) Synthesis of Intermediate Compound [1-a]

While 1-(3-(tert-butyl)-5-(2-methoxy-1-nitroethyl)phenyl)-2-methoxyethan-1-amine (8.5 eq) was stirred in toluene (0.5 molar (M)) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [1-a] (yield: 76%).

(2) Synthesis of Intermediate Compound [1-b]

Intermediate Compound [1-a] (1.0 eq) and tin (Sn) in an amount of 7.0 eq were dissolved in anhydrous ethanol (0.1 M) and then heated to about 80° C. An amount of 37% HCl solution (11 eq) was added thereto and then refluxed for about 12 hours. The reaction mixture was cooled and then filtered to remove remaining Sn, and neutralized with sodium hydroxide (NaOH) at about 0° C. The resultant product was extracted three times using dichloromethane and water to obtain an organic layer. The obtained organic layer was dried over magnesium sulfate, and then concentrated to synthesize Intermediate Compound [1-b] (yield: 95%).

(3) Synthesis of Intermediate Compound [1-c]

While Intermediate Compound [1-b] (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [1-c] (yield: 71%).

(4) Synthesis of Intermediate Compound [1-d]

Intermediate Compound [1-c] (1.0 eq), hydrogen bromide (HBr), and acetic acid were stirred at about 120° C. and for about 16 hours. The reaction mixture was cooled to room temperature, and then neutralized with NaOH at about 0° C., and extracted three times using ethyl acetate and water to obtain an organic layer. The obtained organic layer was dried over magnesium sulfate to synthesize Intermediate Compound [1-d] (yield: 90%).

(5) Synthesis of Intermediate Compound [1-e]

Intermediate Compound [1-d] (1.0 eq) and thionyl chloride ($SOCl_2$) in an amount of 38 eq were stirred at about 80° C. for about 2 hours. Hydrogen bromide (HBr) and acetic acid were added thereto and stirred at about 120° C. for about 16 hours. Excess $SOCl_2$ was removed under reduced pressure, and the resultant solid compound was recrystallized with n-heptane to synthesize Intermediate Compound [1-e] (yield: 94%).

(6) Synthesis of Intermediate Compound [1-f]

Tetrabutylazanium;bromide (n-$Bu_4$NBr) in an amount of 1.0 eq was dissolved in dichloromethane (0.025 M), and then while being stirred, NaOH aqueous solution (2.5 eq) and Intermediate Compound [2-e] (1.0 eq) were added thereto. The reaction mixture was stirred at room temperature for about 12 hours. After the reaction was completed, the reaction was quenched with water, and the resultant product was extracted three times using dichloromethane and water to obtain an organic layer. The obtained organic layer was dried over magnesium sulfate, and then concentrated to synthesize Intermediate Compound [1-f] (yield: 45%).

(7) Synthesis of Intermediate Compound [1-g]

Intermediate Compound [1-f] (1.0 eq) was dissolved in dichloromethane, and then while being stirred at room temperature, silver;trifluoromethanesulfonate (AgOTf) in an amount of 1.2 eq and t-BuCOOCH$_2$Cl (1.2 eq) were added thereto. The reaction mixture was stirred under reflux for about 24 hours. The resultant solid compound was washed with dichloromethane and filtered to synthesize Intermediate Compound [1-g] (yield: 65%).

(8) Synthesis of Compound 1

Intermediate Compound [1-g] (1.0 eq), dichloro(1,5-cyclooctadiene) platinum (II) (1.2 eq), and sodium acetate (3.0 eq) were dissolved in anhydrous 1,4-dioxane, and then stirred at about 120° C. for about 4 days under a nitrogen atmosphere. The reaction mixture was cooled at room temperature, and then the resultant product was extracted three times using dichloromethane and water to obtain an organic layer. The obtained organic layer was dried over magnesium sulfate, and then concentrated to synthesize Compound 1 (yield 27%) by using column chromatography.

2. Synthesis of Compound 2

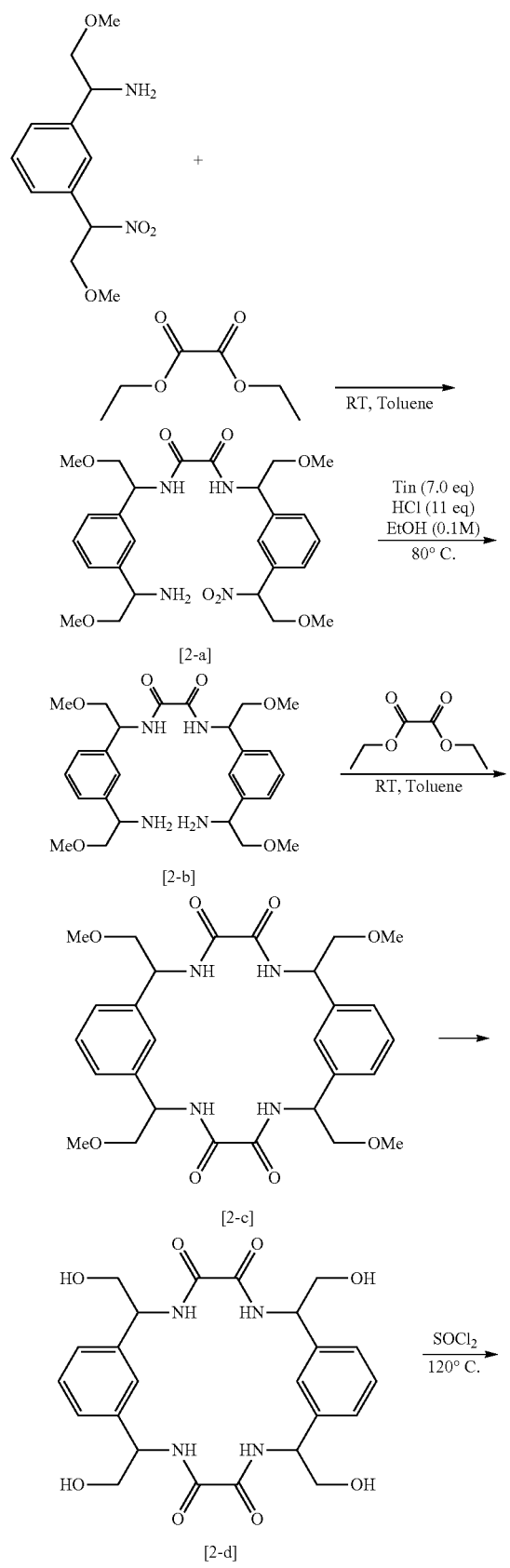

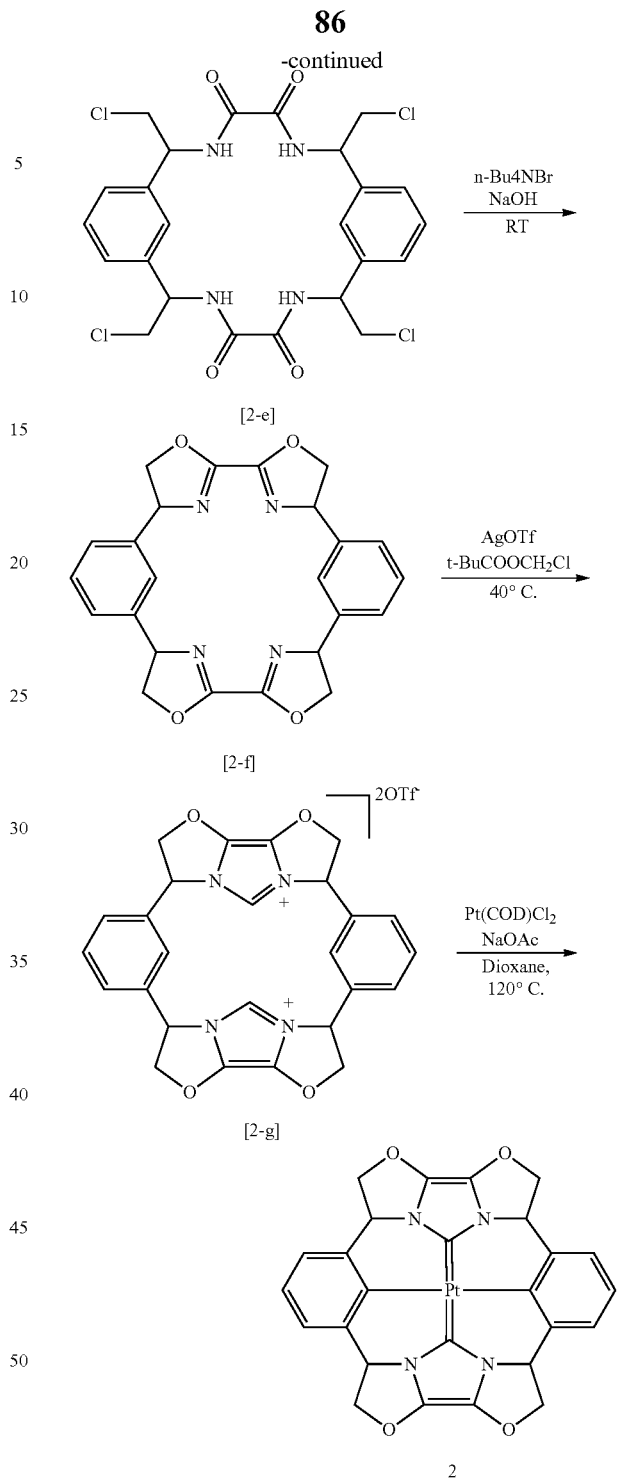

(1) Synthesis of Intermediate Compound [2-a]

While 2-methoxy-1-(3-(2-methoxy-1-nitroethyl)phenyl)ethan-1-amine (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [1-a] (yield: 73%).

(2) Synthesis of Intermediate Compound [2-b]

Intermediate Compound [2-a] (1.0 eq) and tin (7.0 eq) were dissolved in anhydrous ethanol (0.1 M) and then heated to about 80° C. In an amount of 37% HCl solution (11 eq) was added thereto and then refluxed for about 12 hours. The reaction mixture was cooled and then filtered to remove remaining Sn, and neutralized with NaOH at about 0° C. The resultant product was extracted three times using dichloromethane and water to obtain an organic layer. The obtained organic layer was dried over magnesium sulfate, and then concentrated to synthesize Intermediate Compound [2-b] (yield: 92%).

(3) Synthesis of Intermediate Compound [2-c]

While Intermediate Compound (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [2-c] (yield: 71%).

(4) Synthesis of Intermediate Compound [2-d]

Intermediate Compound [2-c] (1.0 eq), HBr, and acetic acid were stirred at about 120° C. and for about 16 hours. The reaction mixture was cooled to room temperature, and then neutralized with NaOH at about 0° C., and extracted three times using ethyl acetate and water to obtain an organic layer. The obtained organic layer was dried over magnesium sulfate to synthesize Intermediate Compound [2-d] (yield: 90%).

(5) Synthesis of Intermediate Compound [2-e]

Intermediate Compound [2-d] (1.0 eq) and $SOCl_2$ (38 eq) were stirred at about 80° C. for about 2 hours. The compounds HBr and acetic acid were added thereto and stirred at about 120° C. for about 16 hours. Excess $SOCl_2$ was removed under reduced pressure, and the resultant solid compound was recrystallized with n-heptane to synthesize Intermediate Compound [2-e] (yield: 94%).

(6) Synthesis of Intermediate Compound [2-f]

Tetrabutylazanium;bromide (n-$Bu_4$NBr) in an amount of 1.0 eq was dissolved in dichloromethane (0.025 M), and then while being stirred, NaOH aqueous solution (2.5 eq) and Intermediate Compound [2-e] (1.0 eq) were added thereto. The reaction mixture was stirred at room temperature for about 12 hours. After the reaction was completed, the reaction was quenched with water, and the resultant product was extracted three times using dichloromethane and water to obtain an organic layer. The obtained organic layer was dried over magnesium sulfate, and then concentrated to synthesize Intermediate Compound [2-f] (yield: 45%).

(7) Synthesis of Intermediate Compound [2-g]

Intermediate Compound [2-f] (1.0 eq) was dissolved in dichloromethane, and then while being stirred at room temperature, AgOTf (1.2 eq) and t-BuCOOCH$_2$Cl (1.2 eq) were added thereto. The reaction mixture was stirred under reflux for about 24 hours. The resultant solid compound was washed with dichloromethane and filtered to synthesize Intermediate Compound [2-g] (yield: 61%).

(8) Synthesis of Compound 2

Intermediate Compound [2-g] (1.0 eq), dichloro(1,5-cyclooctadiene) platinum (II) (1.2 eq), and sodium acetate (3.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 2 (yield 23%) by using column chromatography.

3. Synthesis of Compound 3

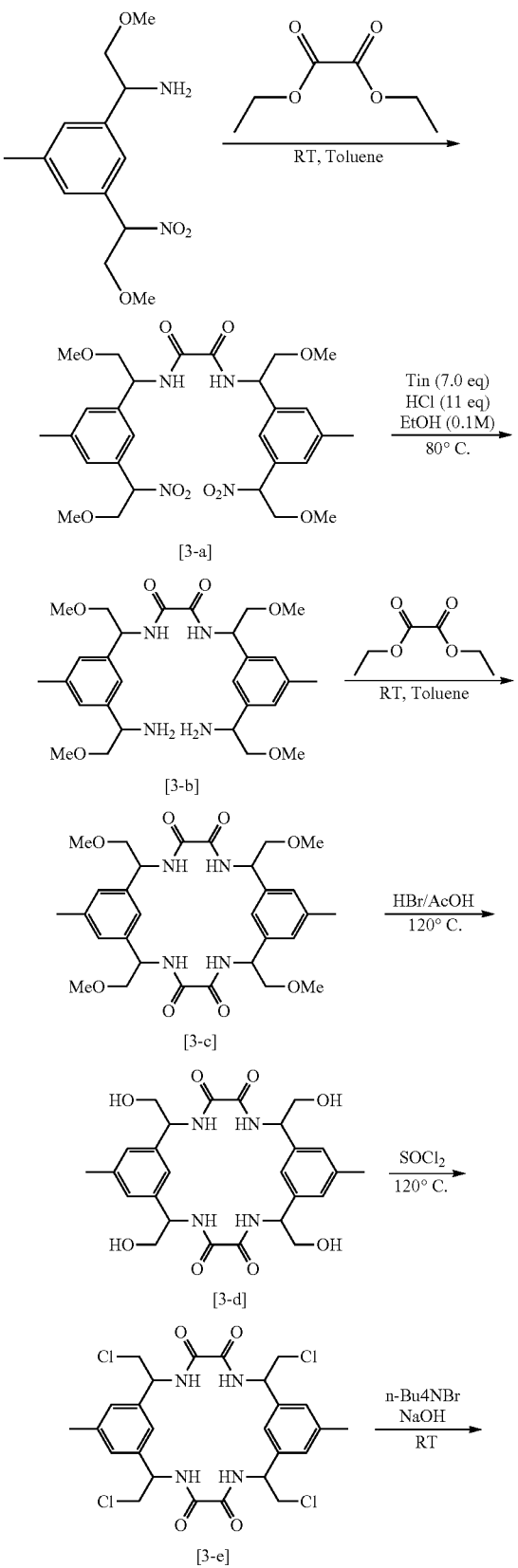

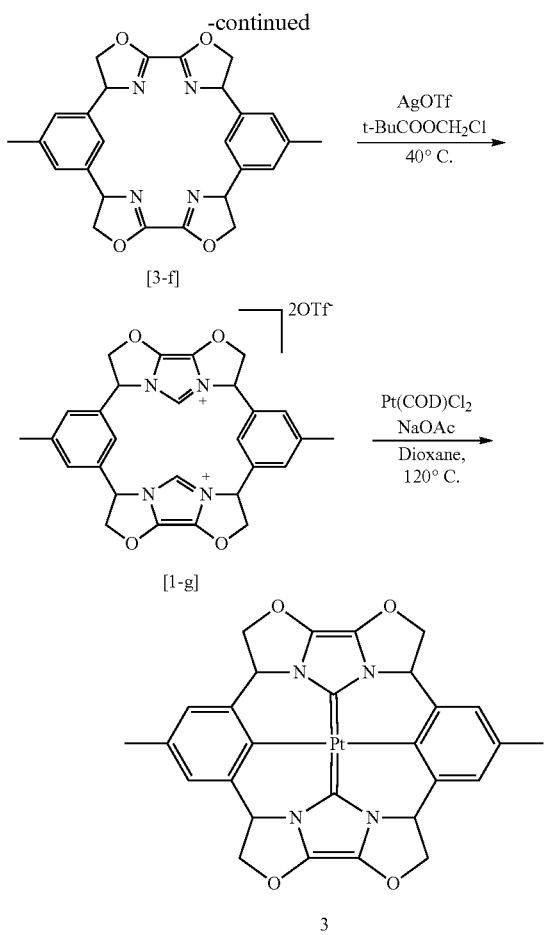

[3-f]

[1-g]

3

(1) Synthesis of Intermediate Compound [3-a]

While 2-methoxy-1-(3-(2-methoxy-1-nitroethyl)-5-methylphenyl)ethan-1-amine (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [3-a] (yield: 65%).

(2) Synthesis of Intermediate Compound [3-b]

Intermediate Compound [3-a] (1.0 eq) and tin (7.0 eq) were dissolved in anhydrous ethanol (0.1 M) and then heated to about 80° C. 37% HCl solution (11 eq) was added thereto and then refluxed for about 12 hours. The reaction mixture was cooled and then filtered to remove remaining Sn, and neutralized with NaOH at about 0° C. The resultant product was extracted three times using dichloromethane and water to obtain an organic layer. The obtained organic layer was dried over magnesium sulfate, and then concentrated to synthesize Intermediate Compound [3-b] (yield: 89%).

(3) Synthesis of Intermediate Compound [3-c]

While Intermediate Compound [3-b] (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [3-c] (yield: 75%).

(4) Synthesis of Intermediate Compound [3-d]

Intermediate Compound [3-c] (1.0 eq), HBr, and acetic acid were stirred at about 120° C. and for about 16 hours. The reaction mixture was cooled to room temperature, and then neutralized with NaOH at about 0° C., and extracted three times using ethyl acetate and water to obtain an organic layer. The obtained organic layer was dried over magnesium sulfate to synthesize Intermediate Compound [3-d] (yield: 86%).

(5) Synthesis of Intermediate Compound [3-e]

Intermediate Compound [3-d] (1.0 eq) and $SOCl_2$ (38 eq) were stirred at about 80° C. for about 2 hours. The compounds HBr and acetic acid were added thereto and stirred at about 120° C. for about 16 hours. Excess $SOCl_2$ was removed under reduced pressure, and the resultant solid compound was recrystallized with n-heptane to synthesize Intermediate Compound [3-e] (yield: 91%).

(6) Synthesis of Intermediate Compound [3-f]

The compound n-$Bu_4$NBr (1.0 eq) was dissolved in dichloromethane (0.025 M), and then while being stirred, NaOH aqueous solution (2.5 eq) and Intermediate Compound [2-e] (1.0 eq) were added thereto. The reaction mixture was stirred at room temperature for about 12 hours. After the reaction was completed, the reaction was quenched with water, and the resultant product was extracted three times using dichloromethane and water to obtain an organic layer. The obtained organic layer was dried over magnesium sulfate, and then concentrated to synthesize Intermediate Compound [3-f] (yield: 51%).

(7) Synthesis of Intermediate Compound [3-g]

Intermediate Compound [3-f] (1.0 eq) was dissolved in dichloromethane, and then while being stirred at room temperature, AgOTf (1.2 eq) and t-BuCOOCH$_2$Cl (1.2 eq) were added thereto. The reaction mixture was stirred under reflux for about 24 hours. The resultant solid compound was washed with dichloromethane and filtered to synthesize Intermediate Compound [3-g] (yield: 60%).

(8) Synthesis of Compound 3

Intermediate Compound [3-g] (1.0 eq), dichloro(1,5-cyclooctadiene) platinum (II) (1.2 eq), and sodium acetate (3.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 3 (yield 20%) by using column chromatography.

4. Synthesis of Compound 4

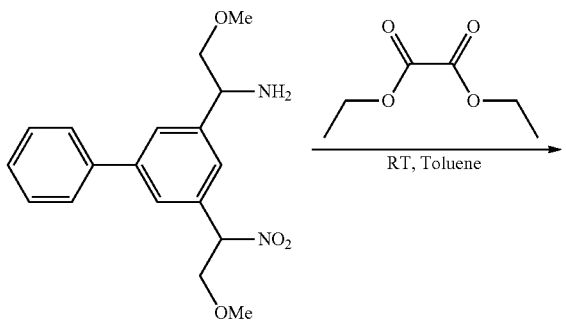

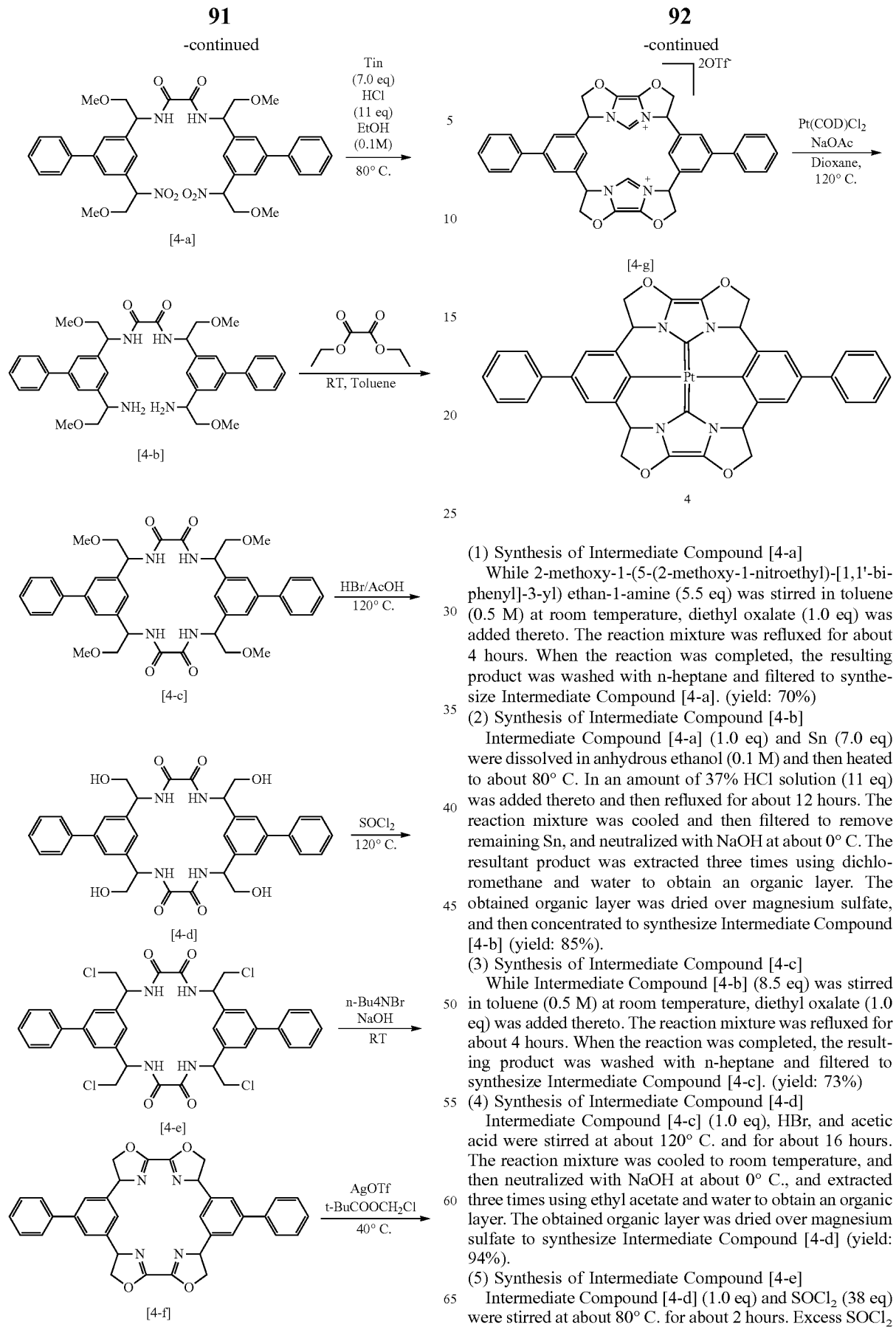

(1) Synthesis of Intermediate Compound [4-a]

While 2-methoxy-1-(5-(2-methoxy-1-nitroethyl)-[1,1'-biphenyl]-3-yl) ethan-1-amine (5.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [4-a]. (yield: 70%)

(2) Synthesis of Intermediate Compound [4-b]

Intermediate Compound [4-a] (1.0 eq) and Sn (7.0 eq) were dissolved in anhydrous ethanol (0.1 M) and then heated to about 80° C. In an amount of 37% HCl solution (11 eq) was added thereto and then refluxed for about 12 hours. The reaction mixture was cooled and then filtered to remove remaining Sn, and neutralized with NaOH at about 0° C. The resultant product was extracted three times using dichloromethane and water to obtain an organic layer. The obtained organic layer was dried over magnesium sulfate, and then concentrated to synthesize Intermediate Compound [4-b] (yield: 85%).

(3) Synthesis of Intermediate Compound [4-c]

While Intermediate Compound [4-b] (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [4-c]. (yield: 73%)

(4) Synthesis of Intermediate Compound [4-d]

Intermediate Compound [4-c] (1.0 eq), HBr, and acetic acid were stirred at about 120° C. and for about 16 hours. The reaction mixture was cooled to room temperature, and then neutralized with NaOH at about 0° C., and extracted three times using ethyl acetate and water to obtain an organic layer. The obtained organic layer was dried over magnesium sulfate to synthesize Intermediate Compound [4-d] (yield: 94%).

(5) Synthesis of Intermediate Compound [4-e]

Intermediate Compound [4-d] (1.0 eq) and $SOCl_2$ (38 eq) were stirred at about 80° C. for about 2 hours. Excess $SOCl_2$ was removed under reduced pressure, and the resultant solid compound was recrystallized with n-heptane to synthesize Intermediate Compound [4-e] (yield: 80%).

(6) Synthesis of Intermediate Compound [4-f]

The compound n-Bu₄NBr (1.0 eq) was dissolved in dichloromethane (0.025 M), and then while being stirred, NaOH aqueous solution (2.5 eq) and Intermediate Compound [4-e] (1.0 eq) were added thereto. The reaction mixture was stirred at room temperature for about 12 hours. After the reaction was completed, the reaction was quenched with water, and the resultant product was extracted three times using dichloromethane and water to obtain an organic layer. The obtained organic layer was dried over magnesium sulfate, and then concentrated to synthesize Intermediate Compound [4-f] (yield: 45%).

(7) Synthesis of Intermediate Compound [4-g]

Intermediate Compound [4-f] (1.0 eq) was dissolved in dichloromethane, and then while being stirred at room temperature, AgOTf (2.4 eq) and t-BuCOOCH₂Cl (2.5 eq) were added thereto. The reaction mixture was stirred under reflux for about 24 hours. The resultant solid compound was washed with dichloromethane and filtered to synthesize Intermediate Compound [4-g] (yield: 61%).

(8) Synthesis of Compound 4

Intermediate Compound [4-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 4 (yield 24%) by using 5 column chromatography.

5. Synthesis of Compound

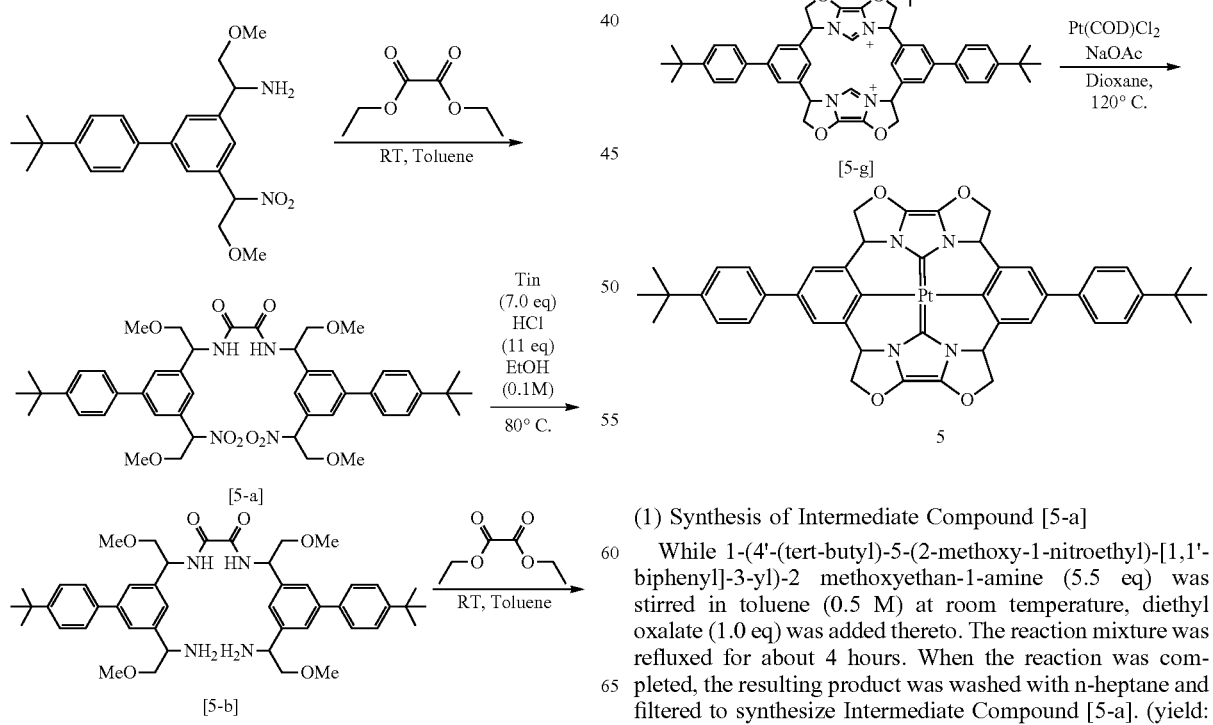

(1) Synthesis of Intermediate Compound [5-a]

While 1-(4'-(tert-butyl)-5-(2-methoxy-1-nitroethyl)-[1,1'-biphenyl]-3-yl)-2 methoxyethan-1-amine (5.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [5-a]. (yield: 74%)

(2) Synthesis of Intermediate Compound [5-b]

Intermediate Compound [5-a] (1.0 eq) and Sn (7.0 eq) were dissolved in anhydrous ethanol (0.1 M) and then heated to about 80° C. In an amount of 37% HCl solution (11 eq) was added thereto and then refluxed for about 12 hours. The reaction mixture was cooled and then filtered to remove remaining Sn, and neutralized with NaOH at about 0° C. The resultant product was extracted three times using dichloromethane and water to obtain an organic layer. The obtained organic layer was dried over magnesium sulfate, and then concentrated to synthesize Intermediate Compound [5-b] (yield: 79%).

(3) Synthesis of Intermediate Compound [5-c]

While Intermediate Compound [5-b] (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [5-c]. (yield: 78%)

(4) Synthesis of Intermediate Compound [5-d]

Intermediate Compound [5-c] (1.0 eq), HBr, and acetic acid were stirred at about 120° C. and for about 16 hours. The reaction mixture was cooled to room temperature, and then neutralized with NaOH at about 0° C., and extracted three times using ethyl acetate and water to obtain an organic layer. The obtained organic layer was dried over magnesium sulfate to synthesize Intermediate Compound [5-d] (yield: 85%).

(5) Synthesis of Intermediate Compound [5-e]

Intermediate Compound [5-d] (1.0 eq) and $SOCl_2$ (38 eq) were stirred at about 80° C. for about 2 hours. Excess $SOCl_2$ was removed under reduced pressure, and the resultant solid compound was recrystallized with n-heptane to synthesize Intermediate Compound [5-e] (yield: 81%).

(6) Synthesis of Intermediate Compound [5-f]

The compound n-$Bu_4$NBr (1.0 eq) was dissolved in dichloromethane (0.025 M), and then while being stirred, NaOH aqueous solution (2.5 eq) and Intermediate Compound [5-e] (1.0 eq) were added thereto. The reaction mixture was stirred at room temperature for about 12 hours. After the reaction was completed, the reaction was quenched with water, and the resultant product was extracted three times using dichloromethane and water to obtain an organic layer. The obtained organic layer was dried over magnesium sulfate, and then concentrated to synthesize Intermediate Compound [5-f] (yield: 56%).

(7) Synthesis of Intermediate Compound [5-g]

Intermediate Compound [5-f] (1.0 eq) was dissolved in dichloromethane, and then while being stirred at room temperature, AgOTf (2.4 eq) and t-BuCOOCH$_2$Cl (2.5 eq) were added thereto. The reaction mixture was stirred under reflux for about 24 hours. The resultant solid compound was washed with dichloromethane and filtered to synthesize Intermediate Compound [5-g] (yield: 63%).

(8) Synthesis of Compound 5

Intermediate Compound [5-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 5 (yield 20%) by using column chromatography.

6. Synthesis of Compound 6

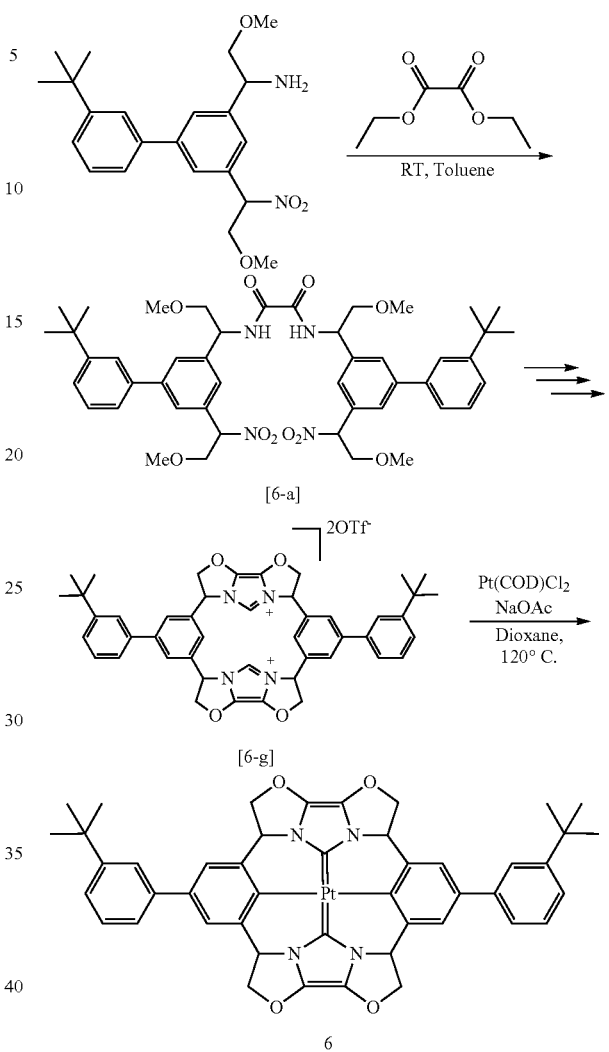

(1) Synthesis of Intermediate Compound [6-a]

While 1-(3'-(tert-butyl)-5-(2-methoxy-1-nitroethyl)-[1,1'-biphenyl]-3-yl)-2-methoxyethan-1-amine (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [6-a] (yield: 74%).

(2) Synthesis of Intermediate Compound [6-g]

Intermediate Compound [6-g] was synthesized in the same manner as described above (yield: 70-77%).

(3) Synthesis of Compound 6

Intermediate Compound [6-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 6 (yield 25%) by using column chromatography.

7. Synthesis of Compound 7

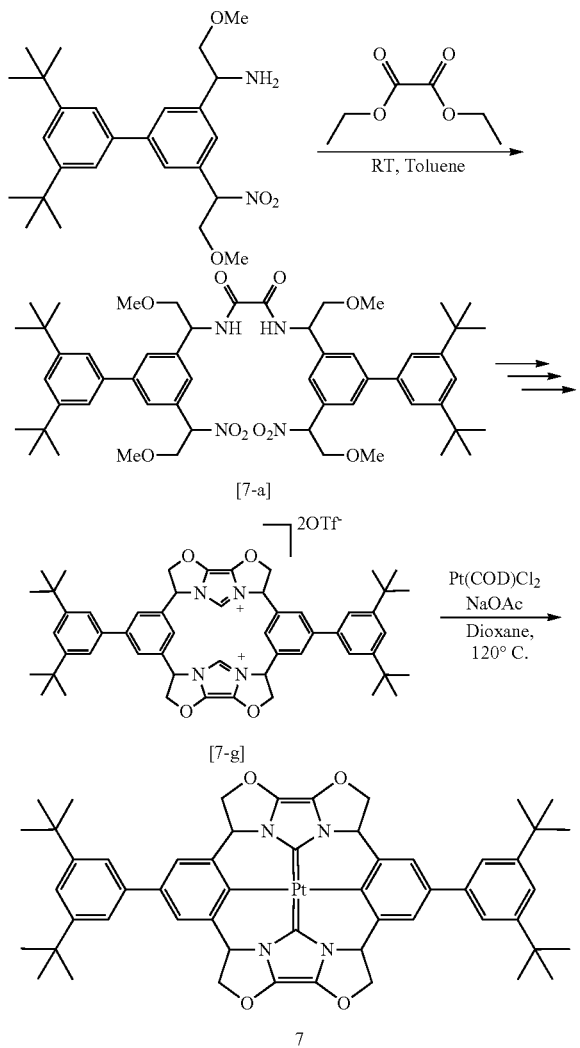

[7-a]

[7-g]

7

(1) Synthesis of Intermediate Compound [7-a]

While 1-(3',5'-di-tert-butyl-5-(2-methoxy-1-nitroethyl)-[1,1'-biphenyl]-3-yl)-2-methoxyethan-1-amine (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [7-a] (yield: 70%).

(2) Synthesis of Intermediate Compound [7-g]

Intermediate Compound [7-g] was synthesized in the same manner as described above (yield: 70-77%).

(3) Synthesis of Compound 7

Intermediate Compound [7-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 7 (yield 21%) by using column chromatography.

8. Synthesis of Compound 8

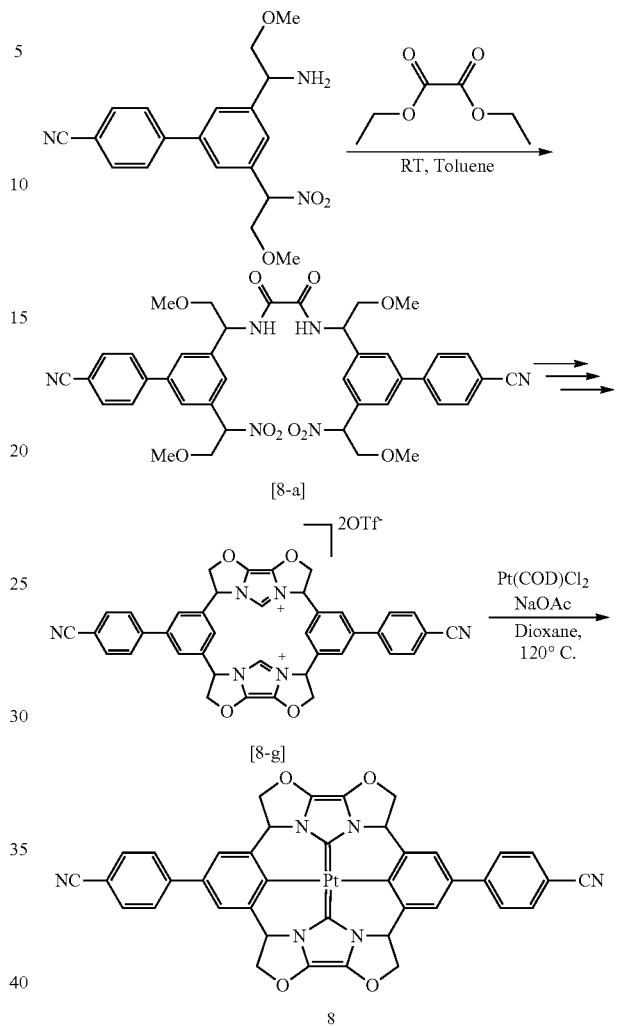

[8-a]

[8-g]

8

(1) Synthesis of Intermediate Compound [8-a]

While 3'-(1-amino-2-methoxyethyl)-5'-(2-methoxy-1-nitroethyl)-[1,1'-biphenyl]-4-carbonitrile (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [8-a] (yield: 65%).

(2) Synthesis of Intermediate Compound [8-g]

Intermediate Compound [8-g] was synthesized in the same manner as described above (yield: 70-77%).

(3) Synthesis of Compound 8

Intermediate Compound [8-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 8 (yield 20%) by using column chromatography.

9. Synthesis of Compound 9

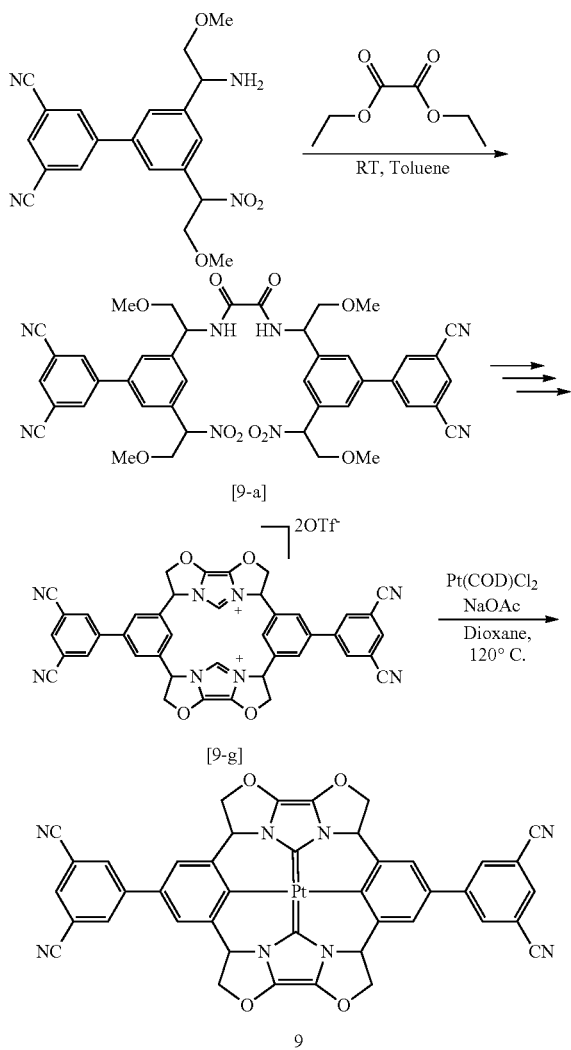

(1) Synthesis of Intermediate Compound [9-a]

While 3'-(1-amino-2-methoxyethyl)-5'-(2-methoxy-1-nitroethyl)-[1,1'-biphenyl]-3,5-dicarbonitrile (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [9-a] (yield: 43%).

(2) Synthesis of Intermediate Compound [9-g]

Intermediate Compound [9-g] was synthesized in the same manner as described above (yield: 70-77%).

(3) Synthesis of Compound 9

Intermediate Compound [9-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 9 (yield 14%) by using column chromatography.

10. Synthesis of Compound 10

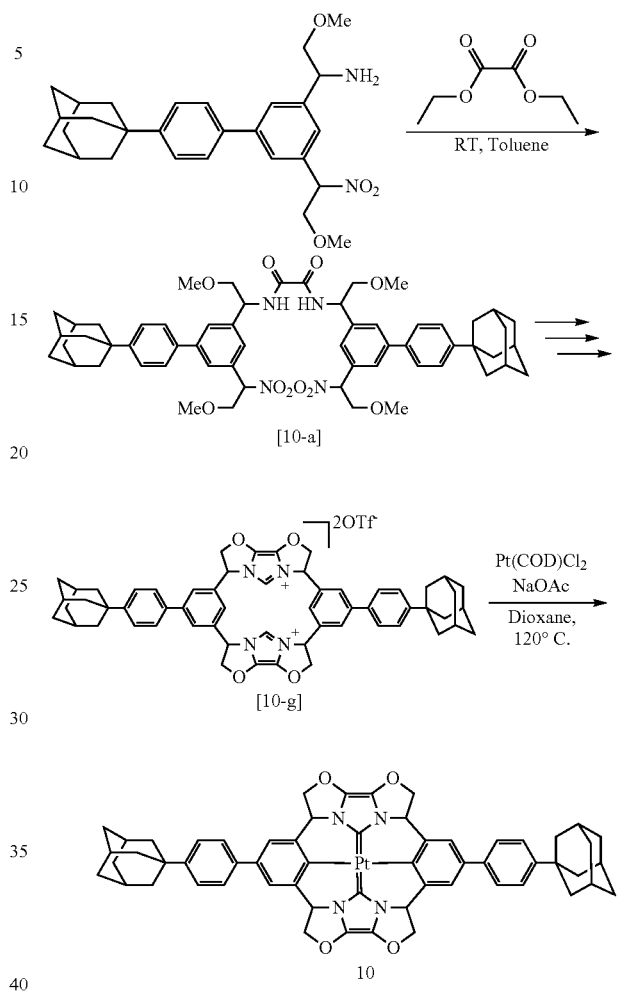

(1) Synthesis of Intermediate Compound [10-a]

While 1-(4'-((3r,5r,7r)-adamantan-1-yl)-5-(2-methoxy-1-nitroethyl)-[1,1'-biphenyl]-3-yl)-2-methoxyethan-1-amine (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [10-a] (yield: 72%).

(2) Synthesis of Intermediate Compound [10-g]

Intermediate Compound [10-g] was synthesized in the same manner as described above (yield: 70-77%).

(3) Synthesis of Compound 10

Intermediate Compound [10-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 10 (yield 22%) by using column chromatography.

11. Synthesis of Compound 22

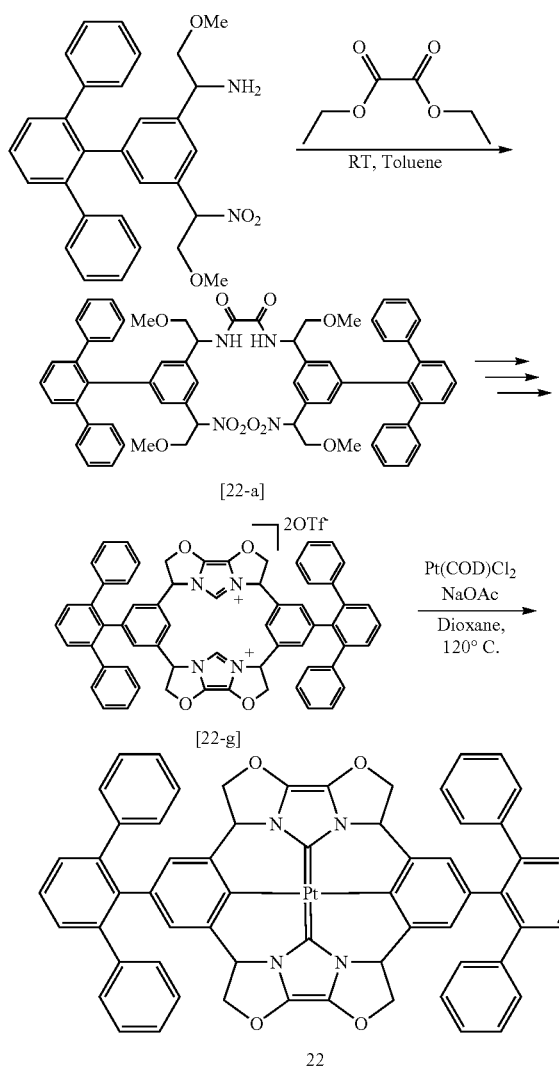

22

(1) Synthesis of Intermediate Compound [22-a]

While 2-methoxy-1-(5-(2-methoxy-1-nitroethyl)-6'-phenyl-[1,1': 2',1''-terphenyl]-3-yl) ethan-1-amine (8.5 eq) was stirred in toluene (0.5 M) at room temperature, diethyl oxalate (1.0 eq) was added thereto. The reaction mixture was refluxed for about 4 hours. When the reaction was completed, the resulting product was washed with n-heptane and filtered to synthesize Intermediate Compound [22-a] (yield: 75%).

(2) Synthesis of Intermediate Compound [22-g]

Intermediate Compound [22-g] was synthesized in the same manner as described above. (yield: 70-77%)

(3) Synthesis of Compound 22

Intermediate Compound [22-g] (1.0 eq), dichloro(1,5-cyclooctadiene) platinum (II) (1.2 eq), and sodium acetate (6.0 eq) were dissolved in anhydrous 1,4-dioxane, and then stirred at about 120° C. for about 4 days under a nitrogen condition. The reaction mixture was cooled at room temperature, and then the resultant product was extracted three times using dichloromethane and water to obtain an organic layer. The obtained organic layer was dried over magnesium sulfate, and then concentrated to synthesize Compound 22 (yield 23%) by using column chromatography.

Characteristic Evaluation of Organometallic Compound

Luminous characteristics of the organometallic compounds of Example Compounds 1 to 10 and 22 and Comparative Example Compound C1 were evaluated and the results are shown in Table 1 below.

Example Compounds and Comparative Example Compounds are as follows.

Example Compounds

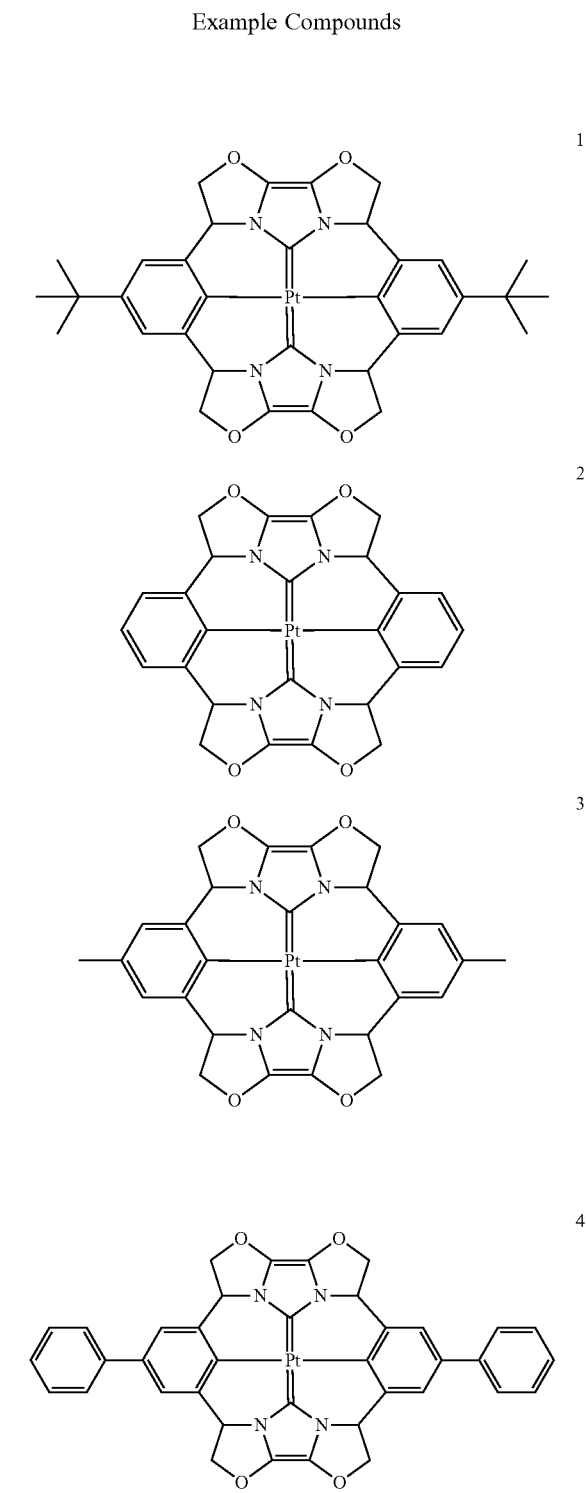

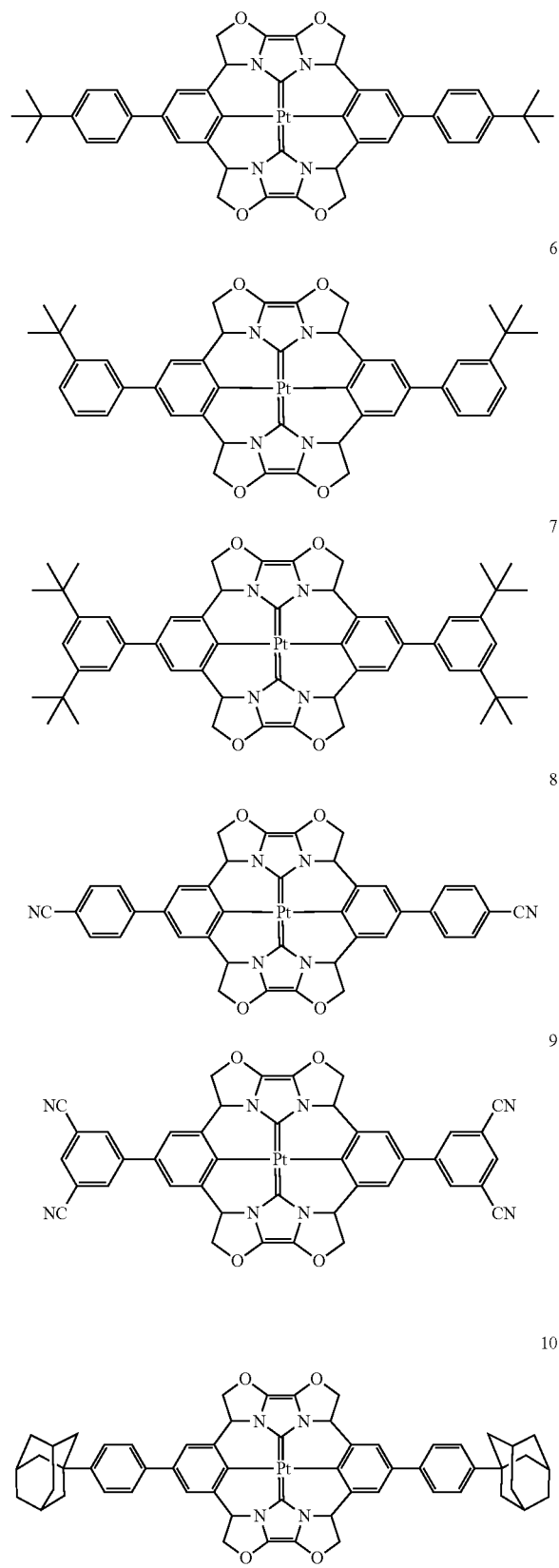

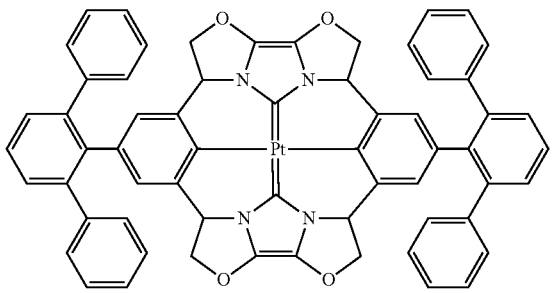

Comparative Example Compounds

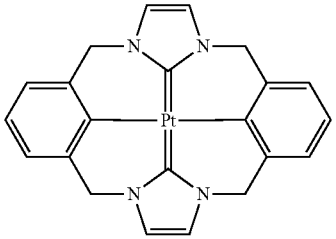

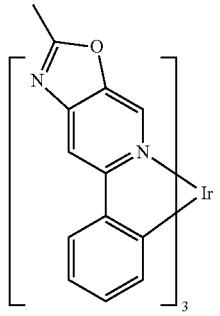

TABLE 1

| | $^3$MLCT (%) | $\lambda_{max}^{sim}$ (nm) | $\lambda_{max}^{exp}$ (nm) | $^3$MC (kcal/mol) |
|---|---|---|---|---|
| Comparative Example Compound C1 | 18.47 | 480 | 481 | 0.82 |
| Comparative Example Compound C2 | 18.67 | 475 | 475 | 0.56 |
| Example Compound 1 | 19.84 | 471 | 470 | 0.83 |
| Example Compound 2 | 19.55 | 473 | 468 | 0.81 |
| Example Compound 3 | 19.12 | 474 | 465 | 0.84 |
| Example Compound 4 | 19.10 | 473 | 464 | 0.86 |
| Example Compound 5 | 18.96 | 474 | 466 | 0.87 |
| Example Compound 6 | 18.80 | 470 | 465 | 0.85 |
| Example Compound 7 | 19.31 | 471 | 464 | 0.85 |
| Example Compound 8 | 19.83 | 473 | 465 | 0.85 |
| Example Compound 9 | 19.75 | 473 | 468 | 0.86 |
| Example Compound 10 | 19.11 | 473 | 465 | 0.88 |
| Example Compound 22 | 20.54 | 470 | 469 | 0.83 |

In Table 1, a $^3$MC state energy level value of each compound was evaluated by a density functional theory (DFT) method at B3LYP functional, using a Gaussian 09 program sold by Gaussian, Inc., Wallingford CT, 2009, and a $^3$MLCT value (%) was measured with structure optimization at the B3LYP, 6-31G(d,p) level basis set by using density functional theory (DFT) methods of the Gaussian program.

Embodiments of the organometallic compound have a high $^3$MLCT value and a high $^3$MC state energy level value, and thus the stability in excited states may be improved.

Manufacture of Organic Electroluminescence Device

Embodiments of an organic electroluminescence device including an embodiment an organometallic compound made according to the principles of the invention in the emission layer were manufactured as follows. Organic electroluminescence devices were manufactured using Example Compounds and Comparative Example Compounds described above as a dopant material in the emission layer.

Specifically, for a substrate and anode, an ITO-formed glass substrate of about 15 Ω/cm² (about 1,200 Å) made by Corning Inc. of Corning, New York was cut to a size of 50 mm×50 mm×0.7 mm, cleansed by ultrasonic waves using isopropyl alcohol and pure water for about 5 minutes, and then irradiated with ultraviolet rays for about 30 minutes and exposed to ozone and cleansed. The glass substrate was installed on a vacuum deposition apparatus.

The compound 2-TNATA was deposited in vacuum on the upper portion of the ITO anode formed on the glass substrate to form a 600 Å-thick hole injection layer, and the compound NPB was deposited in vacuum on the upper portion of the hole injection layer to form a 300 Å-thick hole transport layer.

The compounds BCPDS and POPCPA (weight ratio of BCPDS and POPCPA of 1:1) as a co-host and Example Compounds or Comparative Example Compounds as a dopant were co-deposited on the upper portion of the hole transport layer to be a weight ratio of the co-host and the dopant of 90:10 to form a 300 Å-thick emission layer.

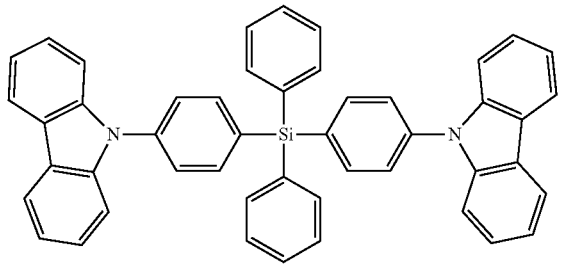

BCPDS

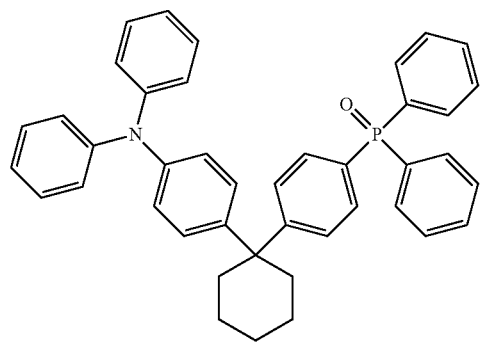

POPCPA

The compound diphenyl [4-(triphenylsilyl)phenyl]phosphine oxide (TSP01) was deposited on the upper portion of the emission layer to form a 50 Å-thick hole blocking layer, the compound Alq$_3$ was deposited on the upper portion of the hole blocking layer to form a 300 Å-thick electron transport layer, lithium fluoride (LiF) was then deposited on the upper portion of the electron transport layer to form a 10 Å-thick electron injection layer, and then the element aluminum (Al) was deposited in vacuum on the upper portion of the electron injection layer to form a 3,000 Å-thick cathode, thereby manufacturing an organic electroluminescence device.

The measured values according to Examples 1 to 11 and Comparative Examples 1 to 2 are shown in Table 2 below.

TABLE 2

| | Dopant | Driving voltage (V) | Current density (mA/cm²) | Brightness (cd/m²) | Efficiency (cd/A) | Emission wavelength (nm) | Device service life (T90, h) (at 1,000 cd/m²) |
|---|---|---|---|---|---|---|---|
| Comparative Example 1 | Comparative Example Compound C1 | 6.21 | 50 | 750 | 1.48 | 481 | 1.0 |
| Comparative Example 2 | Comparative Example Compound C2 | 5.66 | 50 | 900 | 1.78 | 475 | 0.5 |
| Example 1 | Example Compound 1 | 5.30 | 50 | 1100 | 2.17 | 470 | 3.0 |
| Example 2 | Example Compound 2 | 5.28 | 50 | 1088 | 2.15 | 468 | 5.0 |
| Example 3 | Example Compound 3 | 5.28 | 50 | 1080 | 2.13 | 465 | 2.0 |
| Example 4 | Example Compound 4 | 5.30 | 50 | 1130 | 2.23 | 464 | 2.0 |
| Example 5 | Example Compound 5 | 5.30 | 50 | 1120 | 2.2 | 466 | 2.0 |
| Example 6 | Example Compound 6 | 5.28 | 50 | 988 | 1.95 | 465 | 3.0 |
| Example 7 | Example Compound 7 | 5.30 | 50 | 1125 | 2.22 | 464 | 3.0 |
| Example 8 | Example Compound 8 | 5.30 | 50 | 980 | 1.93 | 465 | 2.0 |

TABLE 2-continued

| | Dopant | Driving voltage (V) | Current density (mA/cm$^2$) | Brightness (cd/m$^2$) | Efficiency (cd/A) | Emission wavelength (nm) | Device service life (T90, h) (at 1,000 cd/m$^2$) |
|---|---|---|---|---|---|---|---|
| Example 9 | Example Compound 9 | 5.30 | 50 | 1100 | 2.17 | 468 | 3.0 |
| Example 10 | Example Compound 10 | 5.30 | 50 | 1120 | 2.21 | 465 | 4.0 |
| Example 11 | Example Compound 22 | 5.30 | 50 | 1125 | 2.22 | 469 | 5.0 |

The results shown in Table 2 show that embodiments of organic electroluminescence devices including an organometallic compound made according to the principles and embodiments of the invention simultaneously achieved significantly and unexpectedly improved characteristics in terms of a low driving voltage and improved luminous efficiency, as well as improved service life, compared to the Comparative Examples. For example, embodiments of the organic electroluminescence device simultaneously achieved a low driving voltage, improved luminous efficiency, and an improved service life in a blue light wavelength range by including an embodiment of the organometallic compound as an emission layer material. Accordingly, organic electroluminescence devices constructed according to the principles and embodiments of the invention may have excellent efficiency. Organometallic compound made according to the principles and embodiments of the invention may be used as a material in the emission layer of the organic electroluminescence device, and thereby the organic electroluminescence device may have improved efficiency.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic electroluminescence device comprising:
a first electrode;
a hole transport region disposed on the first electrode;
an emission layer disposed on the hole transport region;
an electron transport region disposed on the emission layer; and
a second electrode disposed on the electron transport region,
wherein the emission layer comprises an organometallic compound of Formula 1:

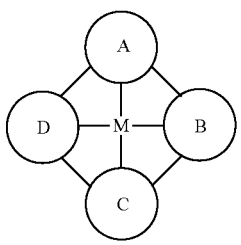

Formula 1 wherein, in Formula 1,
M is iridium, platinum, osmium, titanium, zirconium, hafnium, europium, terbium, thulium or rhodium,
at least two of ring A to ring D are each, independently from one another, of Formula 2 below, and the rest are each, independently from one another, a substituted or an unsubstituted hydrocarbon ring group having 5 to 60 ring-forming carbon atoms, or a substituted or an unsubstituted heterocyclic group having 1 to 60 ring-forming carbon atoms:

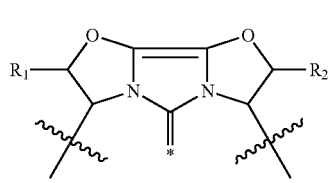

Formula 2 wherein, in Formula 2,
R$_1$ and R$_2$ are each, independently from one another, a hydrogen atom, a deuterium atom, a halogen atom, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring;
⸺* is a position bonded to M of the Formula 1; and

is a position, independently from one another, bonded to any one of ring A to ring D of the Formula 1.

2. The organic electroluminescence device of claim 1, wherein M is iridium or platinum.

3. The organic electroluminescence device of claim 1, wherein the emission layer is configured to emit phosphorescence.

4. The organic electroluminescence device of claim 1, wherein the emission layer comprises a host and a dopant, the dopant comprising an organometallic compound of the Formula 1.

5. The organic electroluminescence device of claim 1, wherein two rings of ring A to ring D are each, independently from one another, of the Formula 2, and the remaining two rings are each, independently from one another, a substituted or an unsubstituted aryl group having 6 to 30 ring-forming carbon atoms, or a substituted or an unsubstituted heteroaryl group having 2 to 30 ring-forming carbon atoms.

6. The organic electroluminescence device of claim 1, wherein the Formula 1 is of Formula 2-1:

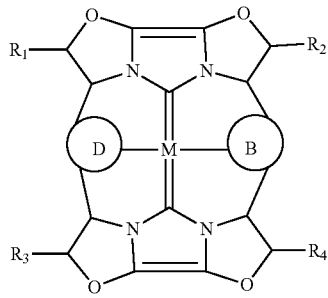

Formula 2-1 wherein, in Formula 2-1,
$R_3$ and $R_4$ are each, independently from one another, a hydrogen atom, a deuterium atom, a halogen atom, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring, and M, ring B, ring D, $R_1$, and $R_2$ have, independently from one another, the same meaning as defined in the Formula 1 and the Formula 2 in claim 1.

7. The organic electroluminescence device of claim 6, wherein the Formula 2-1 is of Formula 3:

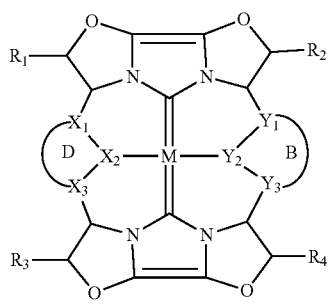

Formula 3 wherein, in Formula 3,
$X_1$ to $X_3$ and $Y_1$ to $Y_3$ are each, independently from one another, N or $CR_a$,
$R_a$ is a hydrogen atom, a deuterium atom, a halogen atom, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, and M, ring B, ring D, and $R_1$ to $R_4$ have, independently from one another, the same meaning as defined in the Formula 2-1 in claim 6.

8. The organic electroluminescence device of claim 7, wherein at least two of $X_1$ to $X_3$ are each, independently from one another, $CR_a$, and
at least two of $Y_1$ to $Y_3$ are each, independently from one another, $CR_a$.

9. The organic electroluminescence device of claim 6, wherein the Formula 2-1 is of Formula 4:

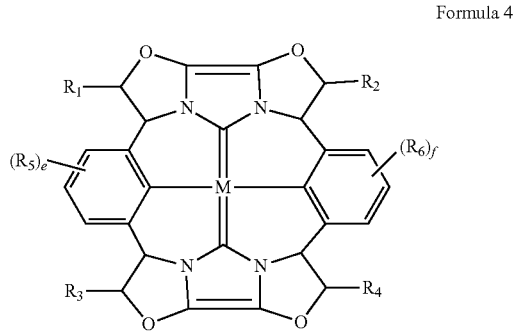

Formula 4 wherein, in Formula 4,
$R_5$ and $R_6$ are each, independently from one another, a hydrogen atom, a deuterium atom, a halogen atom, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring, e and f are each, independently from one another, an integer of 0 to 3, and M, and $R_1$ to $R_4$ have, independently from one another, the same meaning as defined in the Formula 2-1 in claim 6.

10. The organic electroluminescence device of claim 9, wherein e and f are each, independently from one another, an integer of 1 to 3, and $R_5$ and $R_6$ are each, independently from one another, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring.

11. The organic electroluminescence device of claim 6, wherein $R_1$ to $R_4$ are each, independently from one another, a hydrogen atom or a deuterium atom.

12. The organic electroluminescence device of claim 1, wherein the organometallic compound of Formula 1 is at least one compound of Compound Group 1:

Compound Group 1
1
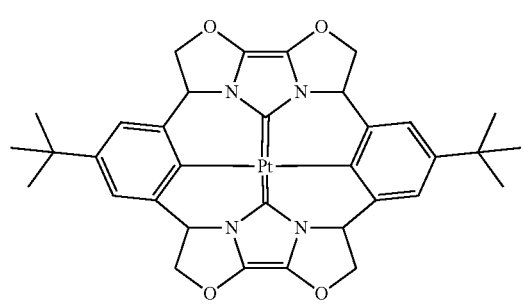
2
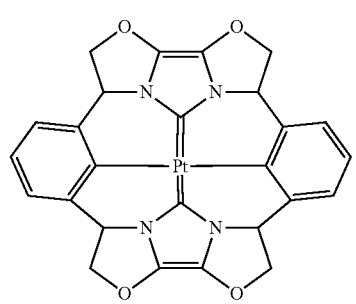
3
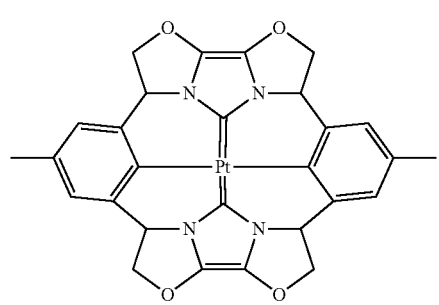
4
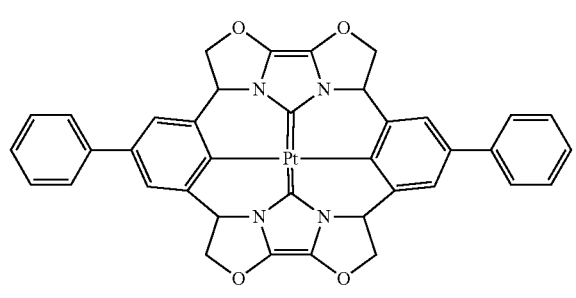
5
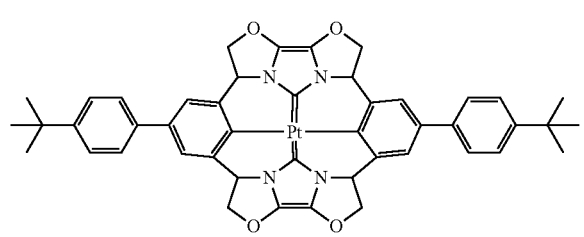
6
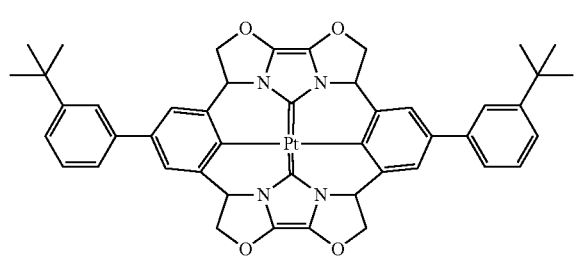
7
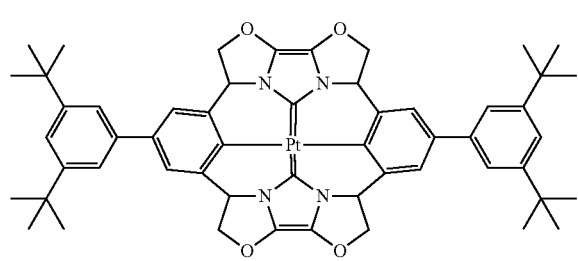
8
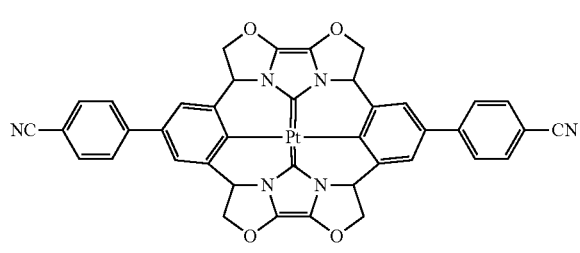
9
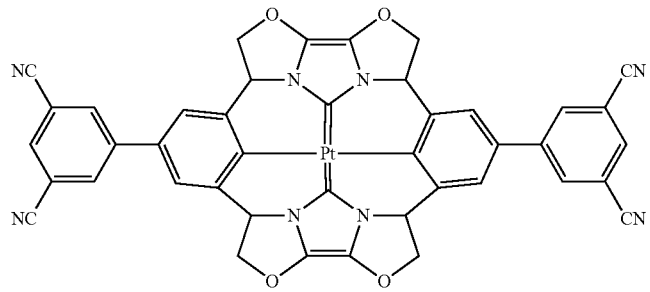

-continued
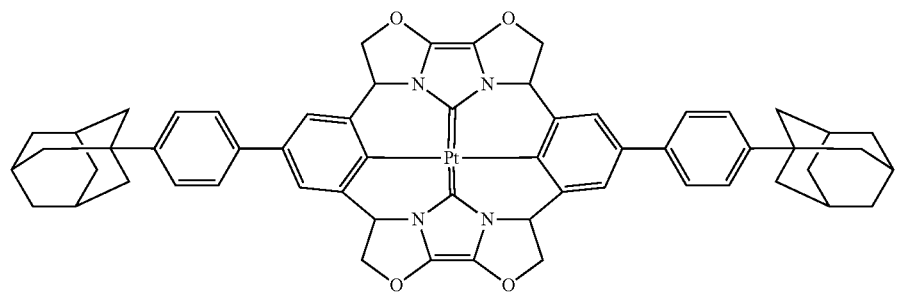
10
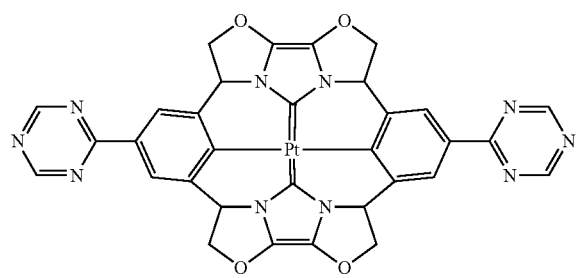
11
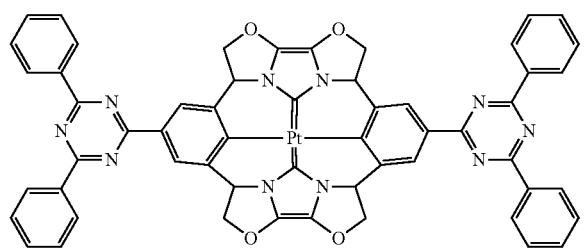
12
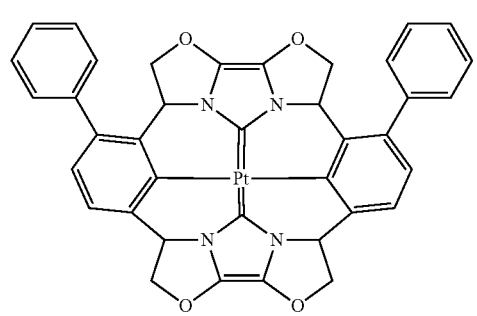
13
14
15
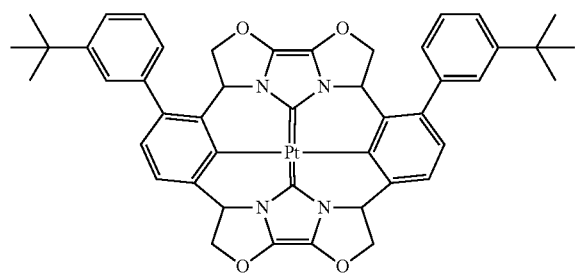
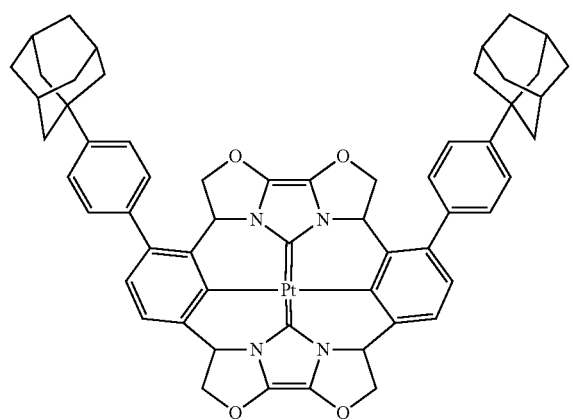
16

-continued
17
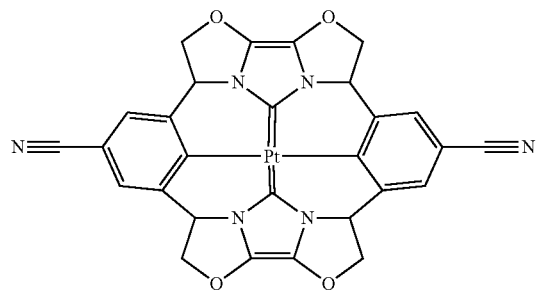
18
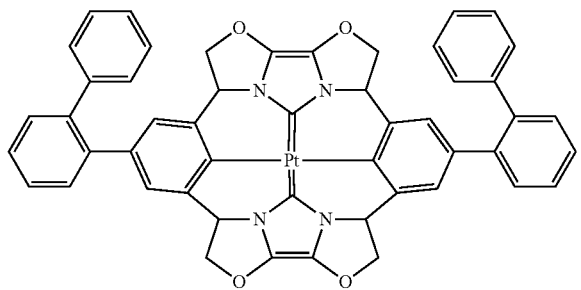
19
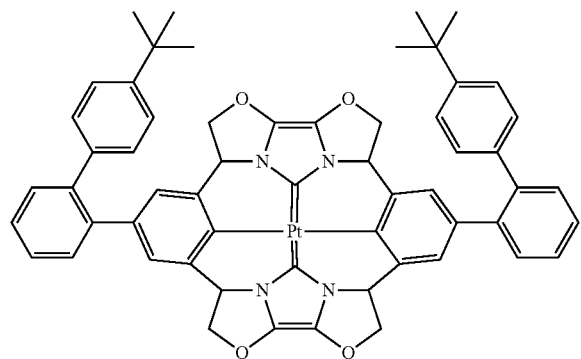
20
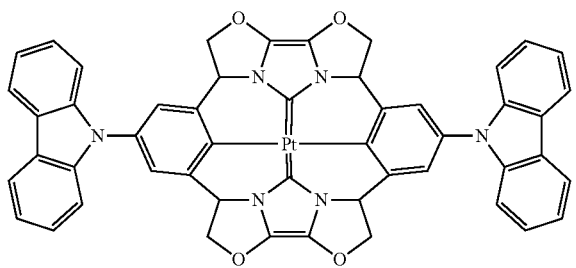
21
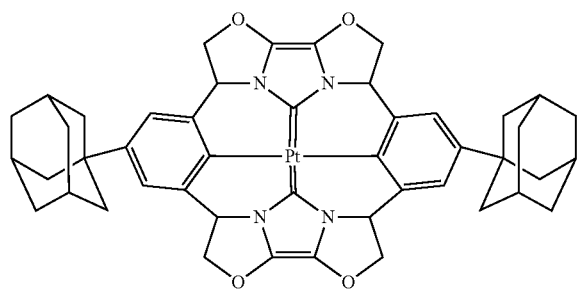
22
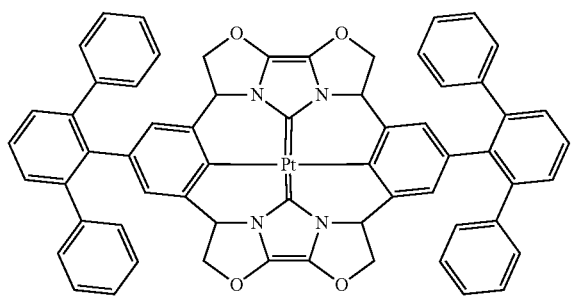
23
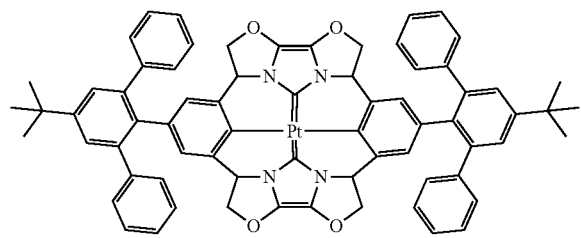
24
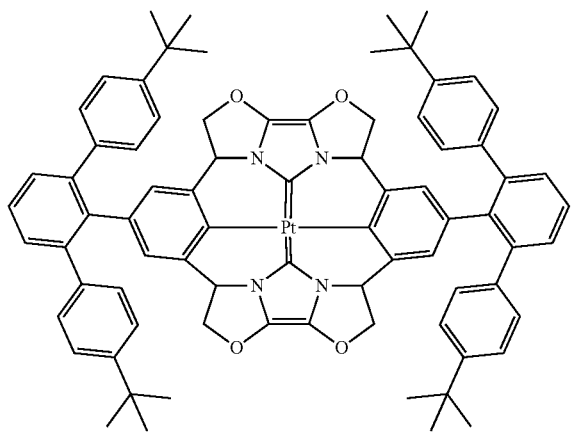

-continued

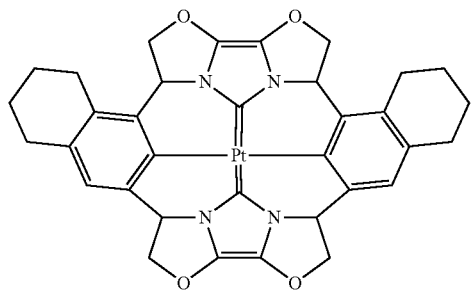
25

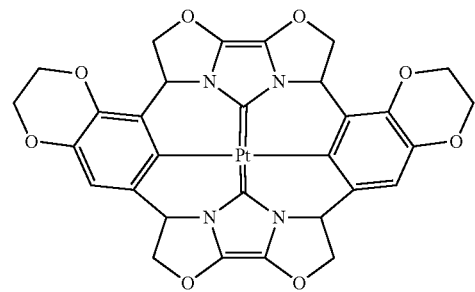
26

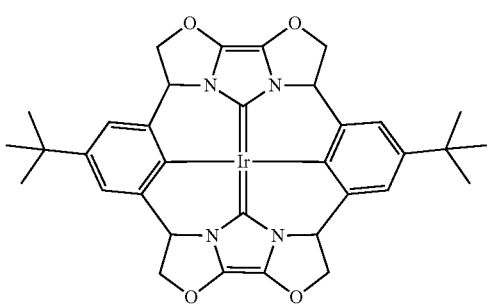
2-1

-continued

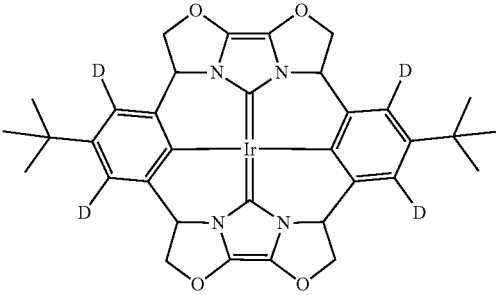
2-5

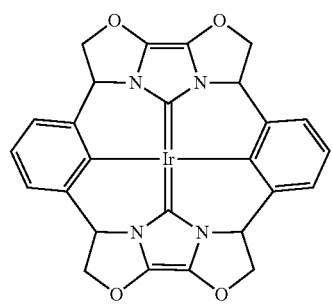
2-2

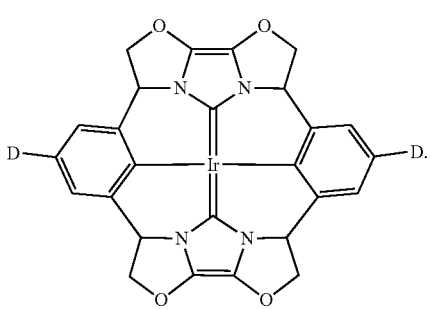
2-6

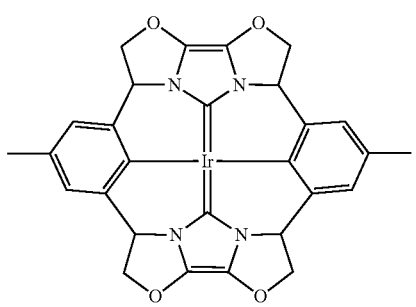
2-3

13. An organometallic compound of Formula 1:

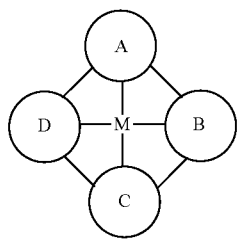

Formula 1

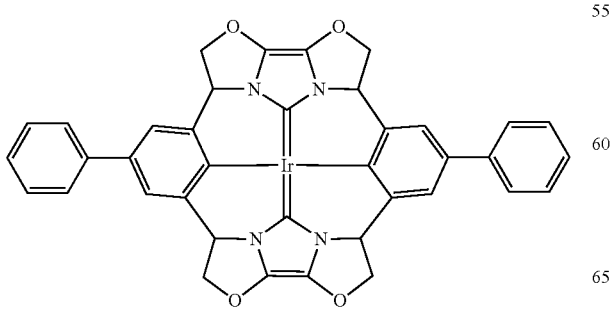
2-4 wherein, in Formula 1,

M is iridium, platinum, osmium, titanium, zirconium, hafnium, europium, terbium, thulium or rhodium, at least two of ring A to ring D are each, independently from one another, of Formula 2, and the remainder are each, independently from one another, a substituted or an unsubstituted hydrocarbon ring group having 5 to 60 ring-forming carbon atoms, or a substituted or an unsubstituted heterocyclic group having 1 to 60 ring-forming carbon atoms:

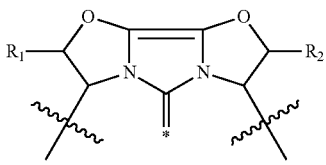

Formula 2 wherein, in Formula 2, $R_1$ and $R_2$ are each, independently from one another, a hydrogen atom, a deuterium atom, a halogen atom, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring;

===== * is a position bonded to M of the Formula 1; and

is a position, independently from one another, bonded to any one of ring A to ring D of the Formula 1.

14. The organometallic compound of claim 13, wherein M is iridium or platinum.

15. The organometallic compound of claim 13, wherein two rings of ring A to ring D are each, independently from one another, of Formula 2, and the remaining two rings are each, independently from one another, a substituted or an unsubstituted aryl group having 6 to 30 ring-forming carbon atoms, or a substituted or an unsubstituted heteroaryl group having 2 to 30 ring-forming carbon atoms.

16. The organometallic compound of claim 13, wherein the Formula 1 is of Formula 2-1:

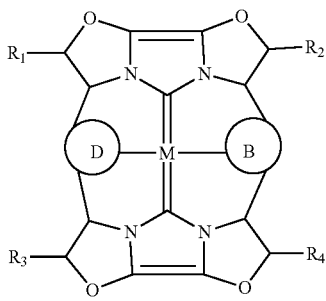

Formula 2-1 wherein, in Formula 2-1, $R_3$ and $R_4$ are each, independently from one another, a hydrogen atom, a deuterium atom, a halogen atom, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring, and M, ring B, ring D, $R_1$, and $R_2$ have, independently from one another, same meaning as defined in the Formula 1 and the Formula 2 in claim 1.

17. The organometallic compound of claim 16, wherein the Formula 2-1 is of Formula 3:

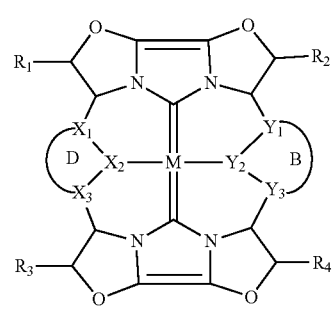

Formula 3 wherein, in Formula 3, $X_1$ to $X_3$ and $Y_1$ to $Y_3$ are each, independently from one another, N or $CR_a$, $R_a$ is a hydrogen atom, a deuterium atom, a halogen atom, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, and M, ring B, ring D, and $R_1$ to $R_4$ have, independently from one another, the same meaning as defined in the Formula 2-1 in claim 16.

18. The organometallic compound of claim 16, wherein the Formula 2-1 is of Formula 4:

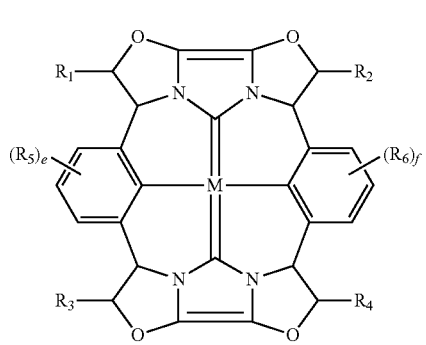

Formula 4 wherein, in Formula 4, $R_5$ and $R_6$ are each, independently from one another, a hydrogen atom, a deuterium atom, a halogen atom, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring, e and f are each, independently from one another, an integer of 0 to 3, M, and $R_1$ to $R_4$ have, independently from one another, the same meaning as defined in the Formula 2-1 in claim 16.

19. The organometallic compound of claim 18, wherein e and f are each, independently from one another, an integer of 1 to 3, and R$_5$ and R$_6$ are each, independently from one another, a cyano group, a substituted or an unsubstituted oxy group, a substituted or an unsubstituted alkyl group having 1 to 20 carbon atoms, a substituted or an unsubstituted aryl group having 6 to 30 ring-forming carbon atoms, or a substituted or an unsubstituted heteroaryl group having 2 to 30 ring-forming carbon atoms, or are bonded to an adjacent group to form a ring.

20. The organometallic compound of claim 13, wherein the organometallic compound of Formula 1 is at least one compound of Compound Group 1:

Compound Group 1

1
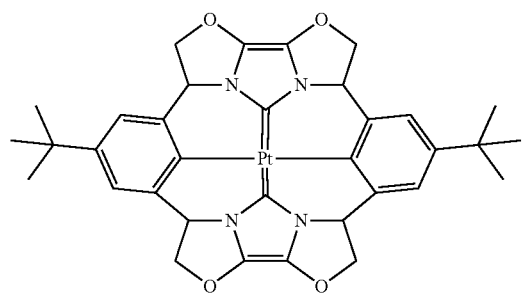

2
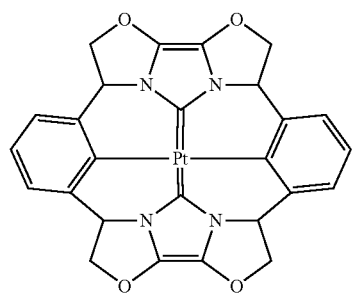

3
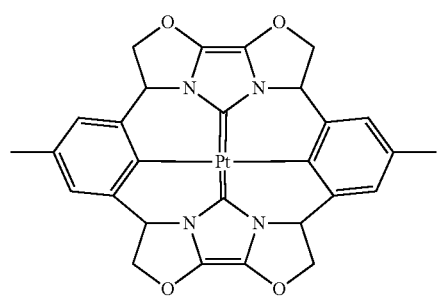

4
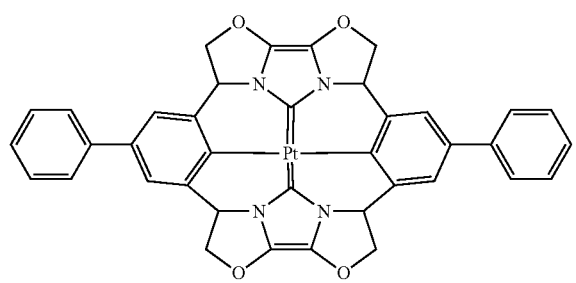

5
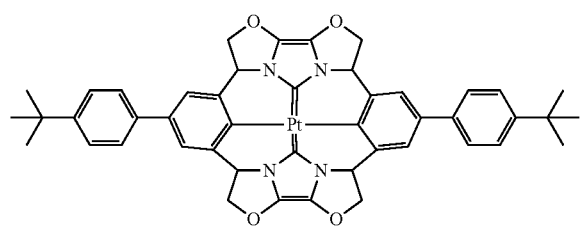

6
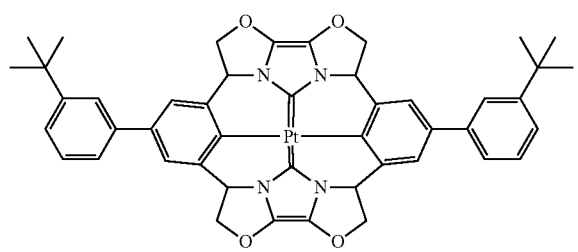

7
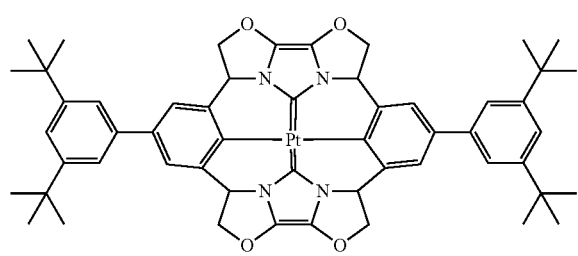

8
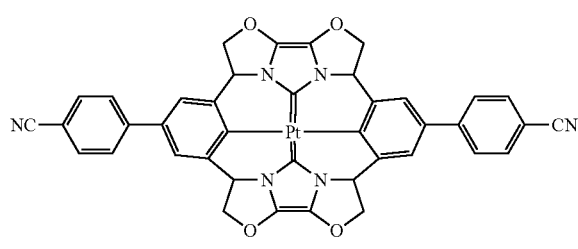

-continued
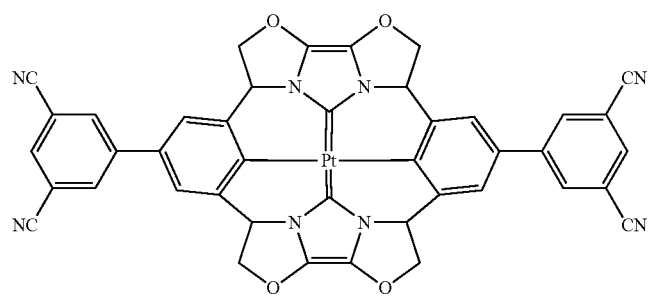
9
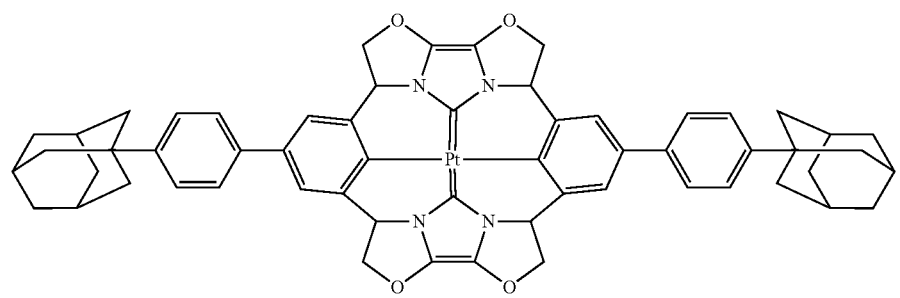
10
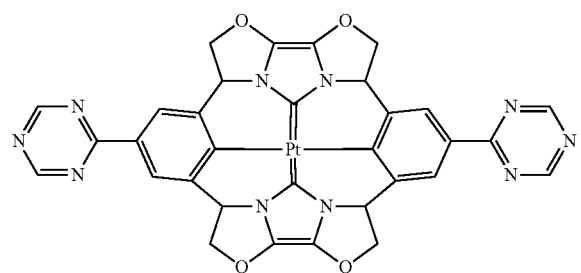
11
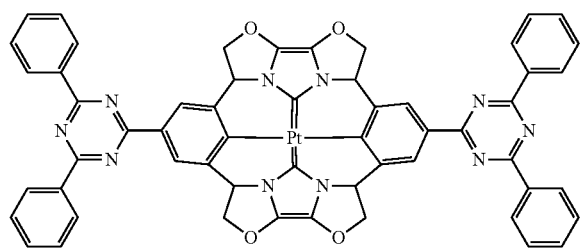
12
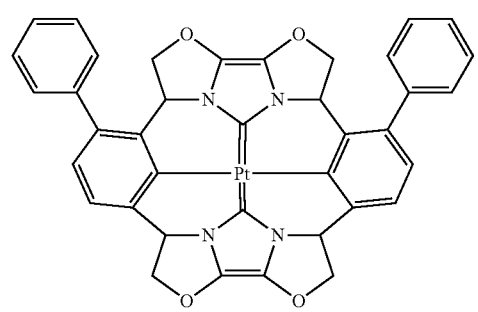
13
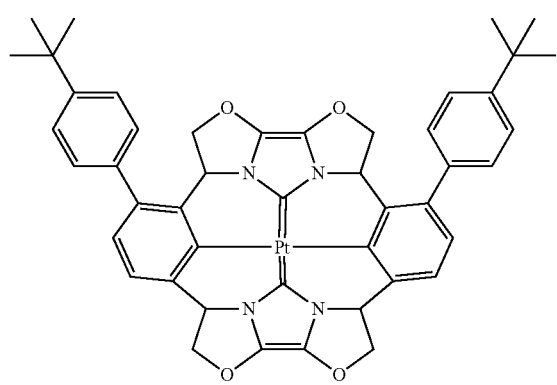
14

-continued
15
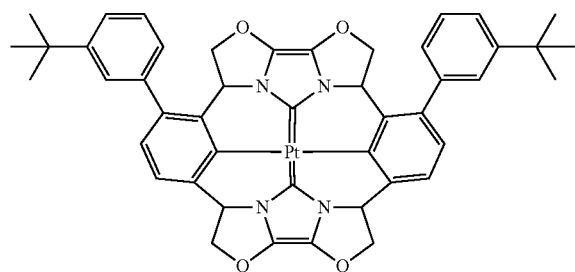
16
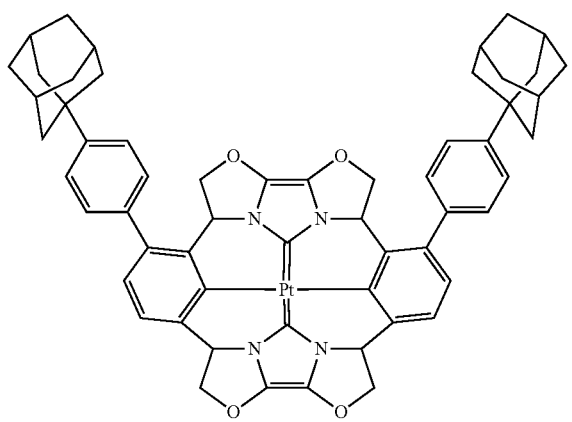
17
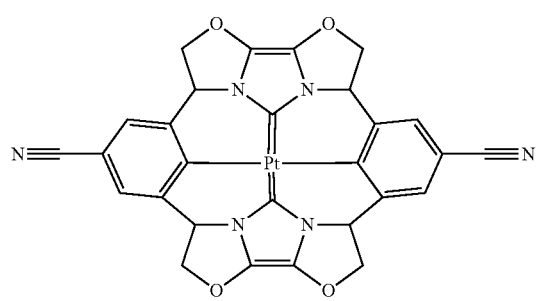
18
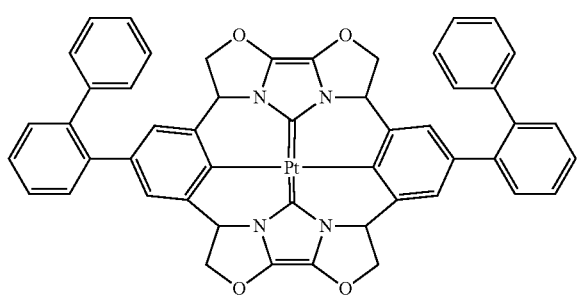
19
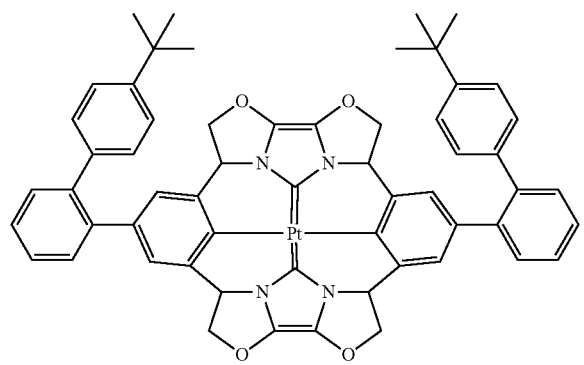
20
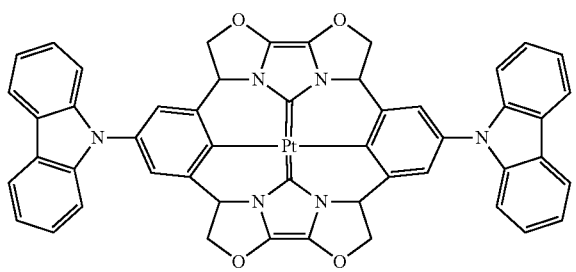
21
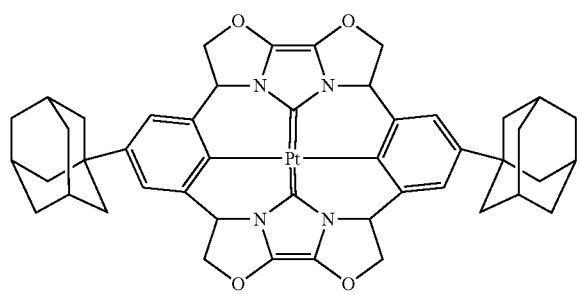
22
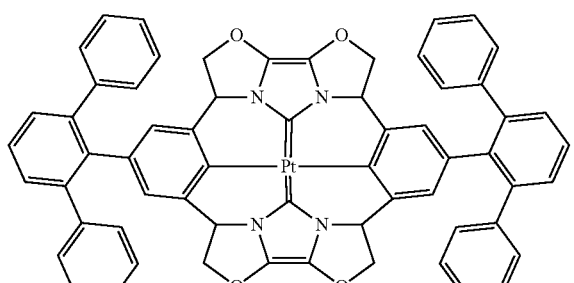

-continued
23
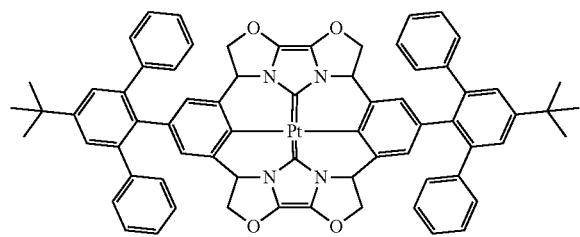
24
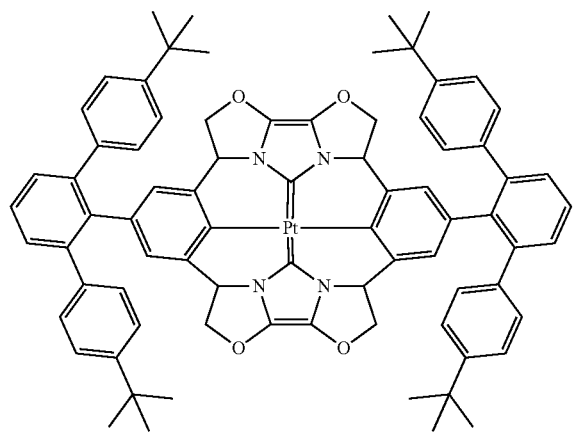
25
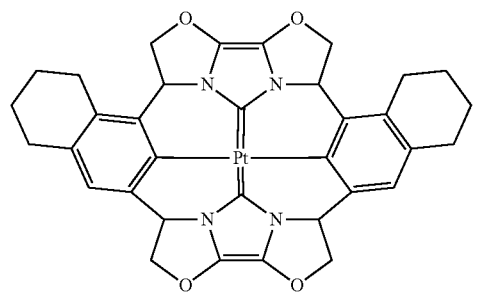
26
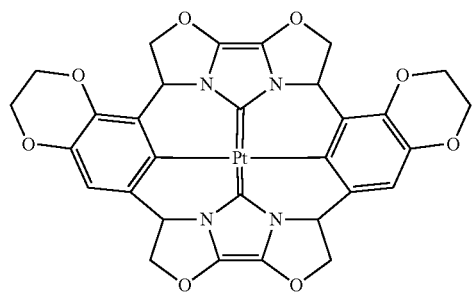
-continued
2-1
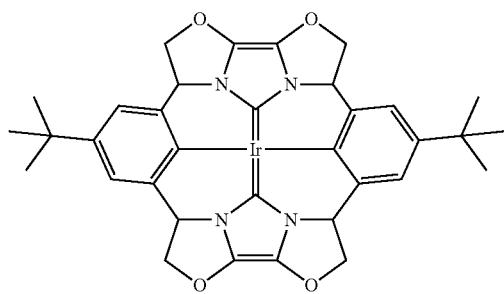
2-3
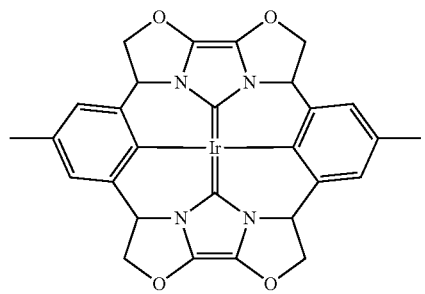
2-2
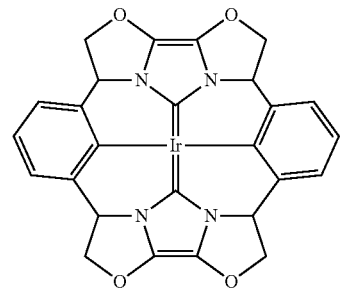
2-4
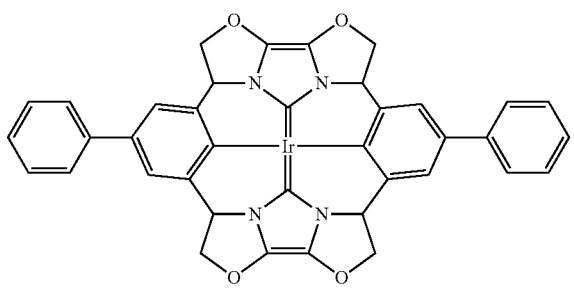

-continued
2-5
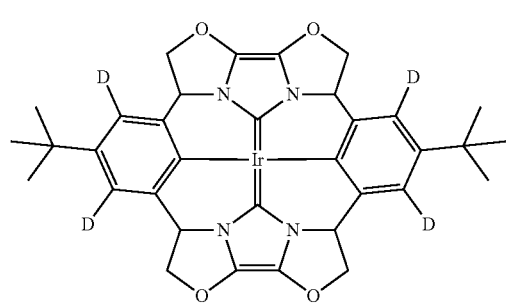
2-6
* * * * *